United States Patent
Kinoshita

(10) Patent No.: US 6,339,359 B1
(45) Date of Patent: Jan. 15, 2002

(54) INTEGRATED CIRCUIT APPARATUS

(75) Inventor: Hiromu Kinoshita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/639,664

(22) Filed: Aug. 16, 2000

(30) Foreign Application Priority Data

Mar. 16, 2000 (JP) ............................................. 12-074176

(51) Int. Cl.$^7$ ............................................. H01L 25/00
(52) U.S. Cl. ...................... 327/565; 327/544; 327/291; 327/382; 307/38
(58) Field of Search ................................. 327/291, 292, 327/544, 565, 382; 307/31, 38, 39

(56) References Cited

U.S. PATENT DOCUMENTS

| | | | |
|---|---|---|---|
| 5,717,359 A | 2/1998 | Matsui et al. | ................ 327/565 |
| 6,191,499 B1 * | 2/2001 | Severson et al. | ............. 307/31 |

FOREIGN PATENT DOCUMENTS

JP          5-27863        2/1993

* cited by examiner

*Primary Examiner*—Terry D. Cunningham
*Assistant Examiner*—Quan Tra
(74) *Attorney, Agent, or Firm*—Burns, Doane, Swecker & Mathis, LLP

(57) ABSTRACT

Noise generated in port circuits of an integrated circuit apparatus is output to the outside through an electric power supply terminal, or external noise received in the electric power supply terminal is input to the port circuits to make the port circuits be erroneously operated. To prevent the adverse influence of the noise and the external noise, a clock interrupting circuit is arranged along an operation clock signal supply line connected with a specific port circuit, which is connected with the electric power supply terminal through a power supply line through which the specific circuit is electrically most-adjacent to the electric power supply terminal among the port circuits, and an operation of the specific port circuit is stopped by the clock interrupting circuit when the specific port circuit is not used. Also, operations of port circuits adjacent to the specific port circuit are stopped by other clock interrupting circuits in case of non-use of the port circuits. In addition, capacitors are arranged to produce an LN filter with equivalent capacitance and inductance parasitically existing in the power supply line and to reduce the noise and the external noise according to the LN filter effect. Therefore, an erroneous operation resistance to the noise and the external noise can be improved, and a noise reducing characteristic can be improved.

9 Claims, 26 Drawing Sheets

AN OPERATION CLOCK SIGNAL IS INTERRUPTED IN CASE OF NO USE OF A CIRCUIT 6

AN OPERATION CLOCK SIGNAL IS INTERRUPTED IN CASE OF NO USE OF A CIRCUIT 15

——————— POWER SUPPLY LINE
- - - - - - - GND SUPPLY LINE
——————▶ OPERATION CLOCK SIGNAL SUPPLY LINE
- - - - -▶ CONTROL SIGNAL LINE

OPERATION CLOCK SIGNALS ARE INTERRUPTED IN CASE OF NO USE OF A GROUP OF CIRCUITS 6 AND 7

OPERATION CLOCK SIGNALS ARE INTERRUPTED IN CASE OF NO USE OF A GROUP OF CIRCUITS 14 AND 15

——— POWER SUPPLY LINE
- - - - - - GND SUPPLY LINE
———▶ OPERATION CLOCK SIGNAL SUPPLY LINE
- - - -▶ CONTROL SIGNAL LINE

OPERATION CLOCK SIGNALS ARE INTERRUPTED IN CASE OF NO USE OF A GROUP OF CIRCUITS 6 AND 7

OPERATION CLOCK SIGNALS ARE INTERRUPTED IN CASE OF NO USE OF A GROUP OF CIRCUITS 14 AND 15

— POWER SUPPLY LINE
------ GND SUPPLY LINE
—▶ OPERATION CLOCK SIGNAL SUPPLY LINE
---▶ CONTROL SIGNAL LINE

OPERATION CLOCK SIGNALS ARE INTERRUPTED IN CASE OF NO USE OF A GROUP OF CIRCUITS 6, 7, 8, 9 AND 10

OPERATION CLOCK SIGNALS ARE INTERRUPTED IN CASE OF NO USE OF A GROUP OF CIRCUITS 11, 12, 13, 14 AND 15

——————— POWER SUPPLY LINE
- - - - - - - GND SUPPLY LINE
———▶ OPERATION CLOCK SIGNAL SUPPLY LINE
- - - ▶ CONTROL SIGNAL LINE

OPERATION CLOCK SIGNALS ARE INTERRUPTED IN CASE OF NO USE OF A GROUP OF CIRCUITS 6, 7, 8, 9 AND 10

OPERATION CLOCK SIGNALS ARE INTERRUPTED IN CASE OF NO USE OF A GROUP OF CIRCUITS 11, 12, 13, 14, 15, 18 AND 19

——— POWER SUPPLY LINE
······· GND SUPPLY LINE
——▶ OPERATION CLOCK SIGNAL SUPPLY LINE
---▶ CONTROL SIGNAL LINE

OPERATIONS OF A GROUP OF CIRCUITS COMPOSED OF A
MOST-ADJACENT-TO-ELECTRIC-POWER-SUPPLY-TERMINAL
CIRCUIT 6 AND CIRCUITS 7, 14 AND 15 ARE STOPPED

——————— POWER SUPPLY LINE
-------- GND SUPPLY LINE
———▶ OPERATION CLOCK SIGNAL SUPPLY LINE
------▶ CONTROL SIGNAL LINE

OPERATIONS OF A GROUP OF OPERATION CIRCUITS COMPOSED OF A
MOST-ADJACENT-TO-ELECTRIC-POWER-SUPPLY-TERMINAL CIRCUITS 7, 14 AND 15
AND A GROUP OF OPERATION CIRCUITS COMPOSED OF CIRCUITS 8,9,12 AND 13 ARE STOPPED

——————— POWER SUPPLY LINE
·········· GND SUPPLY LINE
———▶ OPERATION CLOCK SIGNAL SUPPLY LINE
------▶ CONTROL SIGNAL LINE

INTEGRATED CIRCUIT APPARATUS

BACKGROUND OF THE INVENTION

1. Field of the Invention

The present invention relates to an integrated circuit apparatus in which the operation of circuits when not used is appropriately stopped to reduce the adverse influence of noise.

2. Description of Related Art

FIG. 24 is a diagram showing the configuration of a microcomputer representing a conventional integrated circuit apparatus. In FIG. 24, 1 indicates an external electric power supply source, and 2 indicates a microcomputer representing a conventional integrated circuit apparatus. 3 indicates an electric power supply terminal (hereinafter, called a Vcc terminal) for electrically connecting the microcomputer 2 with the external electric power supply source 1. 4 indicates a ground (GND) level supply terminal (hereinafter, called a Vss terminal) for electrically connecting the microcomputer 2 with an external ground electric level (hereinafter, called a GND level). 16 indicates a control circuit such as a central processing unit (CPU) or a bus interface unit (BIU) or an interrupt control circuit (hereinafter, called a control circuit) such as an interface control unit (ICU) or a direct memory access controller (DMAC). 17 indicates a pre-decoder (or a decoder) for decoding an address of a to-be-controlled circuit output from the control circuit 16, setting a pre-decode signal to an active state to indicate that the to-be-controlled circuit is controlled by the control circuit 16, setting each of pre-decode signals of circuits other than the to-be-controlled circuit to an inactive state and outputting the pre-decode signals to a plurality of supply lines of the pre-decode signals. 18 indicates a memory circuit (hereinafter, called a memory) such as a read only memory (ROM), a random access memory (RAM) or a flash memory. 19 indicates a periphery function circuit (hereinafter, called a peripheral circuit). 20 indicates a clock generator for outputting an operation clock signal to each circuit. Each of reference numerals 6 to 15 indicates a buffer circuit (hereinafter, called a port circuit) for a port, a port latch or an input/output drive. Each of reference numerals 21 to 30 indicates a capacitor built-in the microcomputer 2. Solid lines and solid arrows indicate supply lines of the operation clock signals, and the supply lines are arranged so as to surround the circuits 16 to 20. Dotted lines and dotted arrows indicate the supply lines of the pre-decode signals arranged so as to surround the circuits 16 to 20. Also, though a data bus, an address bus and a control bus are arranged so as to surround the circuits 16 to 20, the data bus, the address bus and the control bus are omitted in FIG. 24 and other drawings to simplify the description of the microcomputer 2. Thick solid lines indicate power supply lines through which the electric power of the external electric power supply source 1 is supplied to each circuit. The thick dotted lines indicate GND level supply lines through which each circuit is set to the GND level.

Also, because the circuits 16 to 19 are arranged in an area surrounded by the supply lines of the operation clock signals, the supply lines of the pre-decode signals and the above buses, the circuits 16 to 19 are called internal circuits. The port circuits 6, 7, 14 and 15 are called left-side port circuits because the port circuits 6, 7, 14 and 15 are placed on the left side of the microcomputer 2. The port circuits 8 and 9 are called upper-side port circuits because the port circuits 8 and 9 are placed on the upper side of the microcomputer 2. The port circuits 10 and 11 are called right-side port circuits because the port circuits 10 and 11 are placed on the right side of the microcomputer 2. The port circuits 12 and 13 are called lower-side port circuits because the port circuits 12 and 13 are placed on the lower side of the microcomputer 2.

In cases where the circuits of the microcomputer 2 are replaced with equivalent circuits of the microcomputer 2, the connection between the group of internal circuits 16 to 19 and the group of power supply lines is intentionally designed to supply the electric power to the internal circuits 16 to 19 through equivalent resistances, equivalent inductances and equivalent capacitances parasitically existing in the power supply lines, the port circuits 6 to 15, the capacitors 21 to 30 and other circuits. This design is performed by considering noise generated in the microcomputer 2 according to electromagnetic interference and electromagnetic smog (EMI/EMS). Because of the above design of the power supply lines, an LC filter effect can be obtained in the power supply lines extending from the Vcc terminal 3 to the internal circuits 16 to 19 through the port circuits 6 to 15. Therefore, the inputting of external noise from the Vcc terminal 3 to the microcomputer 2 and the outputting of internal noise generated in the internal circuits 16 to 19 to the outside of the microcomputer 2 through the Vcc terminal 3 can be prevented.

The LC filter effect in the power supply lines extending from the Vcc terminal 3 to the internal circuits 16 to 19 through the port circuits 6 to 15 is described in detail with reference to FIG. 25 and FIG. 26A and FIG. 26B. FIG. 25 shows an equivalent circuit of the microcomputer 2 shown in FIG. 24. In FIG. 25, reference numerals 32 to 41 indicate a plurality of function blocks arranged in the port circuits 6 to 15, and the function blocks 32 to 41 are simultaneously operated when one operation clock signal and/or an electric power are supplied to the function blocks 32 to 41. Also, a specific circuit element required to make each of the port circuits 6 to 15 have a function of the port circuit is arranged in the function block of the port circuit. Reference numerals 42 to 51 indicate equivalent inductances parasitically existing in the power supply lines of the port circuits 6 to 15, and reference numerals 52 to 61 indicate equivalent capacitances parasitically existing in the power supply lines of the port circuits 6 to 15. The same constituent elements as those shown in FIG. 24 are indicated by the same reference numerals as those indicating the constituent elements in FIG. 24, and the description of the same constituent elements as those shown in FIG. 24 is omitted.

A general cause of electric power source noise generated in the microcomputer 2 shown in FIG. 25 is described.

FIG. 26A is an explanatory diagram showing a signal transmitting through an inverter circuit in cases where an operation frequency of the inverter circuit is sufficiently low, and FIG. 26B is an explanatory diagram showing a signal transmitting through an inverter circuit in cases where an operation frequency of the inverter circuit is high. In FIG. 26B, a reference numeral $L_1$ indicates a parasitic inductance of the power supply line, a reference numeral $L_2$ indicates a parasitic inductance of the GND supply line, a reference numeral $L_3$ indicates a parasitic inductance of a signal line, a reference numeral $C_1$ indicates a parasitic capacitance in an area between the electric power source and the GND level supply source, and a reference numeral $C_2$ indicates a parasitic capacitance in an area between the signal line and the GND level supply source.

As shown in FIG. 26A, in cases where an operation frequency of the inverter circuit is sufficiently low, a level of a signal input to the inverter circuit is sharply changed. In cases where the change of the input signal is sharp, a level of an output signal is not made uncertain, no penetration current flows, so that no electric power source noise occurs.

In contrast, as shown in FIG. 26B, in cases where an operation frequency of the inverter circuit is high, the parasitic inductance $L_3$ of the signal line and the parasitic capacitance $C_2$ in the area between the signal line and the GND level supply source cannot be ignored. Therefore, a level of a signal input to the inverter circuit is not sharply changed, and a state, in which the input signal is set to an intermediate level, occurs. During this state, a p-channel transistor and an n-channel transistor of the converter circuit are respectively set to a weakly "on" state to make a level of an output signal uncertain, so that a penetration current flows from the electric power supply source 1 to the GND level supply source.

In case of the high operation frequency, the parasitic inductance $L_1$ and $L_2$ and the parasitic capacitance $C_1$ exist in the electric power supply source and the GND supply source in the same manner as those $L_3$ and $C_2$ existing in the signal line. Therefore, in cases where the size of the transistors of the inverter circuit is sufficiently small and current drive performances of the transistors are sufficiently low, even though the penetration current flows, because of a choke coil effect obtained from the parasitic inductance $L_1$ of the power supply line and the parasitic inductance $L_2$ of the GND level supply line and a smoothing capacitor effect obtained from the parasitic capacitance $C_1$ between the electric power source and the GND level supply source, the penetration current has no adverse influence on the operation of the converter circuit in the practical use.

However, in cases where the transistors of the inverter circuit have large sizes and high current drive performances, the penetration current flowing from the electric power supply source to the GND level supply source becomes large, so that the adverse influence of the penetration current cannot be suppressed by the choke coil effect and the smoothing capacitor effect. In this case, the penetration current makes the electric power supply voltage uncertain (for example, a voltage decrease for a moment), so that electric power source noise is generated.

Returning to the description of the equivalent circuit shown in FIG. 25, the parasitic inductance $L_1$ of the power supply line and the parasitic inductance $L_2$ of the GND supply line correspond to the equivalent inductances 42 to 51, the parasitic capacitance $C_1$ between the electric power supply source 1 and the GND supply source corresponds to the equivalent capacitances 52 to 61, the parasitic inductance $L_3$ of the signal line and the parasitic capacitance $C_2$ between the signal line and the GND level supply source exist in the function blocks 32 to 41. In case of the port circuit 6 as an example, in cases where a transistor having a large size and a high current drive performance is arranged in the function block 32, a penetration current flows from the electric power supply source 1 to the GND level supply source through the function block 32. A peak value of the penetration current becomes high as the number of transistors having large sizes and high current drive performances is increased.

To prevent the adverse influence of the penetration current, the port circuit 6 is connected with the capacitor 21 in a specific area of the power supply line, in which only the equivalent resistance, the equivalent inductance 42 and the equivalent capacitance 52 of the power supply line parasitically exist. This is achieved by designing a specific arrangement of the power supply line between the group of the internal circuits 16 to 19 and the Vcc terminal 3, to make the capacitor 21 electrically influence on the equivalent inductance 42 and the equivalent capacitance 52. Therefore, the group of the capacitance of the capacitor 21, the equivalent inductance 42 and the equivalent capacitance 52 parasitically existing in the port circuit 6 function as an LC filter. That is, the equivalent inductance 42 parasitically existing in the port circuit 6 functions as a choke coil, and the composition of the capacitance of the capacitor 21 and the equivalent capacitance 52 functions as a smoothing capacitor. In other words, the equivalent capacitance 52 is too small to make a capacitor of the equivalent capacitance 52 function as a smoothing capacitor, so that the capacitor 21 is added to the port circuit 6.

In the microcomputer 2 in which the power supply lines are designed as shown in FIG. 24 and FIG. 25, electric power source noise generated in the internal circuits 16 to 19, the upper-side port circuits 8 and 9, the right-side port circuits 10 and 11 and the lower-side port circuits 12 and 13 are attenuated in the microcomputer 2 because of the LC filter effect, so that there is little possibility that the electric power source noise is output from the Vcc terminal 3 to the outside. Therefore, in cases where the microcomputer 2 is arranged with another device on a board to supply the same electric power as that supplied to the microcomputer 2 to the device, electric power source noise is not output from the microcomputer 2 to avoid erroneous operation. Therefore a board not making the device be erroneously operated can be easily designed. Also, even though electric power source noise generated in the device is input to the microcomputer 2 through the Vcc terminal 3, the electric power source noise is attenuated in the microcomputer 2 because of the LC filter effect. Therefore, no electric power source noise is input to the internal circuits 16 to 19, the upper-side port circuits 8 and 9, the right-side port circuits 10 and 11 and the lower-side port circuits 12 and 13.

In addition to the above-described noise attenuation method, there is a noise avoiding method. In this method, operations of all circuits respectively not used are stopped to avoid noise inevitably generated in the operation of each circuit. However, the noise attenuation method, in which the capacitors 21 to 30 are appropriately added by designing the specific arrangement of the power supply lines between the group of the internal circuits 16 to 19 and the Vcc terminal 3, is superior to the noise avoiding method in which operations of all circuits respectively not used are stopped. More precisely, in cases where a microcomputer, from which no noise is output to the outside, is designed, a noise avoiding method is available. However, in the noise avoiding method, in cases where a noise is input from the outside to the microcomputer, the noise cannot be attenuated in the microcomputer, so that an erroneous operation resistance to noise input from the outside is not improved. Also, in cases where a circuit, which is operated in a first time-period and is not used in a second time-period, exists in the microcomputer, the operation stop and the operation start are alternately repeated in the circuit. In this case, a possibility that the circuit is erroneously operated at an operation start time is heightened as the operation frequency of the circuit is heightened, and the erroneous operation resistance of the microcomputer is degraded to a low degree by the erroneous operation of the circuit.

In contrast, in the noise attenuation method, not only the microcomputer, from which no noise is output to the outside, can be obtained, but also the microcomputer, in which the erroneous operation resistance to noise is improved, can be obtained. Also, because only noise is attenuated in the microcomputer in a state that all circuits of the microcomputer are fundamentally operated, a possibility that each circuit is erroneously operated at an operation start time can be reduced even though the operation frequency of the circuit is high.

However, because the conventional integrated circuit apparatus represented by the microcomputer 2 has the above configuration, there is a problem that noise is generated because of the port circuits 6 and 15 most-adjacent to the Vcc terminal 3 or because of a group of the port circuits 6 and 15 and the port circuits 7 and 14 arranged in the periphery of the port circuits 6 and 15.

This problem is described in detail. Though a noise reduction in the conventional integrated circuit apparatus is performed in some degree by appropriately adding the capacitors 21 to 30 while designing the specific arrangement of the power supply lines between the group of the internal circuits 16 to 19 and the Vcc terminal 3, the noise reduction is not sufficient. Research and analysis of the cause of noise generation by the present inventor has shown that the reduction of noise transmitting through the power supply line (or electric power source noise input/output through the Vcc terminal 3) is not sufficient in the conventional integrated circuit apparatus. In particular, the inventor has shown that noise is generated because of one or more circuits most-adjacent to the Vcc terminal 3 (for example, the left-side port circuits 6 and 15 (relating to the function blocks 32 and 41) in the example shown in FIG. 24) or because of the group of the port circuits 6 and 15 and the port circuits 7 and 14 arranged in the periphery of the port circuits 6 and 15.

In cases where the function blocks 32 and 41 of the port circuits 6 and 15 are, for example, considered, the LC filter effect based on the capacitors 21 and 30 arranged in the microcomputer 2 does not effectively function. That is, because only the equivalent resistance, the equivalent inductance and the equivalent capacitance parasitically exist in the power supply line between the Vcc terminal 3 and the group of the port circuits 6 and 15, no element, which attenuates noise generated in the function blocks 32 and 41 of the port circuits 6 and 15, is arranged in the microcomputer 2, so that the noise is output from the Vcc terminal 3 to the outside. Also, the inputting of external noise from the Vcc terminal 3 to the function blocks 32 and 41 cannot be avoided. Therefore, an erroneous operation resistance of the port circuits 6 and 15 to noise mainly determines the erroneous operation resistance of the microcomputer 2 to noise.

In addition, another problem in the port circuits 6 and 15 is described with reference to FIG. 27A and FIG. 27B.

FIG. 27A is an explanatory diagram showing a positional relationship between a group of external terminals (or pins) arranged on a substrate and a group of terminal pads of a circuit of the conventional integrated circuit apparatus in cases where a distance between each external terminal and the corresponding terminal pad is optimized, and FIG. 27B is an explanatory diagram showing a positional relationship between the group of external terminals (or pins) and the group of terminal pads in cases where a distance between each external terminal and the corresponding terminal pad is lengthened.

In FIG. 27A and FIG. 27B, a reference numeral A indicates an external terminal (hereinafter, called a pin) used to electrically connect a circuit of the conventional integrated circuit apparatus with an external device, a reference numeral B indicates a terminal pad of the circuit, a reference numeral "a" indicates a pin distance between the pins A adjacent to each other, each of reference numerals "b" and "c" indicates a terminal pad distance between the terminal pads B adjacent to each other, each of reference numerals W1 and W2 indicates a gold line connecting the pin A and the corresponding terminal pad B.

As shown in FIG. 27A, each circuit of the conventional integrated circuit apparatus is arranged on a substrate on which a plurality of pins A are generally arranged to electrically connect the substrate with external devices, and gold lines W1 are arranged to electrically connect a plurality of terminal pads B of the circuit and the pins A. Thereafter, the molding of a resin material is performed to shield the circuits arranged on the substrate from its peripheral area. In this case, when the resin material is molded on the gold line W1 connecting the terminal pad B and the pin A, the gold line W1 is put under a stress of the resin material according to environmental conditions such as temperature. Therefore, as shown in FIG. 27B, in cases where the terminal pad B and the pin A are arranged to make the distance between the terminal pad B and the pin A longer than an optimum distance or in cases where the gold line W2 is arranged in a slant direction, there is a possibility that the gold line W2 is disconnected because of the stress of the resin material. To avoid the disconnection of the gold line, as shown in FIG. 27A, it is required to set the physical distance between the terminal pad B and the pin A to be as short as possible.

Also, the pin distance a between the pins A is prescribed and fixed to a constant value, and a space surrounding each port circuit most-adjacent to the Vcc terminal 3 is occupied by the Vcc terminal 3 to reduce a free space surrounding the port circuit. Therefore, in cases where the port circuits 6 and 15 most-adjacent to the Vcc terminal 3 are arranged so as to set the physical distance between each terminal pad B relating to the port circuits 6 and 15 and the corresponding pin A to be as short as possible, a physical space used to arrange each of the capacitors 21 and 30 relating to the port circuits 6 and 15 is reduced because of the existence of the Vcc terminal 3. To sufficiently remove the adverse influence of noise on a port circuit, it is required to arrange a capacitor having a sufficiently large capacitance, and a large physical space is required to arrange the capacitor having a sufficiently large capacitance (a physical size of a capacitor becomes large as the capacitance of the capacitor is increased). Though a capacitance of a capacitor (for example, the capacitor 22 or 29) can be increased in cases where the capacitor is placed on a corner of the substrate on which no pin is arranged, because each of the port circuits 6 and 15 is not arranged on the corner of the substrate, it is difficult to create a sufficient space, which is equivalent to that given to the capacitor 22 or 29, to each of the capacitors 21 and 30. Therefore, the capacitances of the capacitors 21 and 30 are reduced, so that the adverse influence of noise on each of the port circuits 7 and 14 cannot be sufficiently removed.

The influence of noise based on the insufficient capacitances of the capacitors 21 and 30 is described by reference to the equivalent circuit shown in FIG. 25. Because each of the capacitors 21 and 30 has an insufficient capacitance, the LC filter effect is not sufficient in the peripheries of the capacitors 21 and 30. Therefore, noise generated in the function blocks 33 and 40 of the port circuits 7 and 14 is not sufficiently attenuated in the peripheries of the capacitors 21 and 30, and the noise is output from the Vcc terminal 3 to the outside. Also, external noise input from the Vcc terminal 3 is not sufficiently attenuated in the peripheries of the capacitors 21 and 30 before the external noise reaches the function blocks 33 and 40 of the port circuits 7 and 14, so that it is inevitable that the external noise is input to the function blocks 33 and 40. Therefore, a weak erroneous operation resistance of the port circuits 7 and 14 to the external noise determines the erroneous operation resistance of the microcomputer 2 in addition to that of the port circuits 6 and 15.

SUMMARY OF THE INVENTION

An object of the present invention is to provide, with due consideration to the drawbacks of the conventional semiconductor circuit apparatus, a semiconductor circuit apparatus in which noise is reduced by appropriately stopping an operation of a circuit connected with a power supply line in cases when the circuit is out of use.

The object is achieved by the provision of a semiconductor circuit apparatus, in which an electric power supply terminal electrically connected with an external electric power source is arranged to supply an electric power to circuits of the semiconductor circuit apparatus, comprising:

a most-adjacent-to-electric-power-supply-terminal circuit connected with the electric power supply terminal through a power supply line through which the most-adjacent-to-electric-power-supply-terminal circuit is electrically most-adjacent to the electric power supply terminal among the circuits respectively connected with the electric power supply terminal through a power supply line; and operation stopping means for stopping an operation of the most-adjacent-to-electric-power-supply-terminal circuit in cases where the most-adjacent-to-electric-power-supply-terminal circuit is not used.

In the above configuration, there is a possibility that noise is generated in any circuit of the semiconductor circuit apparatus during the operation of the circuit and is output to the outside through the electric power supply terminal. Also, there is a possibility that external noise is input to any circuit of the semiconductor circuit apparatus through the electric power supply terminal to erroneously operate the circuit when the circuit is operated. Because the most-adjacent-to-electric-power-supply-terminal circuit is electrically most-adjacent to the electric power supply terminal, a possibility that the noise generated in the most-adjacent-to-electric-power-supply-terminal circuit adversely influences on other components of the outside is high. Also, a possibility that the external noise adversely influences on the most-adjacent-to-electric-power-supply-terminal circuit is high. However, in the present invention, because the operation of the most-adjacent-to-electric-power-supply-terminal circuit is stopped by the operation stopping means in cases where the most-adjacent-to-electric-power-supply-terminal circuit is not used, the adverse influence of the noise generated in the most-adjacent-to-electric-power-supply-terminal circuit on other components of the outside and the adverse influence of the external noise on the most-adjacent-to-electric-power-supply-terminal circuit can be reduced.

Accordingly, an erroneous operation resistance to the external noise in the integrated circuit apparatus can be improved, and the number of noises generated in the integrated circuit apparatus can be reduced.

It is preferred that the integrated circuit apparatus further comprises a group of most-adjacent-to-electric-power-supply-terminal circuits composed of the most-adjacent-to-electric-power-supply-terminal circuit and one or more first circuits to which an operation signal or an operation source supplied to the most-adjacent-to-electric-power-supply-terminal circuit is supplied to operate the specific circuits with the most-adjacent-to-electric-power-supply-terminal circuit, wherein an operation of the group of most-adjacent-to-electric-power-supply-terminal circuits or the operation of the most-adjacent-to-electric-power-supply-terminal circuit is stopped by the operation stopping means in cases where the most-adjacent-to-electric-power-supply-terminal circuit is not used.

In the above configuration, because the operation of the group of most-adjacent-to-electric-power-supply-terminal circuits including the most-adjacent-to-electric-power-supply-terminal circuit is stopped by the operation stopping means, the erroneous operation resistance to the external noise in the integrated circuit apparatus can be further improved, and the occurrence of noise generation in the integrated circuit apparatus can be further reduced.

It is also preferred that the integrated circuit apparatus further comprises a group of operation circuits, to which an operation signal or an operation source is supplied to operate the group of operation circuits with each other, which is connected with the most-adjacent-to-electric-power-supply-terminal circuit or the group of most-adjacent-to-electric-power-supply-terminal circuits, wherein an operation of a second circuit connected with the most-adjacent-to-electric-power-supply-terminal circuit or the group of most-adjacent-to-electric-power-supply-terminal circuits or an operation of the group of operation circuits is stopped by the operation stopping means in cases where each of the most-adjacent-to-electric-power-supply-terminal circuit and the second circuit or the group of operation circuits is not used.

In the above configuration, because the operation of the second circuit or the operation of the group of operation circuits is additionally stopped by the operation stopping means, the erroneous operation resistance to the external noise in the integrated circuit apparatus can be further improved, and the occurrence of noise generation in the integrated circuit apparatus can be further reduced.

It is also preferred that the integrated circuit apparatus further comprises one or more second circuits, which are arranged along or are connected with a power supply line extending from the most-adjacent-to-electric-power-supply-terminal circuit to a third circuit from which noise is not output to the electric power supply terminal and to which external noise received from the electric power supply terminal is not input; and one or more first groups of operation circuits, each group of which receive an operation signal or an operation source to operate circuits of the group with each other and which are arranged along or are connected with a power supply line extending from the group of most-adjacent-to-electric-power-supply-terminal circuits to a second group of operation circuits from which noise is not output to the electric power supply terminal and to which external noise received from the electric power supply terminal is not input, wherein an operation of the second circuits or an operation of the first groups of operation circuits is stopped by the operation stopping means in case of non-use of the second circuits or in case of non-use of the first groups of operation circuits.

In the above configuration, because the operation of the second circuits or the operation of the first groups of operation circuits is additionally stopped by the operation stopping means, the erroneous operation resistance to the external noise in the integrated circuit apparatus can be further improved, and the occurrence of noise generation in the integrated circuit apparatus can be further reduced.

It is also preferred that the integrated circuit apparatus further comprises a second circuit, which is not used to stop the operation of the most-adjacent-to-electric-power-supplyterminal circuit or the operation of the group of most-adjacent-to-electric-power-supply-terminal circuits, wherein an operation of the second circuit is stopped by the operation stopping means in case of non-use of the second circuit.

In the above configuration, because the operation of the second circuit is additionally stopped by the operation stopping means, the erroneous operation resistance to the external noise in the integrated circuit apparatus can be further improved, and the occurrence of noise generation in the integrated circuit apparatus can be further reduced.

It is also preferred that the operation stopping means interrupts the supply of an operation clock signal to the most-adjacent-to-electric-power-supply-terminal circuit to stop the operation of the most-adjacent-to-electric-power-supply-terminal circuit.

Therefore, the operation stopping means having a simplified configuration can be obtained.

It is also preferred that the integrated circuit apparatus further comprises a decoder for setting a first selection signal, which corresponds to a first circuit to be used, to an active state, in cases where an address corresponding to the first circuit is received, and setting a second selection signal, which corresponds to a second circuit not to be used, to an inactive state, wherein an operation of the second circuit is stopped by the operation stopping means according to the second selection signal set to the inactive state.

In the above configuration, the first circuit to be used and the second circuit not to be used can be distinguished from each other by adding only the decoder as an additional circuit.

It is also preferred that the most-adjacent-to-electric-power-supply-terminal circuit, of which the operation is stopped by the operation stopping means in case of non-use, has a function of which a use frequency is low.

Therefore, the ease of use of the integrated circuit apparatus and the flexibility of the operation of the integrated circuit apparatus can be maintained, and a possibility that the integrated circuit apparatus is erroneously operated in a high speed operation can be reduced.

It is also preferred that the integrated circuit apparatus further comprises a capacitor, which is arranged between the most-adjacent-to-electric-power-supply-terminal circuit and another circuit, wherein an inductance and a capacitance parasitically exist in the power supply line.

In the above configuration, because an LC filter effect can be obtained from a capacitance of the capacitor and the inductance and the capacitance parasitically existing in the power supply line, even though noise is produced in the integrated circuit apparatus or external noise is input to the integrated circuit apparatus, the noise or the external noise can be reliably reduced according to the LC filter effect, so that a noise reducing characteristic of the integrated circuit apparatus can be obtained.

DETAILED DESCRIPTION OF THE PREFERRED EMBODIMENTS

The invention will now be described with reference to the accompanying drawings.

EMBODIMENT 1

Figure 1:
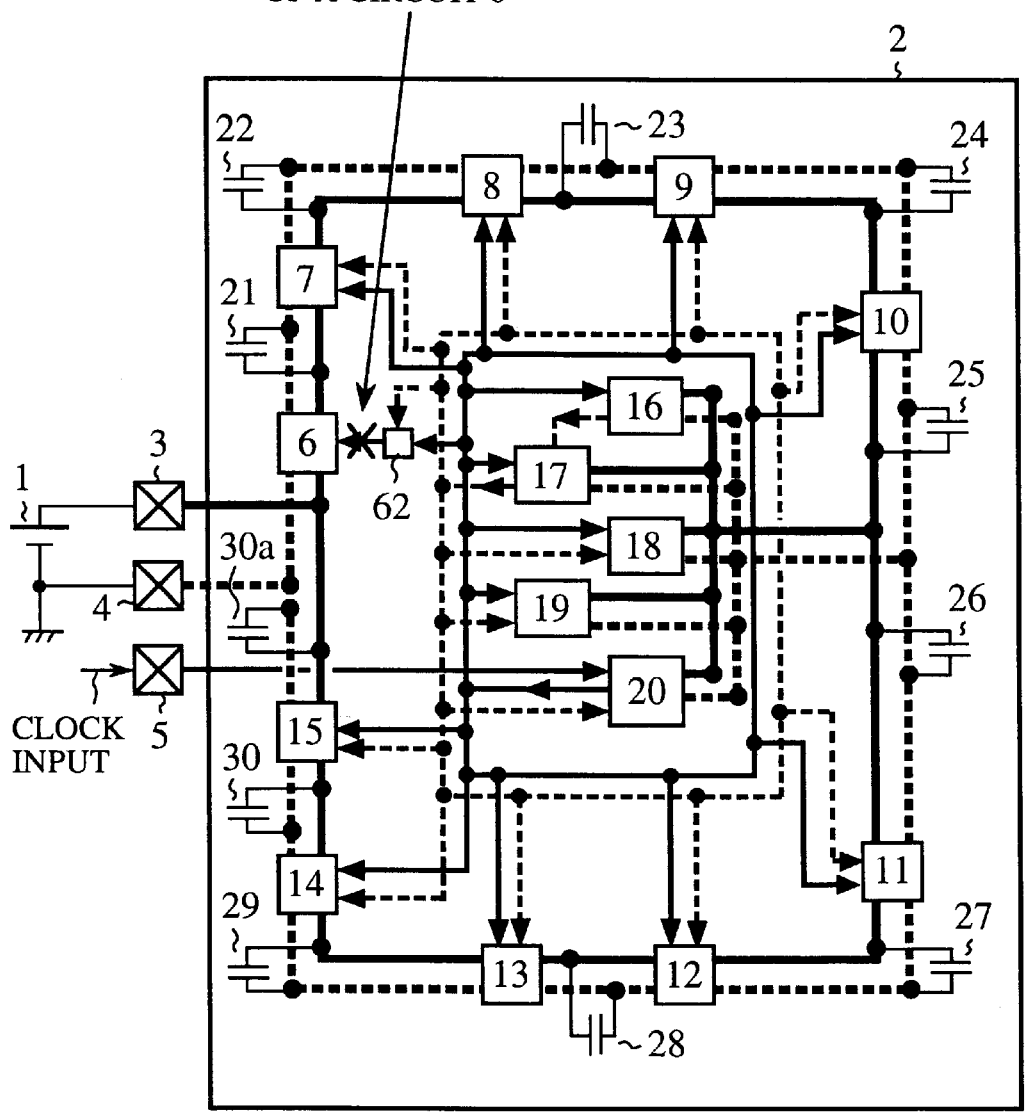
FIG. 1 is a diagram showing the configuration of an integrated circuit apparatus according to a first embodiment of the present invention.
Figure 2:
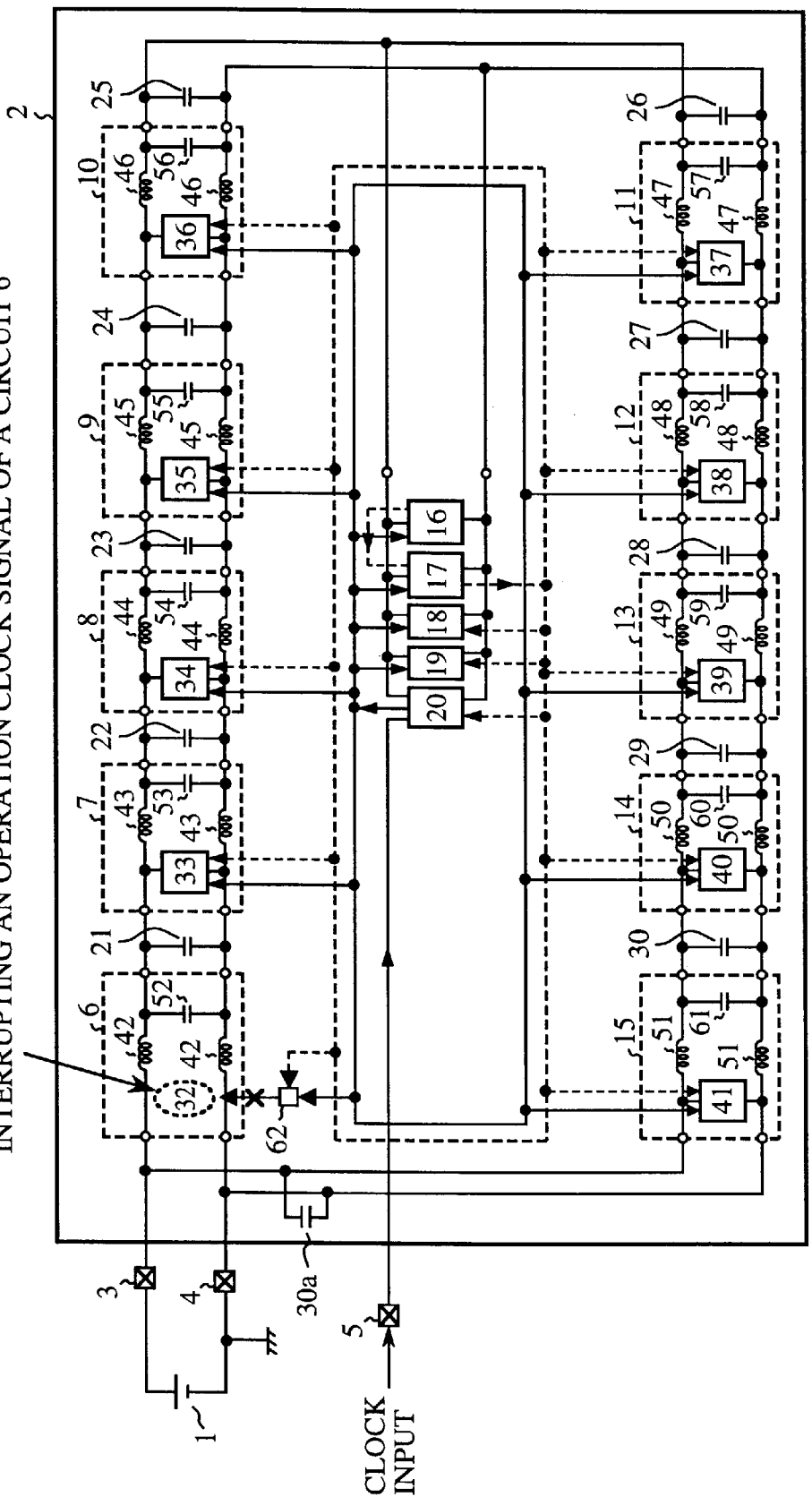
FIG. 2 shows an equivalent circuit of the integrated circuit apparatus shown in FIG. 1.
Figure 24:
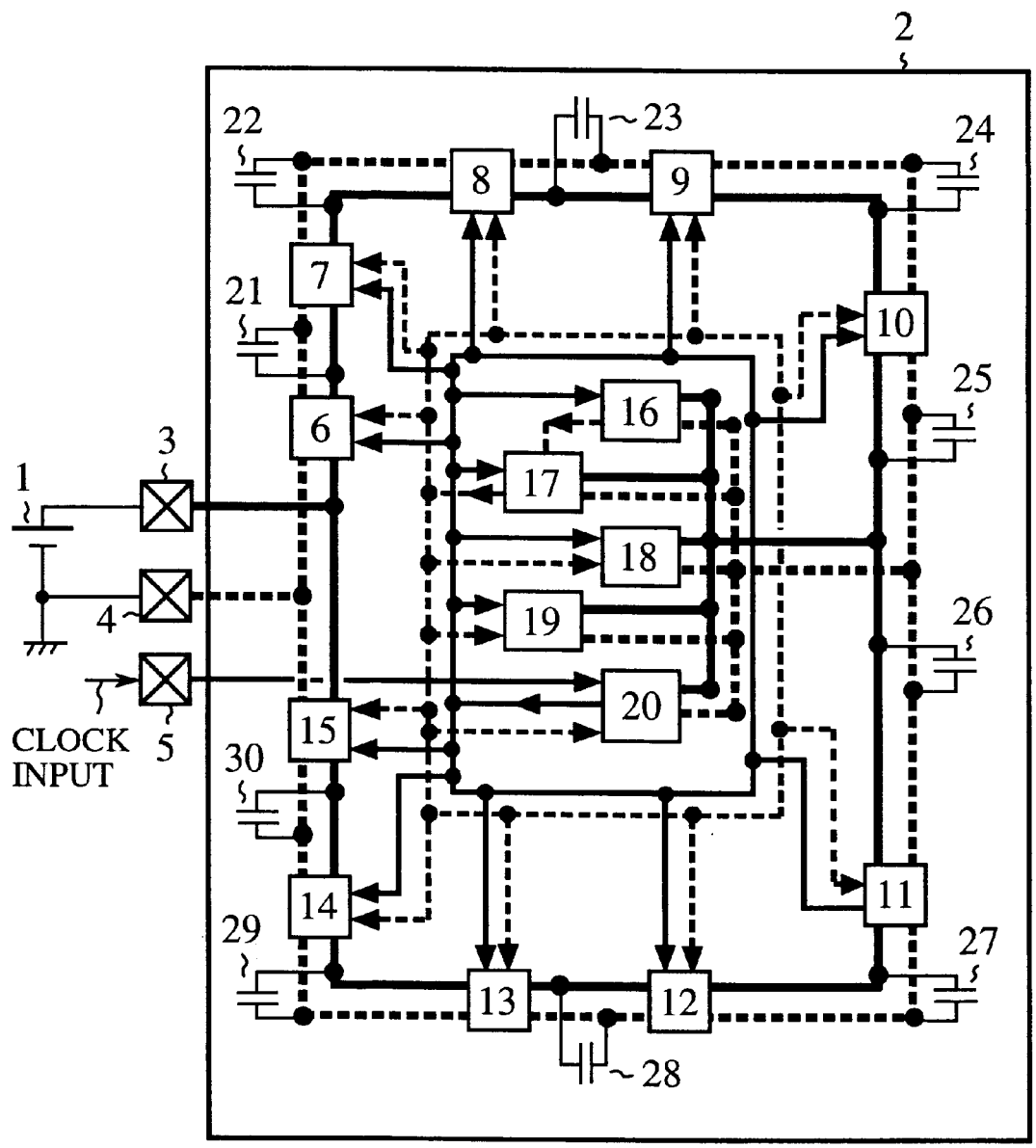
FIG. 24 is a diagram showing the configuration of a microcomputer representing a conventional integrated circuit apparatus.
Figure 25:
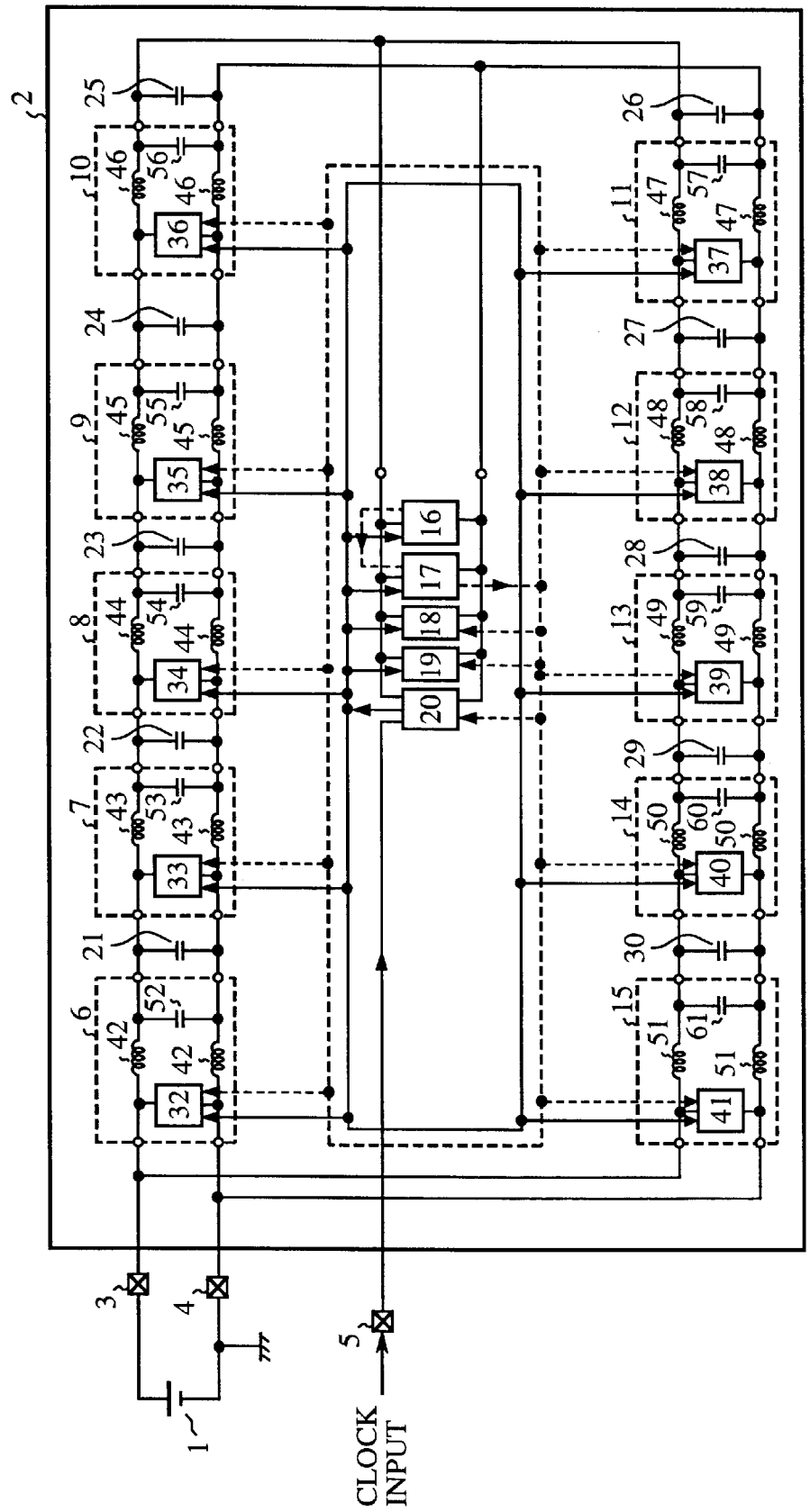
FIG. 25 shows an equivalent circuit of the microcomputer shown in FIG. 24.
Figure 26A:
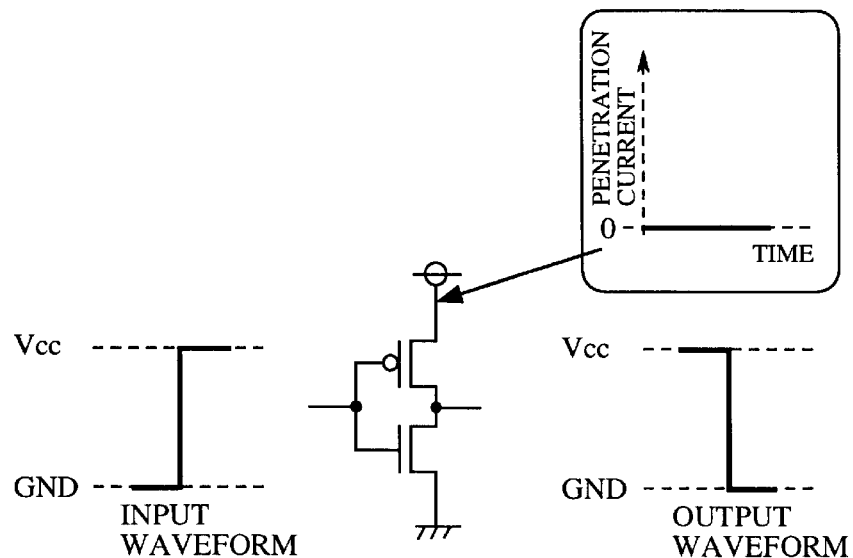
FIG. 26A is an explanatory diagram showing a signal transmitting through an inverter circuit in cases where an operation frequency of the inverter circuit is sufficiently low.
Figure 26B:
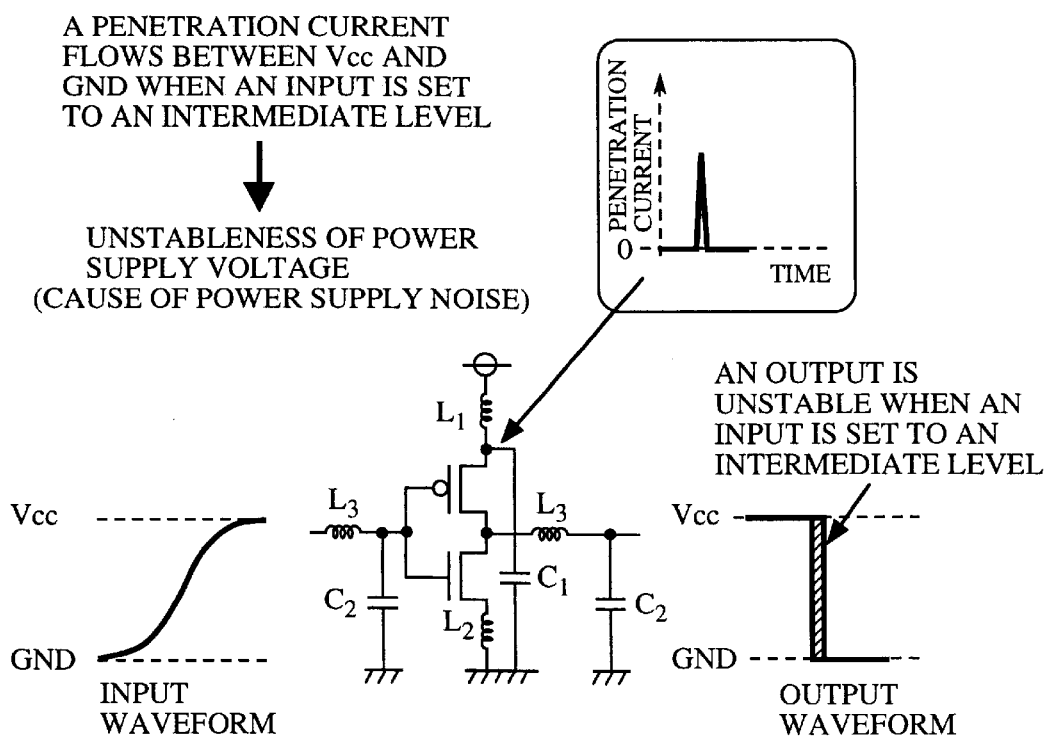
FIG. 26B is an explanatory diagram showing a signal transmitting through an inverter circuit in cases where an operation frequency of the inverter circuit is high.
Figure 27A:
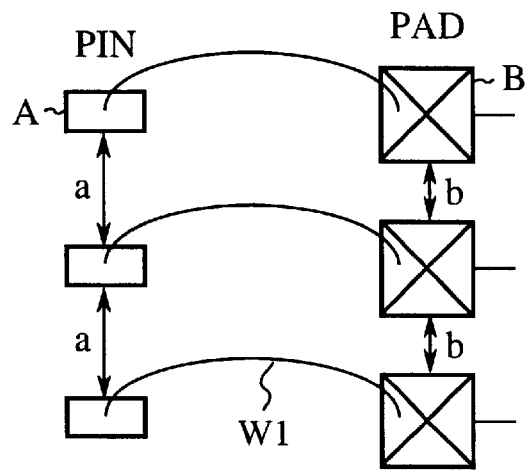
FIG. 27A is an explanatory diagram showing a positional relationship between a group of external terminals arranged on a substrate and a group of terminal pads of a circuit of the conventional integrated circuit apparatus in cases where a distance between each external terminal and the corresponding terminal pad is optimized.
Figure 27B:
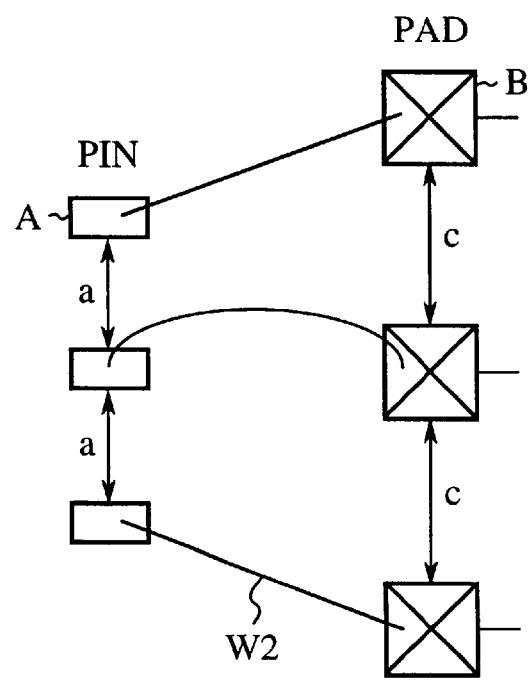
FIG. 27B is an explanatory diagram showing a positional relationship between the group of external terminals and the group of terminal pads in cases where a distance between each external terminal and the corresponding terminal pad is lengthened.

FIG. 1 is a diagram showing the configuration of an integrated circuit apparatus according to a first embodiment of the present invention, and FIG. 2 shows an equivalent circuit of the integrated circuit apparatus shown in FIG. 1. In FIG. 1 and FIG. 2, the reference numeral 2 indicates an integrated circuit apparatus of the present invention, the reference numeral 6 indicates a port circuit (equivalent to a most-adjacent-to-electric-power-supply-terminal circuit) connected with the Vcc terminal 3 through a power supply line through which the port circuit 6 is electrically most-adjacent to the Vcc terminal 3 among circuits respectively connected with the Vcc terminal 3 through a power supply line. A reference numeral 30a indicates a bypass capacitor arranged between the Vcc terminal 3 and the port circuit 15 to obtain an LC filter effect. A reference numeral 62 indicates a clock interrupting circuit (equivalent to an operation stopping means) for interrupting an operation clock signal supplied from the clock generator 20. The same constituent elements as those shown in FIG. 24 or FIG. 25 are indicated by the same reference numerals as those indicating the constituent elements in FIG. 24 or FIG. 25, and the description of the same constituent elements as those shown in FIG. 24 or FIG. 25 is omitted.

Next, an operation of the integrated circuit apparatus 2 according to the first embodiment is described.

In the first embodiment, because an operation of a circuit connected with a power supply line is appropriately stopped to reduce noise, an operation stopping of the circuit is mainly described.

In cases where the control circuit 16 does not require the use of the port circuit 6, a signal indicating non-use of the port circuit 6 is sent from the control circuit 16 to the clock interrupting circuit 62. The clock interrupting circuit 62 judges according to the signal that the control circuit 16 does not require the use of the port circuit 6, and the operation clock signal to be supplied to the port circuit 6 is interrupted by the clock interrupting circuit 62. Therefore, as shown in FIG. 2, the function block 32 of the port circuit 6 is set to an operation stop state. Assuming that noise is generated in the port circuit 6 in its standby state in which the port circuit 6 is operated though the control circuit 16 does not require the use of the port circuit 6, because the port circuit 6 is electrically most-adjacent to the Vcc terminal 3, there is a high possibility that the noise is output to the outside through the Vcc terminal 3. However, because the operation of the port circuit 6 is stopped in cases where the control circuit 16 does not require the use of the port circuit 6, no noise is generated in the port circuit 6. Also, in cases where external noise is input to the integrated circuit apparatus 2 through the Vcc terminal 3, though the external noise is, at first, input to the port circuit 6 electrically most-adjacent to the Vcc terminal 3, because the function block 32 of the port circuit 6 is not operated in cases where the control circuit 16 does not require the use of the port circuit 6, there is no possibility that the function block 32 is erroneously operated in cases where the control circuit 16 does not require the use of the port circuit 6.

Also, in cases where capacitances of the capacitors 21 and 30a are respectively sufficiently large, the port circuit 7 sufficiently receives the LC filter effect based on the capacitor 21, and the port circuit 15 sufficiently receives the LC filter effect based on the capacitor 21. Therefore, noise generated in any of the port circuits 7 and 15 is attenuated because of the LC filter effect before the noise reaches the Vcc terminal 3, and external noise input through the Vcc terminal 3 is attenuated because of the LC filter effects based on the capacitors 21 and 30a before the external noise reaches the port circuit 7 or 15. Also, in cases where a capacitance of the capacitor 30 is sufficiently large, because the port circuit 14 sufficiently receives the LC filter effect based on the capacitor 30, noise generated in the port circuit 14 is attenuated before the noise reaches the Vcc terminal 3. Also, external noise input through the Vcc terminal 3 is attenuated before the external noise reaches the port circuit 14.

In addition, in cases where each of the capacitors 22 to 29 has a capacitance sufficient to remove noise generated in the integrated circuit apparatus 2 and external noise input through the Vcc terminal 3, the same effect as the LC filter effect can be obtained by the combination of the capacitances of the capacitors 22 to 29 and the group of equivalent inductances and equivalent capacitances parasitically existing in the power supply lines of the port circuits 8 to 13 and the internal circuits 16 to 19. Therefore, noise generated in any of the port circuits 8 to 13 and the internal circuits 16 to 19 is attenuated before the noise reaches the Vcc terminal 3, and external noise input through the Vcc terminal 3 is attenuated before the external noise reaches the port circuits 8 to 13 and the internal circuits 16 to 19. Accordingly, a noise reducing characteristic of the integrated circuit apparatus 2 shown in FIG. 2 can be considerably improved by adding the clock interrupting circuit 62 to the integrated circuit apparatus 2.

An important point in the integrated circuit apparatus 2 according to the first embodiment is that the integrated circuit apparatus 2 has a means for stopping an operation of a specific circuit (equivalent to a most-adjacent-to-electric-power-supply-terminal circuit ) connected with the Vcc terminal 3 through a power supply line, through which the specific circuit 6 is electrically most-adjacent to the Vcc terminal 3 among circuits. Operation is stopped in cases where the control circuit 16 does not require the use of the specific circuit. In the integrated circuit apparatus 2 according to the first embodiment, because the port circuit 6 is electrically most-adjacent to the Vcc terminal 3 through the power supply line between the port circuit 6 and the Vcc terminal 3 among the port circuits 6 to 15 and the internal circuits 16 to 19, the clock interrupting circuit 62 is arranged along the operation clock signal supply line connected with the port circuit 6 which is one of the left-side port circuits. Therefore, an erroneous operation resistance to external noise, which is input from the outside through the Vcc terminal 3 and cannot be removed in the prior art according to the noise avoiding method in which operations of all circuits respectively not used by the control circuit 16 are stopped, can be improved.

Next the concept of "a power supply line, through which a circuit is electrically most-adjacent to another circuit" is described with reference to FIG. 3 and FIG. 4.

Figure 3:
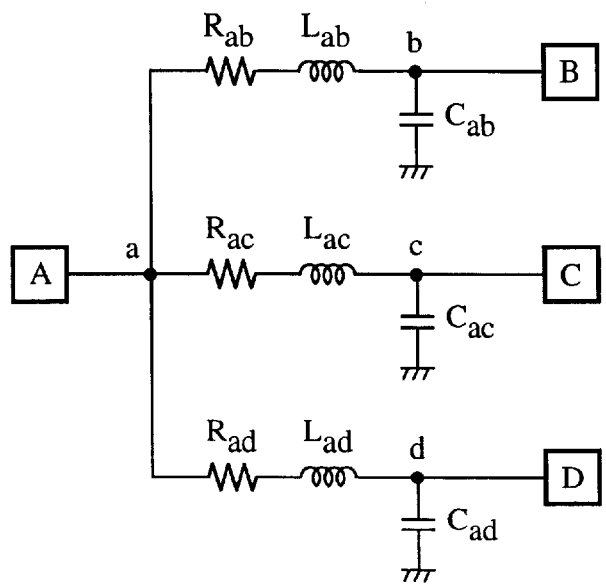
FIG. 3 is a diagram showing an equivalent circuit as an example of power supply lines through which a plurality of circuit elements are connected with a circuit element in parallel to each other.

FIG. 3 is a diagram showing an equivalent circuit as an example of power supply lines through which a plurality of circuit elements are connected with a circuit element in parallel to each other. In FIG. 3, reference numerals A, B, C and D respectively indicate a circuit element. The circuit element A is connected with the circuit elements B, C and D through three power supply lines in parallel to each other. Reference numerals $R_{ab}$, $L_{ab}$ and $C_{ab}$ indicate an equivalent resistance, an equivalent inductance and an equivalent capacitance parasitically existing in the power supply line between the circuit elements A and B, reference numerals $R_{ac}$, $L_{ac}$ and $C_{ac}$ indicate an equivalent resistance, an equivalent inductance and an equivalent capacitance parasitically existing in the power supply line between the circuit elements A and C, and reference numerals $R_{ad}$, $L_{ad}$ and $C_{ad}$ indicate an equivalent resistance, an equivalent inductance and an equivalent capacitance parasitically existing in the power supply line between the circuit elements A and D.

Figure 4:
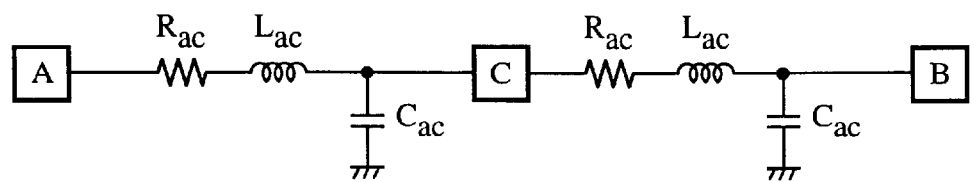
FIG. 4 is a diagram showing an equivalent circuit as an example of power supply lines through which a plurality of circuit elements are serially connected with each other.

FIG. 4 is a diagram showing an equivalent circuit as an example of power supply lines through which a plurality of circuit elements are serially connected with each other. In FIG. 4, reference numerals A, B and C respectively indicate a circuit element. The circuit elements A, C and B are serially connected with each other in that order through power supply lines. A reference numeral $R_{ac}$ indicates an equivalent resistance parasitically existing in the power supply line between the circuit element C and each of the circuit elements A and B, a reference numeral $L_{ac}$ indicates an equivalent inductance parasitically existing in the power supply line between the circuit element C and each of the circuit elements A and B, and a reference numeral $C_{ac}$ indicates an equivalent capacitance parasitically existing in the power supply line between the circuit element C and each of the circuit elements A and B.

As shown in FIG. 3, in cases where the circuit elements B, C and D are connected with the circuit element A in parallel to each other through no circuit element, only the equivalent resistance $R_{ab}$ (or $R_{ac}$, $R_{ad}$), the equivalent inductance $L_{ab}$ (or $L_{ac}$, $L_{ad}$) and the equivalent capacitance $C_{ab}$ (or $C_{ac}$, $C_{ad}$) parasitically exist in the power supply line between the circuit element A and each of the circuit elements B, C and D. In this case, the connection state between two circuit elements is defined as a state that one circuit element is electrically adjacent to another circuit element. That is, each of the circuit elements B, C and D is electrically adjacent to the circuit element A.

Also, a time constant of a signal transfer between the circuit element A and each of the circuit elements B, C and D is considered according to the equivalent resistance, the equivalent inductance and the equivalent capacitance parasitically existing in the power supply line between the circuit element A and each of the circuit elements B, C and D. More precisely, a signal transfer time required to transmit a signal from a point a of the circuit element A to each of points b, c and d of the circuit elements B, C and D is considered. In cases where the signal transfer time from the point a of the circuit element A to the point b (or c, d) of the circuit element B (or C, D) is long as compared with the other signal transfer times, the circuit element B (or C, D) is electrically far from the circuit element A. In contrast, in cases where the signal transfer time from the point a of the circuit element A to the point b (or c, d) of the circuit element B (or C, D) is short as compared with the other signal transfer times, the circuit element B (or C, D) is electrically near to the circuit element A. Therefore, in cases where the signal transfer time from the point a of the circuit element A to the point b (or c, d) of the circuit element B (or C, D) is shortest among the signal transfer times, it is judged that the circuit element B (or C, D) is electrically most-adjacent to the circuit element A.

Also, as shown in FIG. 4, though the circuit element C is electrically adjacent to the circuit element A, the circuit element B is not electrically adjacent to the circuit element A because of the existence of the circuit element C. Therefore, it is judged that the circuit element C is electrically most-adjacent to the circuit element A. In cases where a resistor, an inductor or a capacitor is additionally arranged along the power supply line between the circuit elements A and C, the circuit element C is not electrically most-adjacent to the circuit element A, but it is judged that the resistor, the inductor or the capacitor is electrically most-adjacent to the circuit element A.

Therefore, in cases where a first circuit element is connected with a second circuit element through a power supply line in which only a resistance, an inductance and/or a capacitance parasitically exist, it is defined that the first circuit element is electrically adjacent to the second circuit element. Also, in cases where a plurality of first circuit elements are electrically adjacent to a second circuit element, one first circuit element, in which a time constant of a signal transfer between the first circuit element and the second circuit element is shortest among those corresponding to the first circuit elements, is electrically most-adjacent to the second circuit element. Also, in cases where only one first circuit element is electrically adjacent to a second circuit element, the first circuit element is electrically most-adjacent to the second circuit element. Also, in cases where a plurality of first circuit elements are electrically adjacent to a second circuit element on condition that time constants of signal transfers between a plurality of third circuit elements selected from the first circuit elements and the second circuit element are the same as each other and are shorter than those corresponding to the first circuit elements other than the third circuit elements, the third circuit elements are electrically most-adjacent to the second circuit element. Therefore, the most-adjacent-to-electric-power-supply-terminal circuit described in the claims of the present invention indicates a specific circuit (corresponding to the port circuit 6) which is electrically most-adjacent to the Vcc terminal 3. That is, only a resistance, an inductance and/or a capacitance parasitically exist in a power supply line connecting the specific circuit and the Vcc terminal 3, and a time constant of a signal transfer between the specific circuit and the Vcc terminal 3 is determined according to the resistance, the inductance and/or the capacitance parasitically existing in the power supply line and is shortest among those between the Vcc terminal 3 and all circuits adjacent to the Vcc terminal 3. In this case, the specific circuit is called a most-adjacent-to-electric-power-supply-terminal circuit.

To simplify the description of embodiments, a circuit electrically adjacent to the Vcc terminal 3 is called an adjacent-to-electric-power-supply-terminal circuit hereinafter.

In the first embodiment, though an erroneous operation resistance to external noise, which is input from the outside through the Vcc terminal 3 and cannot be removed in the prior art according to the noise avoiding method in which operations of all circuits respectively not used are stopped, can be improved by stopping an operation of the mostadjacent-to-electric-power-supply-terminal circuit (that is, the port circuit 6 in the example shown in FIG. 1) in case of non-use of the most-adjacent-to-electric-power-supply-terminal circuit, there is a possibility that the operation stop and the operation start of the port circuit 6 are alternately repeated under the control of the control circuit 16 because the operation of the port circuit 6 is stopped each time the control circuit 16 judges not to use the port circuit 6. In other words, in cases where a frequency of the operation clock signal input to the port circuit 6 is high, a possibility that the port circuit 6 is erroneously operated in its start operation is heightened. Also, because the operation of the function block 32 is stopped to reduce noise, a plurality of function blocks including the function block 32 cannot be simultaneously operated in parallel to each other. Therefore, there is a possibility that the ease of use of the integrated circuit apparatus 2, for example, represented by a microcomputer and/or the flexibility of the operation of the integrated circuit apparatus 2 are reduced.

To maintain the ease of use of the integrated circuit apparatus 2 and the flexibility of the operation of the integrated circuit apparatus 2, because circuit elements such as transistor are originally arranged in each of the port circuits 6, 7, 14 and 15, one or more circuit elements such as transistor, which are originally arranged in the function block 32, are removed from the function block 32 and are additionally arranged in the function blocks 33, 40 and 41 of the left-side port circuits 7, 14 and 15 to distribute functions of the circuit elements originally given to the port circuit 6 to the port circuits 7, 14 and 15. Therefore, the port circuit 6 having only a circuit element such as transistor, which functions as the most-adjacent-to-electric-power-supply-terminal circuit, has a low processing capability as compared with those of the port circuits 7, 14 and 15. In this case, a possibility that the port circuit 7, 14 or 15 is used in the control circuit 16 in place of the port circuit 6 is increased because functions originally set in the port circuit 6 are moved to the port circuits 7, 14 and 15, and a time-period in which the operation of the port circuit 6 not used is stopped is increased. Therefore, the possibility that the operation stop and the operation start of the port circuit 6 are alternately repeated under the control of the control circuit 16 can be reduced, so that the ease of use of the integrated circuit apparatus 2 and the flexibility of the operation of the integrated circuit apparatus 2 can be maintained. Also, because the possibility that the port circuit 6 is erroneously operated in a high speed operation corresponding to the operation clock signal of a high frequency is reduced, an effect that the noise reducing characteristic of the integrated circuit apparatus 2 is considerably improved can be obtained without the above defects.

Also, because the port circuit 6 is set to have a low processing capability, there is a case that one circuit element such as transistor is only arranged in the function block 32. In this case, an area occupied by the port circuit 6 is reduced. As is described in the prior art, each of the terminal pads of the port circuits 6 to 15 has to be arranged so as to set the physical distance between the terminal pad and the corresponding pin to be as short as possible. In cases where an area occupied by the port circuit 6 is reduced, there is a possibility that the physical distance between each terminal pad of the port circuit 6 and the corresponding pin is lengthened. However, the noise reducing characteristic of the integrated circuit apparatus 2 can be considerably improved, the ease of use of the integrated circuit apparatus 2 and the flexibility of the operation of the integrated circuit apparatus 2 can be maintained, and the possibility that the port circuit 6 is erroneously operated in a high speed operation is reduced. Therefore, the configuration of the integrated circuit apparatus according to the first embodiment is the best mode.

Next, the clock interrupting circuit 62 is described in detail.

A clock interrupting circuit having a function for reliably interrupting an operation clock signal to be sent to a port circuit, of which an operation is to be stopped in case of non-use, can be fundamentally adopted as the clock interrupting circuit 62.

Figure 17A:
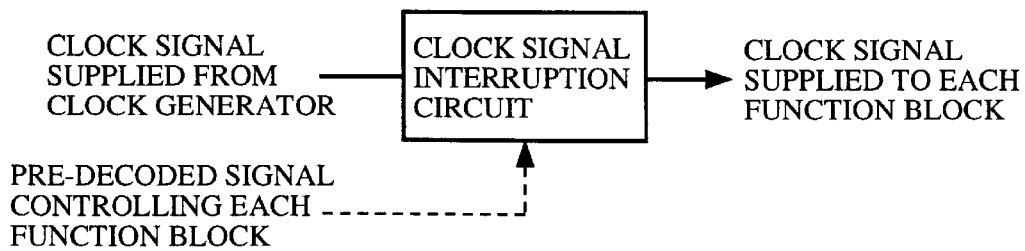
FIG. 17A is an explanatory diagram showing a fundamental function of the clock interrupting circuit 62.
Figure 17B:
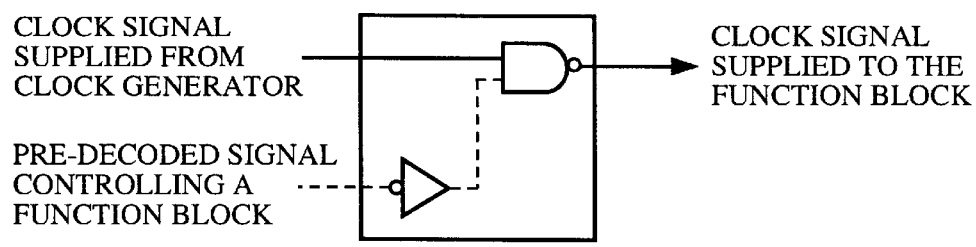
FIG. 17B is a block diagram showing the configuration of the clock interrupting circuit 62 using an NAND circuit.
Figure 17C:
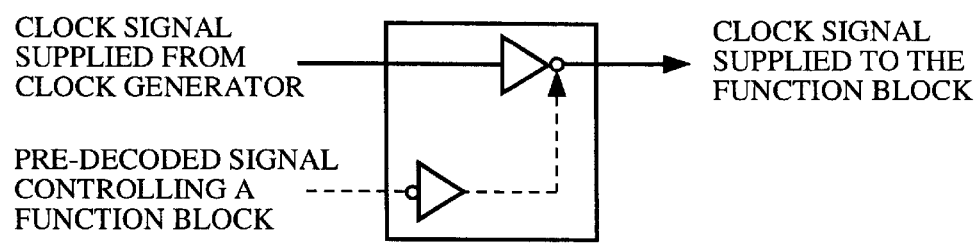
FIG. 17C is a block diagram showing the configuration of the clock interrupting circuit 62 using a clocked inverter circuit.
Figure 17D:
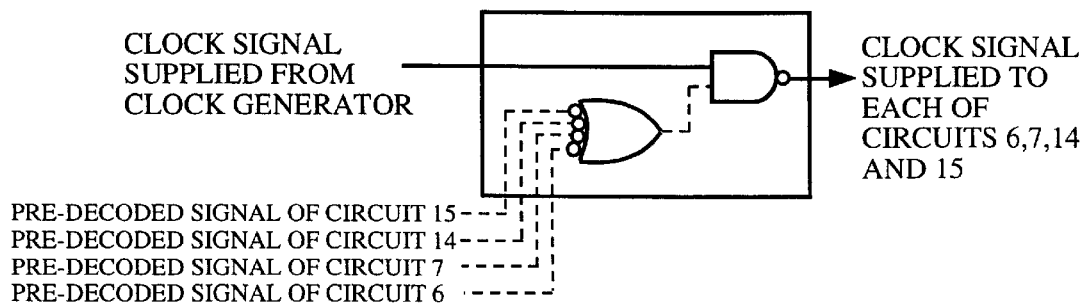
FIG. 17D is a block diagram showing the configuration of the clock interrupting circuit 62 using logical circuits in which the interruption of the operation clock signal sent to four port circuits is controlled.

FIG. 17A is an explanatory diagram showing a fundamental function of the clock interrupting circuit 62, FIG. 17B is a block diagram showing the configuration of the clock interrupting circuit 62 using an NAND circuit, FIG. 17C is a block diagram showing the configuration of the clock interrupting circuit 62 using a clocked inverter circuit, and FIG. 17D is a block diagram showing the configuration of the clock interrupting circuit 62 using logical circuits in which the interruption of the operation clock signal sent to four port circuits is controlled. The configuration of the clock interrupting circuit 62 shown in FIG. 17D is described in a third embodiment.

In the clock interrupting circuit 62 shown in FIG. 17A, an operation clock signal sent from the clock generator 20 is always received, and the supply and interruption of the operation clock signal for function blocks of all port circuits are controlled according to pre-decode signals (or selection signals) output from the pre-decoder 17. The pre-decode signals are obtained in the pre-decoder 17 by decoding addresses of the port circuits including a to-be-controlled port circuit informed from the control circuit 16. Therefore, the pre-decode signal corresponding to the to-be-controlled port circuit is set to an "active" state, and the other pre-decode signals corresponding to port circuits other than the to-be-controlled port circuit are respectively set to an "inactive" state.

For example, in cases where data obtained in the port circuit 10 is output to the outside of the integrated circuit apparatus 2 under control of the control circuit 16, an address of the port circuit 10 is sent from the control circuit 16 to the pre-decoder 17 through an address bus (not shown), a pre-decode signal corresponding to the port circuit 10 is set to an "active" state, and pre-decode signals corresponding to the internal circuits and port circuits other than the port circuit 10 are respectively set to an "inactive" state. Thereafter, each of the pre-decode signals is sent to the corresponding port circuit or the corresponding internal circuit. Therefore, the port circuits set to the use state (or "active" state) and the port circuits set to the non-use state (or "inactive" state) can be distinguished in the integrated circuit apparatus 2, and it can be judged in the clock interrupting circuit 62 whether or not the control circuit 16 requires the use of the port circuit 6. In place of this control method, it is applicable that specific control signals be produced in the control circuit 16 to distinguish a group of port circuits and internal circuits set to the use state and a group of port circuits and internal circuits set to the non-use state. However, because the pre-decode signals are originally used in the integrated circuit apparatus 2, the clock interrupting circuit 62 having the fundamental function required in the integrated circuit apparatus 2 of the present invention can be obtained by adding only a new circuit. The "active" state of the pre-decode signal is indicated by a low level "L", and the "inactive" state of the pre-decode signal is indicated by a high level "H".

The clock interrupting circuit 62 shown in FIG. 17B is described. When a pre-decode signal set to the "active" state ("L") is input to the clock interrupting circuit 62 (that is, when the port circuit 6 corresponding to the clock interrupting circuit 62 is used as a to-be-controlled port circuit under control of the control circuit 16), an operation clock signal, of which a phase is opposite to that of an operation clock signal supplied from the clock generator 20 to the clock interrupting circuit 62 and is amplified, is supplied to a function block of the to-be-controlled port circuit connected with the clock interrupting circuit 62. Also, when a pre-decode signal set to the "inactive" state ("H") is input to the clock interrupting circuit 62 (that is, when the port circuit 6 corresponding to the clock interrupting circuit 62 is not used under control of the control circuit 16), an operation clock signal, of which a level is always set to "H" regardless of a level of an operation clock signal supplied from the clock generator 20 to the clock interrupting circuit 62, is supplied to a function block of the port circuit 6 not selected as the to-be-controlled port circuit. Therefore, the operation clock signal to be sent to the function block of the port circuit 6 corresponding to the pre-decode signal set to the "inactive" state ("H") is interrupted in the clock interrupting circuit 62. Accordingly, because one or more port circuits and internal circuits set to the use state and one or more port circuits and internal circuits set to the non-use state can be distinguished in the integrated circuit apparatus 2 according to the pre-decode signals, it can be judged in the clock interrupting circuit 62 whether or not the control circuit 16 requires the use of the port circuit 6, so that the operation of the port circuit 6 can be reliably stopped by the function of the clock interrupting circuit 62 in cases where the control circuit 16 requires the non-use of the port circuit 6.

The clock interrupting circuit 62 shown in FIG. 17C is described. When a pre-decode signal set to the "active" state ("L") is input to the clock interrupting circuit 62, an operation clock signal, of which a phase is opposite to that of an operation clock signal supplied from the clock generator 20 to the clock interrupting circuit 62, is supplied to a function block of the to-be-controlled port circuit 6 connected with the clock interrupting circuit 62. Also, when a pre-decode signal set to the "inactive" state ("H") is input to the clock interrupting circuit 62, an operation clock signal, of which a level is always set to "H" regardless of a level of an operation clock signal supplied from the clock generator 20 to the clock interrupting circuit 62, is supplied to the function block 32 of the port circuit 6 not selected as a to-be-controlled port circuit. Accordingly, in the same manner as in the clock interrupting circuit 62 shown in FIG. 17B, the operation of the port circuit 6 can be reliably stopped by the function of the clock interrupting circuit 62 in cases where the control circuit 16 requires the non-use of the port circuit 6. Also, the number of circuit elements such as transistor used in the clocked inverter circuit shown in FIG. 17C can be redialed as compared with that used in the NAND circuit shown in FIG. 17B.

Accordingly, in the first embodiment, because the integrated circuit apparatus 2 has the clock interrupting circuit 62 to stop the operation of the most-adjacent-to-electric-power-supply-terminal circuit (that is, the port circuit 6 or a circuit element of the function block 32 of the port circuit 6) connected with the Vcc terminal 3 through the power supply line, through which the most-adjacent-to-electric-power-supply-terminal circuit is electrically most-adjacent to the Vcc terminal 3 among circuits respectively connected with the Vcc terminal 3 through a power supply line, in case of non-use of the most-adjacent-to-electric-power-supply-terminal circuit on condition that the power supply line between the Vcc terminal 3 and the group of the internal circuits 16 to 19 is arranged so as to supply the electric power to the group of the internal circuits 16 to 19 through the port circuits 6 to 15 and the capacitors 21 to 30, the integrated circuit apparatus 2, in which the noise reducing characteristic is considerably improved, can be obtained.

Here, because the port circuits 6 to 15 are arranged in the integrated circuit apparatus 2 so as to set the physical distance between each terminal pad of the port circuits 6 to 15 and the corresponding pin to be as short as possible, the port circuits 6 to 15 are used as the constituent elements of the LC filter arranged between the Vcc terminal 3 and the internal circuits 16 to 19. Therefore, the electric power supplied to the group of the internal circuits 16 to 19 passes through the port circuits 6 to 15 and the capacitors 21 to 30. However, the first embodiment is not limited to the LC filter composed of the port circuits 6 to 15. For example, in cases where the peripheral circuit 19 (or the other internal circuit) is connected with the Vcc terminal 3 through the power supply line through which the peripheral circuit 19 is electrically most-adjacent to the Vcc terminal 3, it is applicable that the peripheral circuit 19 be used as the constituent elements of the LC filter arranged between the Vcc terminal 3 and the internal circuits 16 to 19.

Also, in cases where the internal circuits 16 to 19 and the clock generator 20 are, for example, replaced with the memory 18 and a control circuit having a simplified configuration, the integrated circuit apparatus 2 of the first embodiment can be applied for a memory. Also, in cases where the peripheral circuit; 19 is replaced with a servo control circuit or a custom logic circuit, the integrated circuit apparatus of the first embodiment can be applied for an integrated circuit (IC) for specific use or an application specific integrated circuit (ASIC). Also, though a microcomputer represents the integrated circuit apparatus 2, all types of semiconductor IC can represent the integrated circuit apparatus 2.

Also, in the first embodiment, because the integrated circuit apparatus 2 has the clock interrupting circuit 62 in which the operation of a circuit is stopped by interrupting the supply of the operation clock signal to the circuit, the operation stopping means can be the clock interrupting circuit 62 shown in FIG. 17B or FIG. 17C can be used as the operation stopping means.

Also, in the first embodiment, the integrated circuit apparatus 2 has the pre-decoder 17 in which a pre-decode signal corresponding to a to-be-used circuit is set to the "active" state and pre-decode signals corresponding to circuits other than the to-be-used circuit are set to the "inactive" state when an address of the to-be-used circuit output from the control circuit 16 is received. Furthermore the judgment of non-use of the circuits is performed according to the pre-decode signals in the clock interrupting circuit 62. Therefore, non-use of the circuits and the use of certain circuits can be judged by adding only a new circuit.

Also, in the first embodiment, because the most-adjacent-to-electric-power-supply-terminal circuit, of which the operation is to be stopped in case of no use, has a low processing capability, a possibility that the most-adjacent-to-electric-power-supply-terminal circuit is used is low. Therefore, the ease of use and the operation flexibility of the integrated circuit apparatus 2 can be obtained, the possibility that the integrated circuit apparatus 2 is erroneously operated at a high speed operation can be reduced, and the noise reducing characteristic of the integrated circuit apparatus 2 can be improved.

Also, in the first embodiment, though the supply of the operation clock signal to a circuit is interrupted to stop the operation of the circuit, the first embodiment is not limited to this example. For example, it is applicable that the supply of the electric power to a circuit be interrupted to stop the operation of the circuit.

EMBODIMENT 2

In the first embodiment, the operation of the most-adjacent-to-electric-power-supply-terminal circuit, which is connected with the Vcc terminal 3 through a power supply line through which the most-adjacent-to-electric-power-supply-terminal circuit is electrically most-adjacent to the Vcc terminal 3, is stopped in case of non-use of the most-adjacent-to-electric-power-supply-terminal circuit. However, in a second embodiment, all adjacent-to-electric-power-supply-terminal circuits (the port circuit 15), which are adjacent to the Vcc terminal 3 through power supply lines (in which only resistance, inductance and capacitance parasitically exist) and are connected with the most-adjacent-to-electric-power-supply-terminal circuit (the port circuit 6) through power supply lines, are stopped in the most-adjacent-to-electric-power-supply-terminal circuit in case of non-use of the adjacent-to-electric-power-supply-terminal circuits and non-use of the most-adjacent-to-electric-power-supply-terminal circuit.

Figure 5:
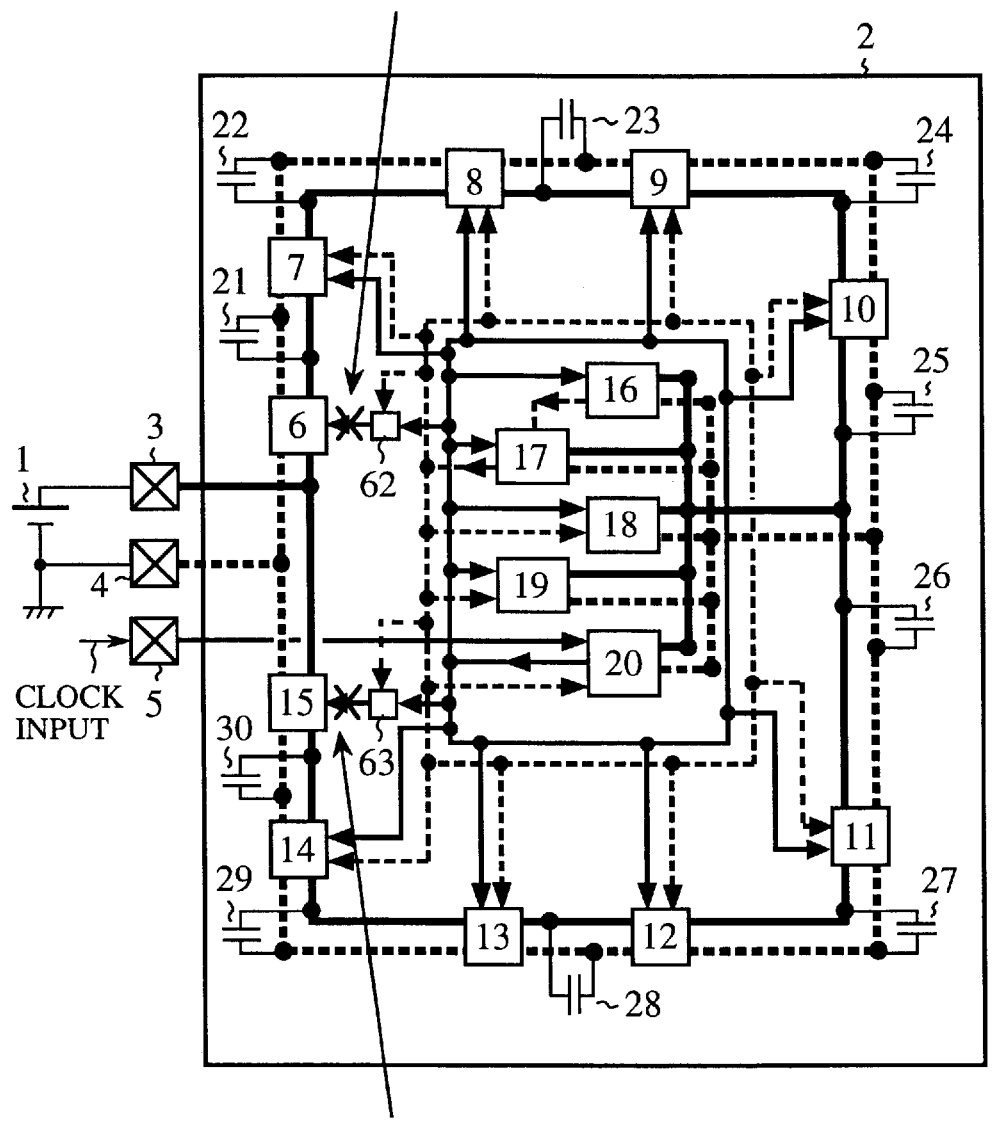
FIG. 5 is a diagram showing the configuration of an integrated circuit apparatus according to a second embodiment of the present invention.
Figure 6:
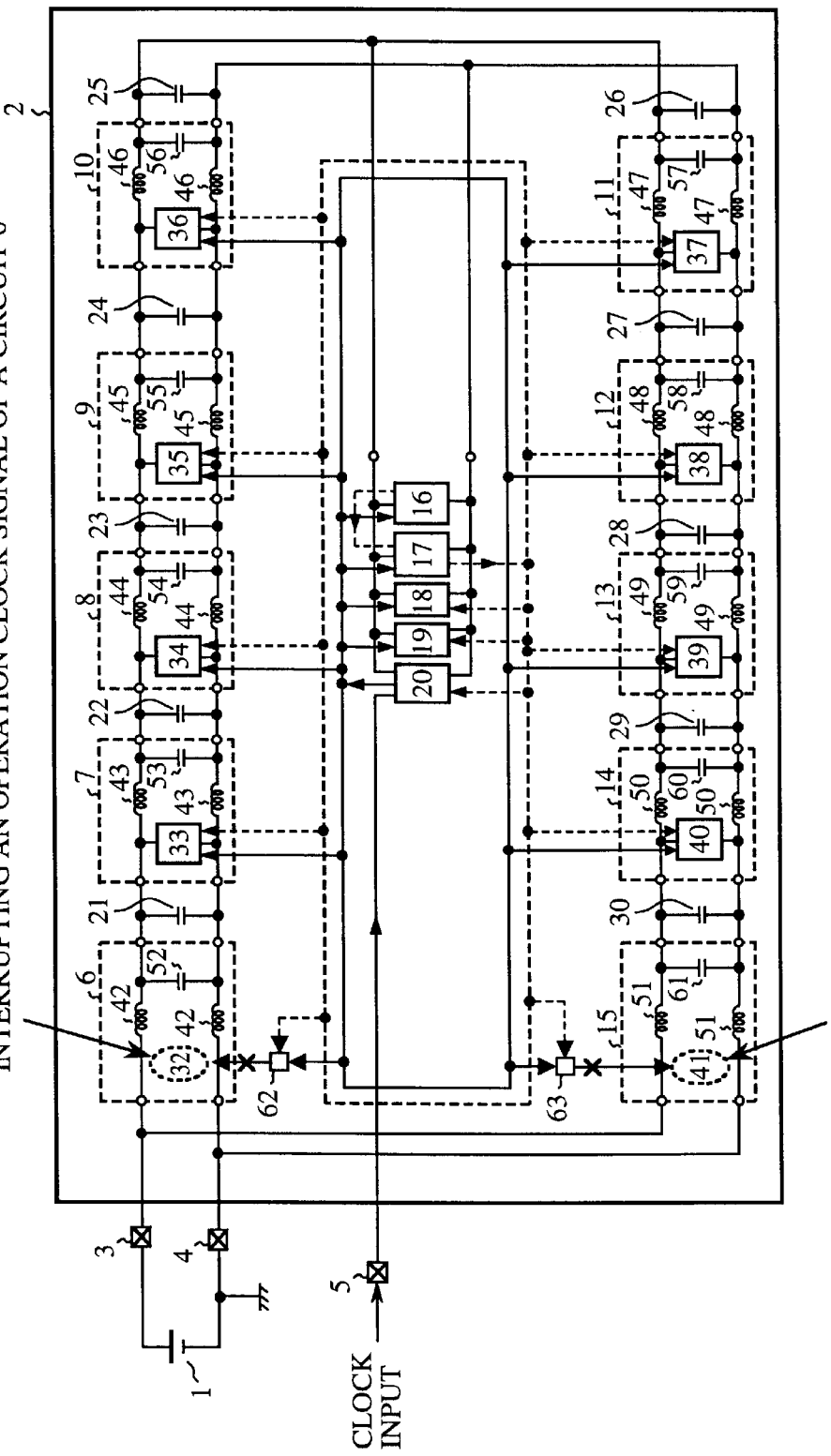
FIG. 6 shows an equivalent circuit of the integrated circuit apparatus shown in FIG. 5.

FIG. 5 is a diagram showing the configuration of an integrated circuit apparatus according to a second embodiment of the present invention, and FIG. 6 shows an equivalent circuit of the integrated circuit apparatus shown in FIG. 5. In FIG. 5 and FIG. 6, the reference numerals 6 and 15 indicate the port circuits which are connected with the Vcc terminal 3 through power supply lines through which the port circuits 6 and 15 are electrically adjacent to the Vcc terminal 3. Therefore, the port circuits 6 and 15 are classified as adjacent-to-electric-power-supply-terminal circuits. A reference numeral 63 indicates a clock interrupting circuit (operation stopping means), and the clock interrupting circuit 63 has the same function as that of the clock interrupting circuit 62. The clock interrupting circuit 63 is arranged along an operation clock signal supply line connected with the port circuit 15, and the operation of the port circuit 15, which is adjacent to the Vcc terminal 3 and is connected with the port circuit 6 through a power supply line parasitically including only resistance, inductance and capacitance, is stopped by the clock interrupting circuit 63 in case of non-use of the port circuit 15. The same constituent elements as those shown in FIG. 1 or FIG. 2 are indicated by the same reference numerals as those indicating the constituent elements in FIG. 1 or FIG. 2, and the description of the same constituent elements as those shown in FIG. 1 or FIG. 2 is omitted.

Next, an operation of the integrated circuit apparatus according to the second embodiment is described.

In the second embodiment, because operations of circuits connected with power supply lines are appropriately stopped to reduce noise, the operation stopping of the circuits is mainly described.

In cases where the control circuit 16 does not require the use of a group of the port circuits 6 and 15, a signal indicating non-use of the port circuit 6 is sent from the control circuit 16 to the clock interrupting circuit 62, and a signal indicating non-use of the port circuit 15 is sent from the control circuit 16 to the clock interrupting circuit 63. The clock interrupting circuit 62 judges according to the signal that the control circuit 16 does not require the use of the port circuit 6, the clock interrupting circuit 63 judges according to the signal that the control circuit 16 does not require the use of the port circuit 15, the operation clock signal to be supplied to the port circuit 6 is interrupted by the clock interrupting circuit 62, and the operation clock signal to be supplied to the port circuit 15 is interrupted by the clock interrupting circuit 63. Therefore, as shown in FIG. 6, the function blocks 32 and 41 of the port circuits 6 and 15 are respectively set to an operation stop state, so that no noise is generated in the port circuits 6 and 15. Also, even though external noise is input to any of the port circuits 6 and 15 through the Vcc terminal 3, because each of the function blocks 32 and 41 of the port circuits 6 and 15 is not operated, there is no possibility that the function block 32 or 41 is erroneously operated.

Also, in cases where capacitances of the capacitors 21 and 30 are respectively sufficiently large, the port circuit 7 sufficiently receives the LC filter effect based on the capacitor 21, and the port circuit 14 sufficiently receives the LC filter effect based on the capacitor 30. Therefore, noise generated in any of the port circuits 7 and 14 is attenuated because of the LC filter effect before the noise reaches the Vcc terminal 3, and external noise input through the Vcc terminal 3 is attenuated because of the LC filter effect before the external noise reaches the port circuit 7 or 14. Also, in cases where each of the capacitors 22 to 29 has a capacitance sufficient to remove noise generated in the integrated circuit apparatus 2 and external noise input through the Vcc terminal 3, the same effect as the LC filter effect can be obtained by the combination of the capacitances of the capacitors 22 to 29 and the group of equivalent inductances and equivalent capacitances parasitically existing in the power supply lines of the port circuits 8 to 13 and the internal circuits 16 to 19. Therefore, noise generated in any of the port circuits 8 to 13 and the internal circuits 16 to 19 is attenuated before the noise reaches the Vcc terminal 3, and external noise input through the Vcc terminal 3 is attenuated before the external noise reaches any of the port circuits 8 to 13 and the internal circuits 16 to 19.

An important point in the integrated circuit apparatus 2 according to the second embodiment is that operations of all adjacent-to-electric-power-supply-terminal circuits (that is, the port circuit 15), which are adjacent to the Vcc terminal 3 through power supply lines (in which only resistance, inductance and capacitance parasitically exist) and are connected with the port circuit 6 (that is, the most-adjacent-to-electric-power-supply-terminal circuit) through power supply lines, are stopped with the port circuit 6 in case of non-use of the port circuit 6 and non-use of the adjacent-to-electric-power-supply-terminal circuits.

In the integrated circuit apparatus 2 according to the second embodiment, because the port circuit 15 is electrically adjacent to the Vcc terminal 3 through the power supply line and is connected with the port circuit 6 through the power supply line, the clock interrupting circuit 63 is arranged along the operation clock signal supply line connected with the port circuit 15 which is one of the left-side port circuits. Therefore, an erroneous operation resistance to external noise, which is input from the outside through the Vcc terminal 3 and cannot be reduced in the prior art according to the noise avoiding method in which operations of all circuits respectively not used in the control circuit 16 are stopped, can be improved.

However, there is a possibility that the operation stop and the operation start of the port circuit 6 or 15 are alternately repeated under the control of the control circuit 16 because the operations of the port circuits 6 and 15 are stopped each time the control circuit 16 judges the non-use of the port circuits 6 and 15. In other words, in cases where a frequency of the operation clock signal input to the port circuits 6 and 15 is high, a possibility that the port circuit 6 or 15 is erroneously operated in its start operation is heightened. Also, because the operations of the function blocks 32 and 41 are stopped to reduce noise, a plurality of function blocks including the function block 32 or 41 cannot be simultaneously operated in parallel to each other. Therefore, there is a possibility that the ease of use of the integrated circuit apparatus 2, for example, represented by a microcomputer and/or the flexibility of the operation of the integrated circuit apparatus 2 are reduced.

Since circuit elements such as transistor are originally arranged in each of the left-side port circuits 6, 7, 14 and 15, the ease of use of the integrated circuit apparatus 2 and the flexibility of the operation of the integrated circuit apparatus 2 may be maintained by removing one or more circuit elements such as transistor, which are originally arranged in the function blocks 32 and 41 from the function blocks 32 and 41 and additionally arranging these components in the function blocks 33 and 40 of the left-side port circuits 7 and 14 to distribute functions of the circuit elements originally given to the port circuits 6 and 15 to the port circuits 7 and 14. Therefore, the port circuits 6 and 15 respectively have only a circuit element such as transistor to have a low processing capability as compared with those of the port circuits 7 and 14. In this case, a possibility that the port circuit 7 or 14 is used in place of the port circuit 6 or 15 is increased because functions originally set in the port circuits 6 and 15 are moved to the port circuits 7 and 14, and a time-interval in which the operations of the port circuits 6 and 15 respectively not used are stopped is increased. Therefore, the possibility that the operation stop and the operation start of each of the port circuits 6 and 15 are alternately repeated under the control of the control circuit 16 can be reduced. Therefore, the ease of use of the integrated circuit apparatus 2 and the flexibility of the operation of the integrated circuit apparatus 2 can be maintained. Also, because the possibility that each of the port circuits 6 and 15 is erroneously operated in a high speed operation is reduced, an effect that the noise reducing characteristic of the integrated circuit apparatus 2 is considerably improved can be obtained without the above defects. Here, the transistor arranged in each of the port circuits 6 and 15 is adjacent to the Vcc terminal 3 through a power supply line in which a resistance, an inductance and a capacitance parasitically exist.

Also, because each of the port circuits 6 and 15 is set to have a low processing capability, there is a case that one circuit element such as transistor is only arranged in each of the function blocks 32 and 41 of the port circuits 6 and 15. In this case, an area occupied by each of the port circuits 6 and 15 is reduced. As is described in the prior art, each of the terminal pads of each of the port circuits 6 to 15 has to be arranged so as to set the physical distance between the terminal pad and the corresponding pin to be as short as possible. In cases where an area occupied by the port circuit 6 or 15 is small, there is a possibility that the physical distance between each terminal pad of the port circuit 6 or 15 and the corresponding pin is lengthened. However, the noise reducing characteristic of the integrated circuit apparatus 2 can be considerably improved, the ease of use of the integrated circuit apparatus 2 and the flexibility of the operation of the integrated circuit apparatus 2 can be maintained, and the possibility that the port circuit 6 or 15 is erroneously operated according to the operation clock signal having a high frequency can be reduced. Therefore, the configuration of the integrated circuit apparatus according to the second embodiment is one of the best modes in the same manner as in the first embodiment.

Also, though the LC filter effect for the port circuits 7 and 14 can be expected in cases where the capacitances of the capacitors 21 and 30 are sufficiently high, in cases where the capacitor 21 or 30 does not have a sufficient capacitance, it is preferable that an operation of the port circuits 7 and 14 be stopped in case of non-use of the port circuits 7 and 14 (described in detail in a third embodiment).

Accordingly, in the second embodiment, operations of all adjacent-to-electric-power-supply-terminal circuits (represented by the port circuit 15), which are adjacent to the Vcc terminal 3 through power supply lines (in which only resistance, inductance and capacitance parasitically exist) and are connected with the port circuit 6 (that is, the most-adjacent-to-electric-power-supply-terminal circuit) through power supply lines, are stopped with the port circuit 6 in case of non-use of the port circuit 6 and non-use of the adjacent-to-electric-power-supply-terminal circuits. Therefore, the noise reducing characteristic of the integrated circuit apparatus for noise generated in the integrated circuit apparatus or external noise input to the integrated circuit apparatus through the Vcc terminal 3 and the electric source line can be improved.

Next, a first modification of the second embodiment is described.

Figure 7:
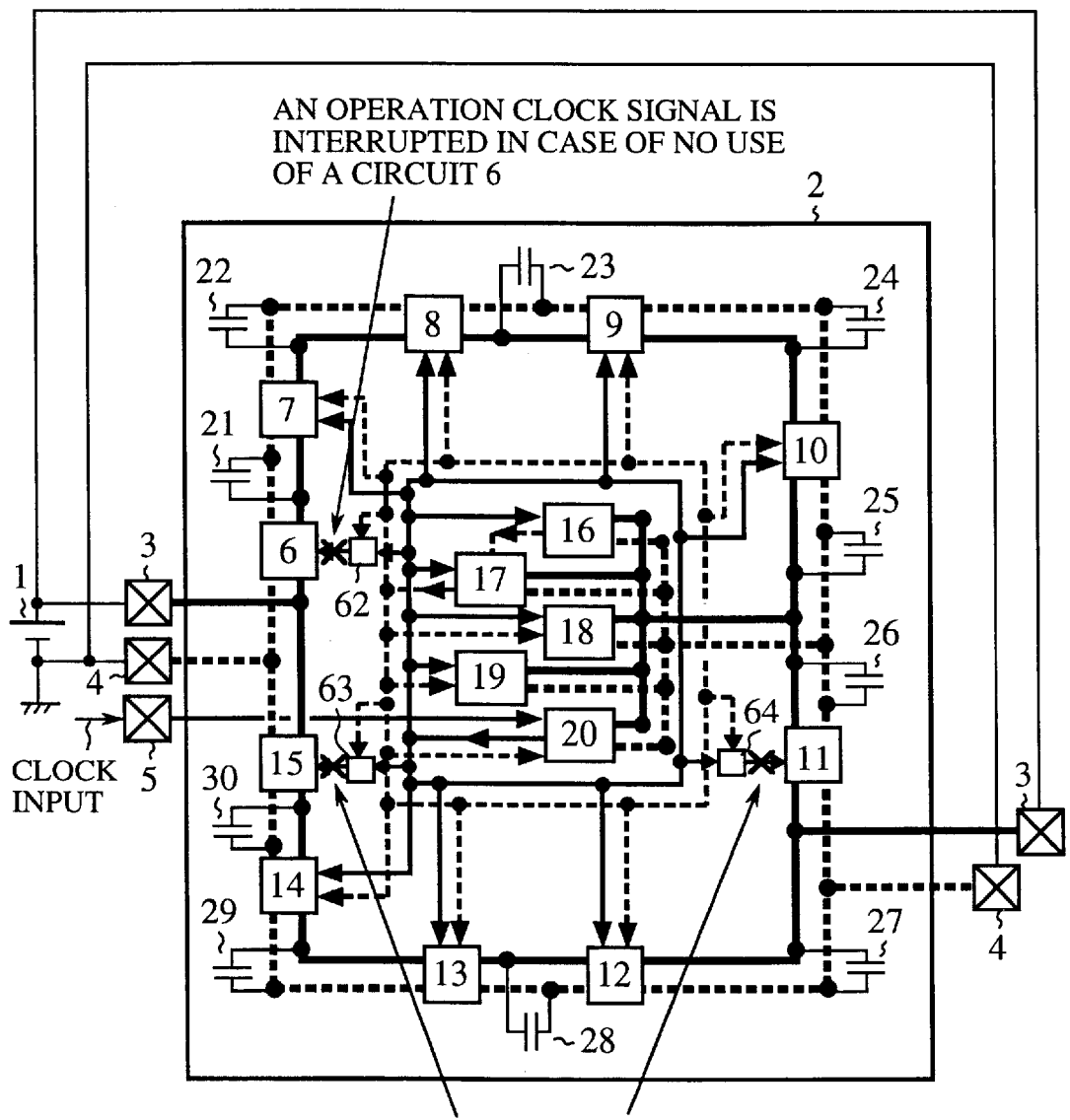
FIG. 7 is a diagram showing the configuration of an integrated circuit apparatus according to a first modification of the second embodiment of the present invention.
Figure 8:
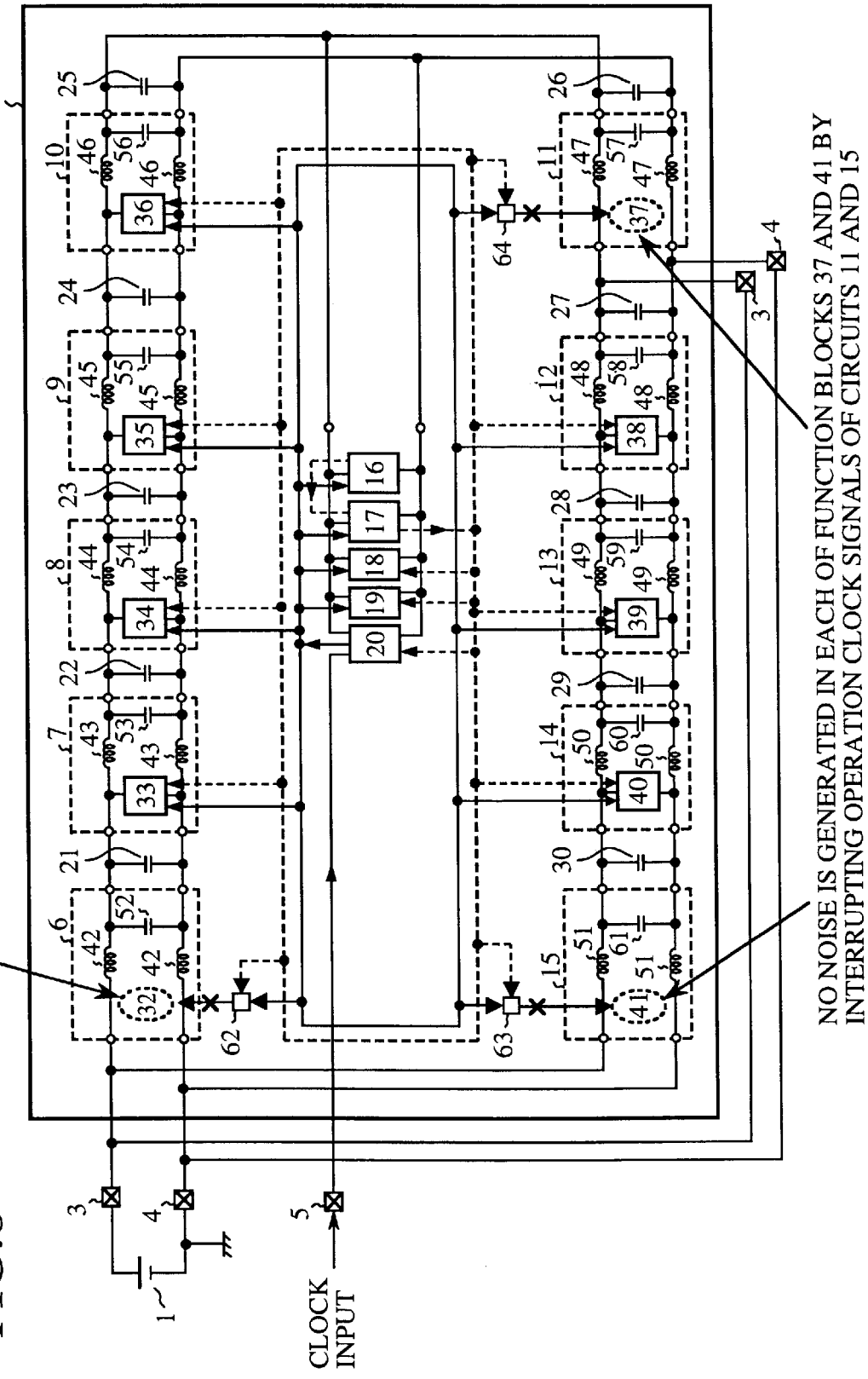
FIG. 8 shows an equivalent: circuit of the integrated circuit apparatus shown in FIG. 7.

FIG. 7 is a diagram showing the configuration of an integrated circuit apparatus according to a first modification of the second embodiment of the present invention, and FIG. 8 shows an equivalent circuit of the integrated circuit apparatus shown in FIG. 7. As shown in FIG. 7 and FIG. 8, two Vcc terminals 3 are prepared, one Vcc terminal 3 is connected with the port circuits 6 and 15 through power supply lines in the same manner as in the first and second embodiments, and another Vcc terminal 3 is connected with the port circuits 11 and 12 through power supply lines so as to place the capacitor 27 between the Vcc terminal 3 and the port circuit 12. Also, a reference numeral 64 indicates a clock interrupting circuit (the operation stopping means), and the clock interrupting circuit 64 has the same function as those of the clock interrupting circuits 62 and 63. Because the integrated circuit apparatus 2 has to have the operation stopping means for stopping operations of all most-adjacent-to-electric-power-supply-terminal circuits connected with the Vcc terminals 3 through power supply lines, through which each most-adjacent-to-electric-power-supply-terminal circuit is electrically most-adjacent to the corresponding Vcc terminal 3 in case of non-use of the most-adjacent-to-electric-power-supply-terminal circuits (refer to the first embodiment), the clock interrupting circuit 64 is arranged along an operation clock signal supply line connected with the port circuit 11, and the operation of the port circuit 11 is stopped by the clock interrupting circuit 64 in case of non-use of the port circuit 11. The same constituent elements as those shown in FIG. 5 or FIG. 6 are indicated by the same reference numerals as those indicating the constituent elements in FIG. 5 or FIG. 6, and the description of the same constituent elements as those shown in FIG. 5 or FIG. 6 is omitted.

In the above configuration, the port circuits 6 and 15 respectively have only a circuit element such as transistor to have a low processing capability as compared with those of the port circuits 7 and 14 in the same manner as in the second embodiment. Also, because circuit elements such as transistor are originally arranged in each of the right-side port circuits 10 and 11, one or more circuit elements such as transistor, which are originally arranged in the function block 37 of the port circuit 11, are removed from the function block 37 and are additionally arranged in the function block 36 of the port circuit 10 to move functions of the circuit elements originally given to the port circuit 11 to the port circuit 10. Therefore, the port circuit 11 having only a circuit element such as transistor, which functions as the most-adjacent-to-electric-power-supply-terminal circuit, has a low processing capability as compared with that of the port circuit 10. In this case, a possibility that the port circuit 7 or 14 is used in place of the port circuit 6 or 15 is increased in the same manner as in the second embodiment, and a possibility that the port circuit 10 is used in place of the port circuit 11 is increased. Therefore, a time-interval in which the operations of the port circuits 6, 11 and 15 respectively not used are stopped is increased, and the possibility that the operation stop and the operation start of each of the port circuits 6, 11 and 15 are alternately repeated under the control of the control circuit 16 can be reduced.

Accordingly, the ease of use of the integrated circuit apparatus 2 and the flexibility of the operation of the integrated circuit apparatus 2 can be maintained.

Also, as shown in FIG. 8, in cases where the control circuit 16 does not require the use of a group of the port circuits 6, 11 and 15, the operations of the port circuits 6, 11 and 15 are stopped by the function of the clock interrupting circuits 62, 63 and 64, and the port circuits 7, 8, 9, 10, 12, 13 and 14, the internal circuits 16 to 19 and the clock generator 20 are set to be under operation. In this case, one or more LC filters exist between the Vcc terminal 3 and each of the circuits set to the under-operation state. For example, in case of the port circuit 7, the capacitor 21 connecting the power supply line and the GND supply line and the group of the equivalent inductance 43 and the equivalent capacitance 53 parasitically existing in the power supply line and the GND supply line of the port circuit 7 function as an LC filter in an area between the Vcc terminal 3 and the port circuit 7.

Also, because the capacitor 27 exists between the Vcc terminal 3 and the port circuit 12 in addition to the equivalent inductance 48 parasitically existing in the power supply line, the equivalent inductance 48 parasitically existing in the GND supply line and the equivalent capacitance 58 parasitically existing in the port circuit 12, no clock interrupting circuit is arranged for the port circuit 12 (the port circuit 12 is not an adjacent-to-electric-power-supply-terminal circuit because of the existence of the capacitor 27).

However, assuming that the capacitor 27 is not arranged between the Vcc terminal 3 and the port circuit 12, because the port circuit 12 is an adjacent-to-electric-power-supply-terminal circuit and because only the equivalent inductance 48 parasitically existing in the power supply line, the equivalent inductance 48 parasitically existing in the GND supply line and the equivalent capacitance 58 parasitically existing in the port circuit 12 are arranged between the Vcc terminal 3 and the port circuit 12, it is required to arrange a clock interrupting circuit along the operation clock signal supply line connected with the port circuit 12. In this case, the function block 38 of the port circuit 12 is set to have only a circuit element such as transistor to make the port circuit 12 have a low processing capability, and one or more circuit elements originally arranged in the function block 38 of the port circuit 12 are arranged in the function block 39 of the port circuit 13.

Accordingly, the noise reducing characteristic of the integrated circuit apparatus 2, the ease of use of the integrated circuit apparatus 2 and the flexibility of the operation of the integrated circuit apparatus 2 can be obtained, and the possibility that the port circuit 6, 15 or 11 is erroneously operated in a high speed operation can be reduced. Therefore, the configuration of the integrated circuit apparatus according to the first modification of the second embodiment is the best mode in case of the two Vcc terminals 3 arranged on two sides of the integrated circuit apparatus 2.

Next, a second modification of the second embodiment is described.

Figure 9:
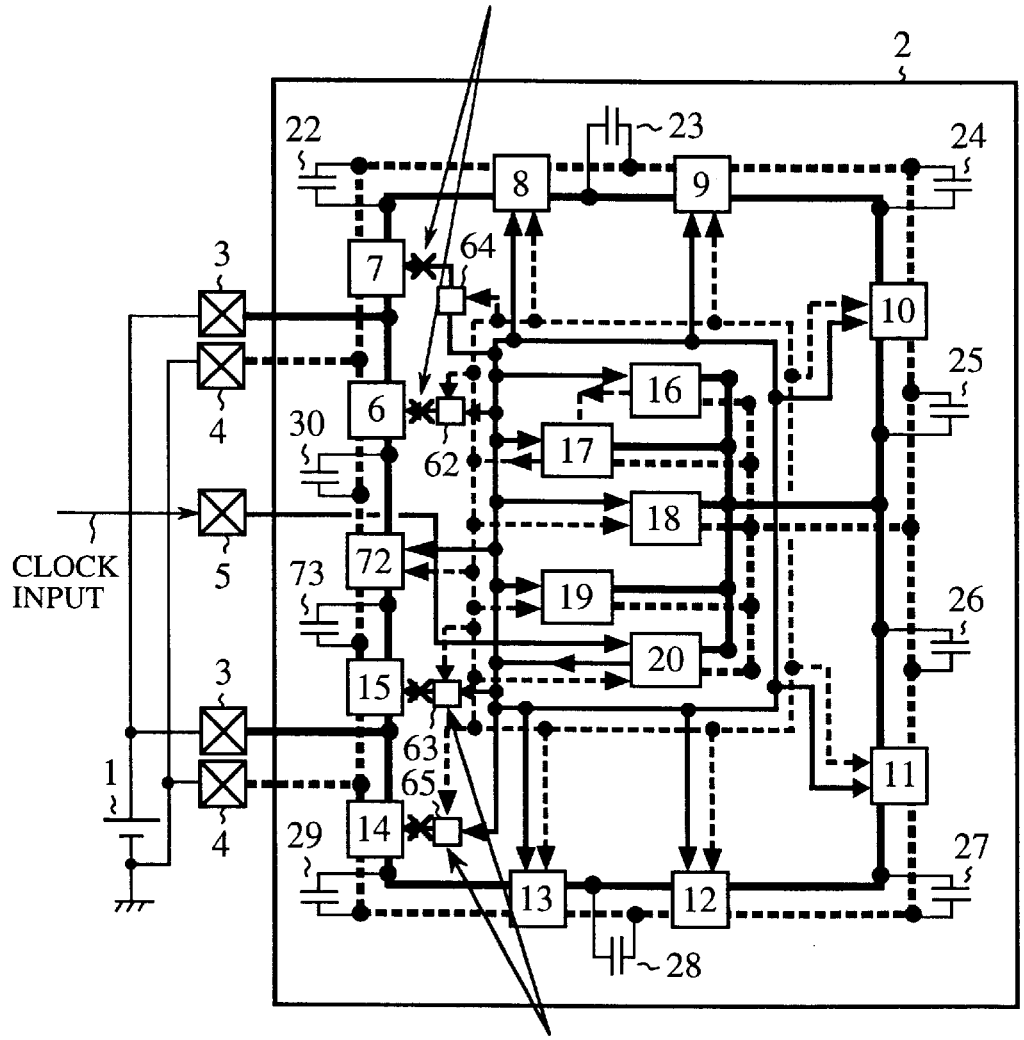
FIG. 9 is a diagram showing the configuration of an integrated circuit apparatus according to a second modification of the second embodiment of the present invention.
Figure 10:
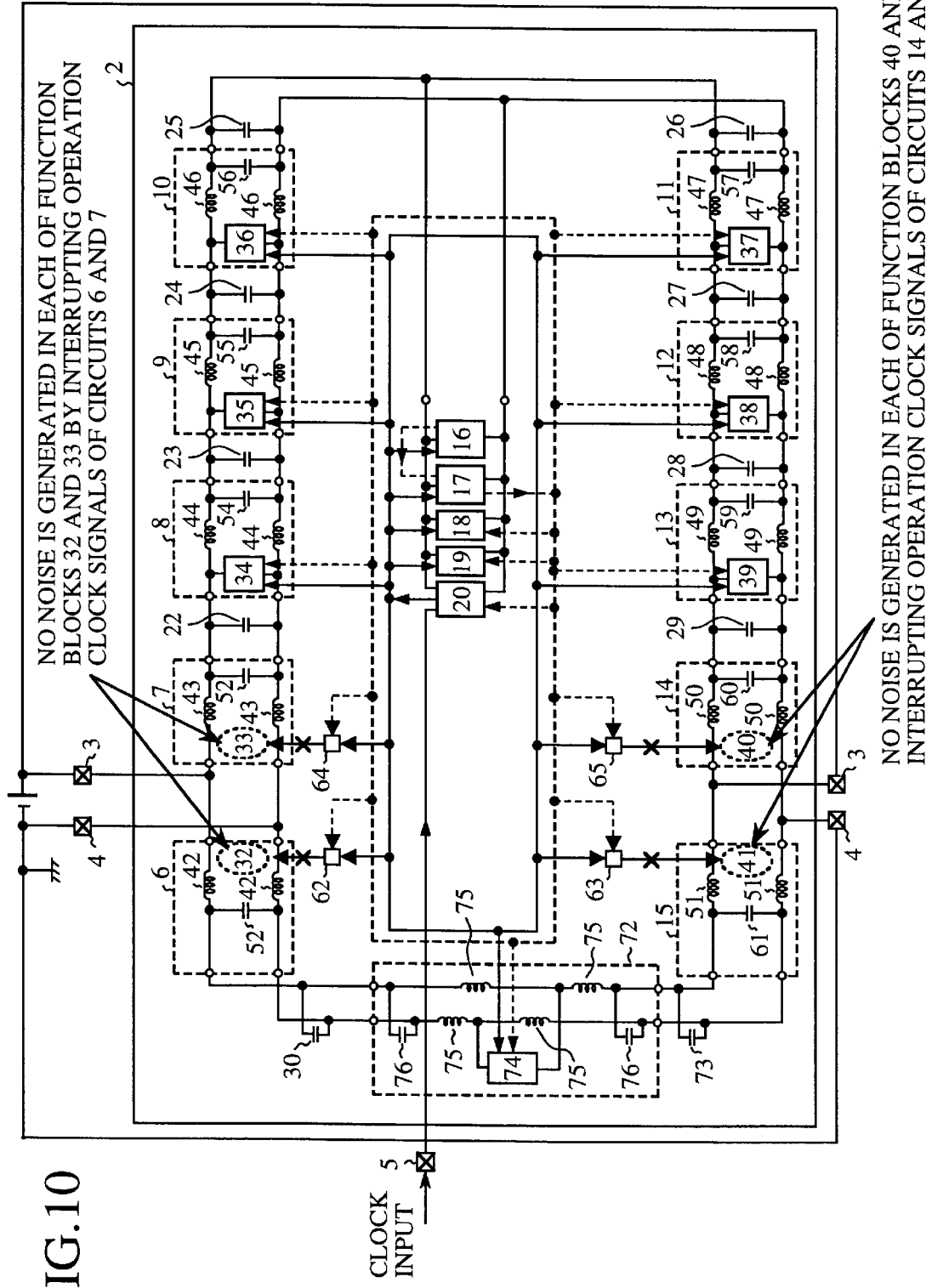
FIG. 10 shows an equivalent circuit of the integrated circuit apparatus shown in FIG. 9.

FIG. 9 is a diagram showing the configuration of an integrated circuit apparatus according to a second modification of the second embodiment of the present invention, and FIG. 10 shows an equivalent circuit of the integrated circuit apparatus shown in FIG. 9. As shown in FIG. 9 and FIG. 10, two Vcc terminals 3 are prepared, one Vcc terminal 3 is connected with the port circuits 6 and 7 through power supply lines, and another Vcc terminal 3 is connected with the port circuits 14 and 15 through power supply lines. Also, a reference numeral 72 indicates a port circuit arranged between the port circuits 6 and 15, a reference numeral 73 indicates a bypass capacitor connecting the power supply line and the GND supply line between the port circuits 15 and 72, and a reference numeral 30 indicates a bypass capacitor connecting the power supply line and the GND supply line between the port circuits 6 and 72. The capacitors 30 and 73 respectively have the same function as those of the capacitors 21 to 29. A reference numeral 74 indicates a function block of the port circuit 72, a reference numeral 75 indicates an equivalent inductance parasitically existing in the port circuit 72, and a reference numeral 76 indicates an equivalent capacitance parasitically existing in the port circuit 72. Also, the reference numeral 64 indicates a clock interrupting circuit (the operation stopping means) arranged along the operation clock signal supply line connected with the port circuit 7 to interrupt an operation clock signal to be sent to the port circuit 7, and a reference numeral 65 indicates a clock interrupting circuit (the operation stopping means) arranged along the operation clock signal supply line connected with the port circuit 14 to interrupt an operation clock signal to be sent to the port circuit 14. The clock interrupting circuits 64 and 65 respectively have the same function as those of the clock interrupting circuits 62 and 63.

Also, no circuit element is arranged between the port circuits 6 and 7, and no circuit element is arranged between the port circuits 14 and 15. Therefore, each of the port circuits 7 and 15 is a most-adjacent-to-electric-power-supply-terminal circuit, the port circuit 6 is an adjacent-to-electric-power-supply-terminal circuit which is adjacent to the Vcc terminal 3 through a power supply line and is connected with the port circuit 7 through a power supply line, and the port circuit 14 is an adjacent-to-electric-power-supply-terminal circuit which is adjacent to the Vcc terminal 3 through a power supply line and is connected with the port circuit 15 through a power supply line. The same constituent elements as those shown in FIG. 5 or FIG. 6 are indicated by the same reference numerals as those indicating the constituent elements in FIG. 5 or FIG. 6, and the description of the same constituent elements as those shown in FIG. 5 or FIG. 6 is omitted.

In the above configuration, because circuit elements such as transistor are arranged in all the left-side port circuits 6, 7, 14, 15 and 72, one or more circuit elements such as transistor, which are originally arranged in the function blocks 32, 33, 40 and 41 of the port circuits 6, 7, 14 and 15, are removed from the function blocks 32, 33, 40 and 41 and are additionally arranged in the function block 74 of the port circuit 72 to move functions of the circuit elements originally given to the port circuits 6, 7, 14 and 15 to the port circuit 72. Therefore, the function blocks 32, 33, 40 and 41 of the port circuits 6, 7, 14 and 15 respectively have only a circuit element such as transistor to have a low processing capability as compared with that of the port circuit 72. Accordingly, the noise reducing characteristic of the integrated circuit apparatus 2 can be obtained, the ease of use of the integrated circuit apparatus 2 and the flexibility of the operation of the integrated circuit apparatus 2 can be maintained, and an erroneous operation of the integrated circuit apparatus 2 in a high speed operation can be avoided.

Also, as shown in FIG. 10, in cases where the control circuit 16 does not require the use of a group of the port circuits 6, 7, 14 and 15, the operations of the port circuits 6, 7, 14 and 15 are stopped by the function of the clock interrupting circuits 62, 63, 64 and 65, and the port circuits 8, 9, 10, 11L, 12, 13 and 72, the internal circuits 16 to 19 and the clock generator 20 are set to be under operation. In this case, one or more LC filters exist between the Vcc terminal 3 and each of the circuits set to the under-operation state. For example, in case of the port circuit 8, the capacitor 22 connecting the power supply line and the GND supply line and the group of the equivalent inductance 44 and the equivalent capacitance 54 parasitically existing in the power supply line and the GND supply line of the port circuit 8 function as an LC filter in an area between the Vcc terminal 3 and the port circuit 8.

In the second modification (FIG. 9 and FIG. 10) of the second embodiment, the plurality of Vcc terminals 3 are connected with the left-side port circuits 6, 7, 14 and 15. However, it is applicable that the plurality of Vcc terminals 3 be connected with port circuits of another side (upper, left or lower side). Also, it is applicable that the plurality of Vcc terminals 3 be connected with port circuits of one side and one or more Vcc terminals 3 be connected with port circuits of another side. In this case, the operation stop means represented by a clock interrupting circuit is arranged along the operation clock signal supply line connected with each most-adjacent-to-electric-power-supply-terminal circuit to stop the operation of the most-adjacent-to-electric-power-supply-terminal circuit in case of non-use, and the operation stop means is arranged along the operation clock signal supply line connected with each adjacent-to-electric-power-supply-terminal circuit, which is adjacent to the Vcc terminal 3 through a power supply line (in which only resistance, inductance and capacitance parasitically exist) and is connected with the most-adjacent-to-electric-power-supply-terminal circuit through a power supply line, to stop the operation of the adjacent-to-electric-power-supply-terminal circuit in case of non-use.

Also, in the second embodiment, the configuration of the clock interrupting circuit 62, 63, 64 and 65 is not limited, and any circuit is useful as the clock interrupting circuit on condition that an operation clock signal to be sent to a circuit, of which the operation is to be stopped in case of non-use, is reliably interrupted. Therefore, the circuit shown in FIG. 17B or FIG. 17C is useful as the clock interrupting circuit.

Accordingly, in the second embodiment, the integrated circuit apparatus 2 has the clock interrupting circuits 62 and 63 in FIG. 5 (or the clock interrupting circuits 62, 63 and 64 in FIG. 7, the clock interrupting circuits 62, 63, 64 and 65 in FIG. 9). The clock interrupting circuits stop the operation of one or more most-adjacent-to-electric-power-supply-terminal circuits (that is, the port circuit 6 in FIG. 5, the port circuits 6 and 11 in FIG. 7, and the port circuits 7 and 15 in FIG. 9) respectively connected with the Vcc terminal 3 through the power supply line, through which the most-adjacent-to-electric-power-supply-terminal circuit is electrically most-adjacent to the Vcc terminal 3, in case of non-use of the most-adjacent-to-electric-power-supply-terminal circuits and to stop the operations of all adjacent-to-electric-power-supply-terminal circuits (that is, the port circuit 15 in FIG. 5 and FIG. 7, and the port circuits 6 and 14 in FIG. 9), which each are adjacent to the Vcc terminal 3 through a power supply line and are connected with one most-adjacent-to-electric-power-supply-terminal circuit through a power supply line, in case of non-use of the adjacent-to-electric-power-supply-terminal circuits on condition that the power supply line between the Vcc terminal 3 and the group of the internal circuits 16 to 19 is arranged so as to supply the electric power to the group of the internal circuits 16 to 19 through the equivalent resistance, the equivalent inductance and the equivalent capacitances parasitically existing in the power supply line, the port circuits 6 to 15 (or the port circuits 6 to 15 and 72 in FIG. 9) and the capacitors 21 to 30. Therefore, the integrated circuit apparatus 2, in which the noise reducing characteristic is considerably improved, can be obtained.

Here, because the port circuits 6 to 15 (or the port circuits 6 to 15 and 72 in FIG. 9) are arranged in the integrated circuit apparatus 2 so as to set the physical distance between each terminal pad of the port circuits 6 to 15 and the corresponding pin to be as short as possible, the port circuits 6 to 15 are used as the constituent elements of the LC filter arranged between the Vcc terminal 3 and the internal circuits 16 to 19. Therefore, the electric power supplied to the group of the internal circuits 16 to 19 passes through the port circuits 6 to 15 and the capacitors 21 to 30 (or the capacitors 22 to 30 and 73 in FIG. 9). However, the second embodiment is not limited to the LC filter composed of the port circuits 6 to 15. For example, in cases where the peripheral circuit 19 (or the other internal circuit) is connected with the Vcc terminal 3 through the power supply line through which the peripheral circuit 19 is electrically most-adjacent to the Vcc terminal 3, it is applicable that the peripheral circuit 19 be used as the constituent elements of the LC filter arranged between the Vcc terminal 3 and the internal circuits 16 to 19.

Also, in cases where the internal circuits 16 to 19 and the clock generator 20 are, for example, replaced with the memory 18 and a control circuit having a simplified configuration, the integrated circuit apparatus 2 of the second embodiment can be applied for a memory. Also, in cases where the peripheral circuit 19 is replaced with a servo control circuit or a custom logic circuit, the integrated circuit apparatus of the second embodiment can be applied for IC for specific use or ASIC. Also, though a microcomputer represents the integrated circuit apparatus 2, all types of semiconductor IC can represent the integrated circuit apparatus 2.

Also, in the second embodiment, though the supply of the operation clock signal to a circuit is interrupted to stop the operation of the circuit., the second embodiment is not limited to this example. For example, it is applicable that the supply of the electric power to a circuit be interrupted to stop the operation of the circuit.

EMBODIMENT 3

In the second embodiment, all adjacent-to-electric-power-supply-terminal circuits (represented by the port circuit 15), which are adjacent to the Vcc terminal 3 through power supply lines (in which only resistance, inductance and capacitance parasitically exist) and is connected with the most-adjacent-to-electric-power-supply-terminal circuit (that is, the port circuit 6) through power supply lines, is stopped with the most-adjacent-to-electric-power-supply-terminal circuit in case of non-use of the adjacent-to-electric-power-supply-terminal circuits and non-use of the most-adjacent-to-electric-power-supply-terminal circuit. However, in a third embodiment, operations of all specific circuits (the port circuits 7, 14 and 15), which are arranged along one or more power supply lines extending from the most-adjacent-to-electric-power-supply-terminal circuit (that is, the port circuit 6) to one or more circuits (that is, the port circuits 8 and 13) from which noise is not output to the Vcc terminal 3 and to which external noise received from the Vcc terminal 3 is not input, are stopped with the most-adjacent-to-electric-power-supply-terminal circuit by the operation stopping means in case of non-use of the specific circuits and non-use of the most-adjacent-to-electric-power-supply-terminal circuit.

Figure 11:
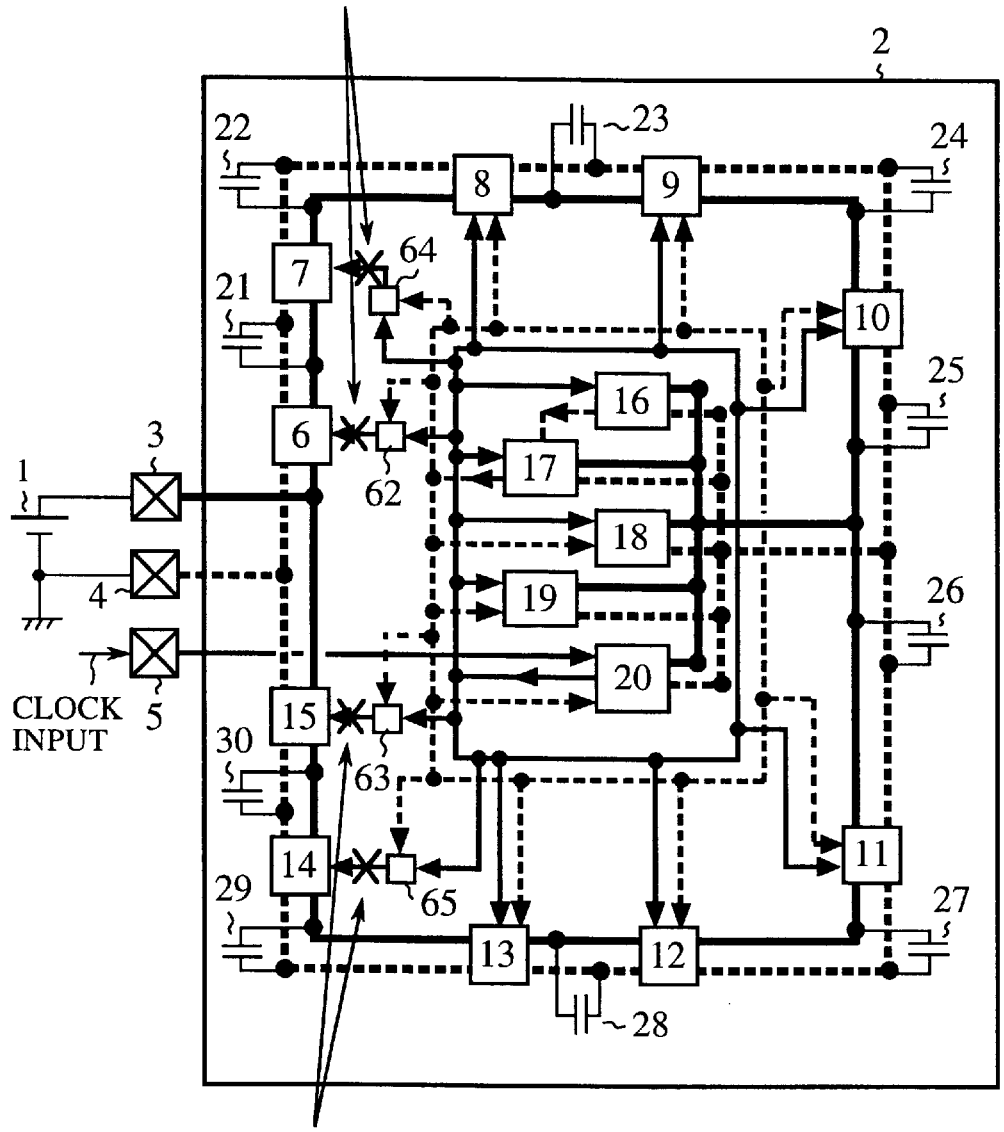
FIG. 11 is a diagram showing the configuration of an integrated circuit apparatus according to a third embodiment of the present invention.
Figure 12:
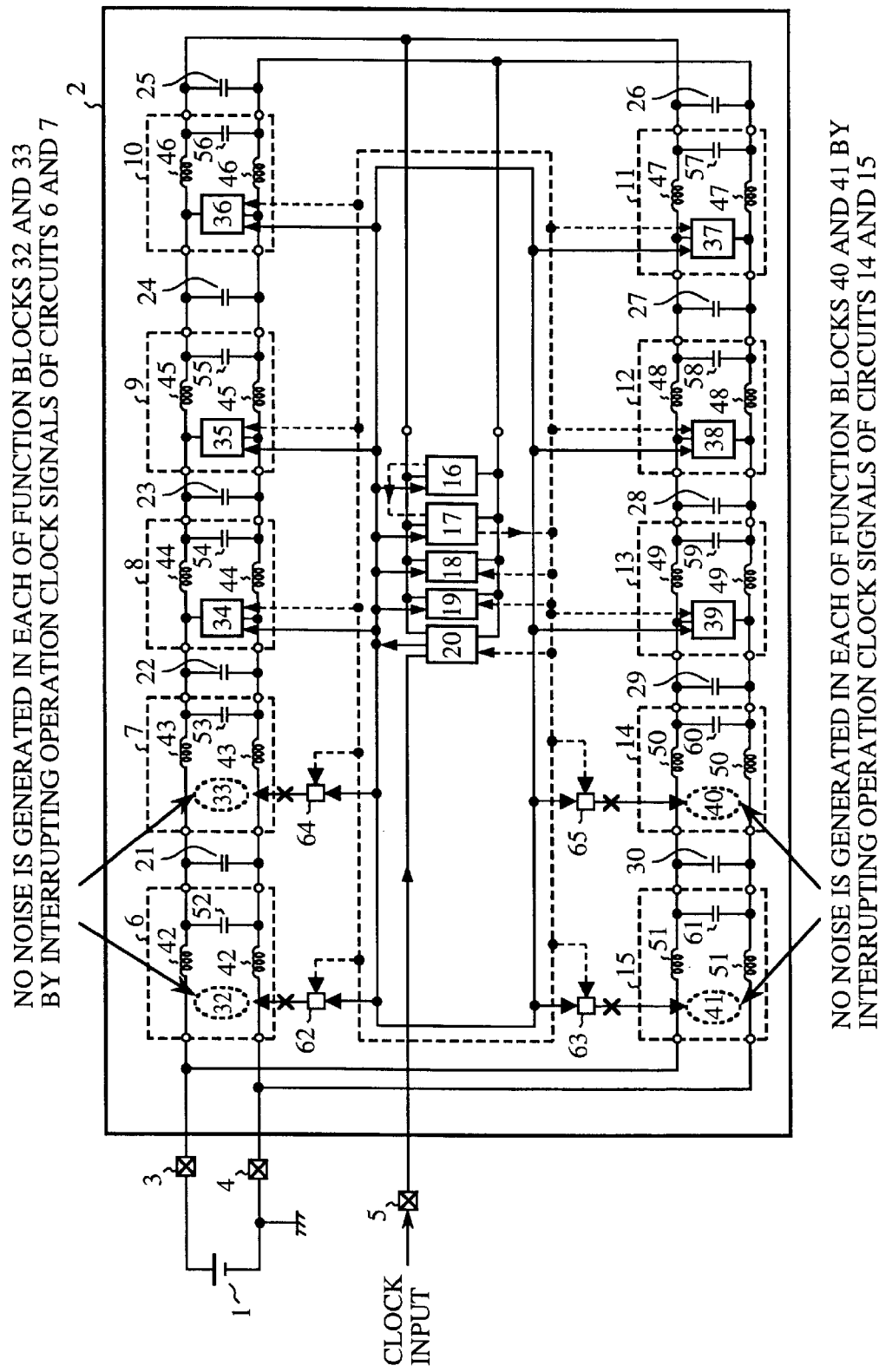
FIG. 12 shows an equivalent circuit of the integrated circuit apparatus shown in FIG. 11.

FIG. 11 is a diagram showing the configuration of an integrated circuit apparatus according to a third embodiment of the present invention, and FIG. 12 shows an equivalent circuit of the integrated circuit apparatus shown in FIG. 11 (in case of the operation stop of the left-side port circuits 6, 7, 14 and 15). In FIG. 11 and FIG. 12, reference numerals 64 and 65 indicate clock interrupting circuits (operation stopping means), and the clock interrupting circuits 64 and 65 respectively have the same function as those of the clock interrupting circuits 62 and 63. The clock interrupting circuit 64 is arranged along an operation clock signal supply line connected with the port circuit 7 to interrupt an operation clock signal to be sent to the port circuit 7, and the clock interrupting circuit 65 is arranged along an operation clock signal supply line connected with the port circuit 14 to interrupt an operation clock signal to be sent to the port circuit 14. Therefore, in cases where the control circuit 16 does not require the use of the port circuits 6 and 7, the operations of the port circuits 6 and 7 are stopped by the operation of the clock interrupting circuits 62 and 64. Also, in cases where the control circuit 16 does not require the use of the port circuits 14 and 15, the operations of the port circuits 14 and 15 are stopped by the operation of the clock interrupting circuits 63 and 65. Also, an LC filter is produced from the capacitors 21 and 30 and a group of equivalent inductances 42, 43, 50 and 51 and equivalent capacitances 52, 53, 60 and 61 parasitically existing in the power supply line and the GND supply line of the port circuits 6, 7, 14 and 15 in an area between the Vcc terminal 3 and the group of port circuits 7 and 14. The same constituent elements as those shown in FIG. 5 or FIG. 6 are indicated by the same reference numerals as those indicating the constituent elements in FIG. 5 or FIG. 6, and the description of the same constituent elements as those shown in FIG. 5 or FIG. 6 is omitted.

In the above configuration, the operations of the port circuits 7 and 14 are additionally stopped by the operation of the clock interrupting circuits 64 and 65 as compared with in the second embodiment because a practical use for the port circuits 6 to 15 and the capacitors 21 to 30 is considered. More precisely, because each port circuit is arranged to set the physical distance between each terminal pad of the port circuit and the corresponding pin to be as short as possible and because no pin is arranged in a group of corner areas of the substrate, though the capacitances of the capacitors 22 and 29 placed in the corner areas can be set to sufficient values, the capacitances of the capacitors 21 and 30 are insufficient because of the existence of the Vcc terminal 3 as compared with those of the capacitors 22 and 29 (refer to the description in the prior art). Therefore, there is a possibility that noise generated in the function blocks 33 and 40 of the port circuits 7 and 14 is not sufficiently attenuated in the periphery of the capacitors 21 and 30 and is output from the Vcc terminal 3 to the outside. Also, there is a possibility that external noise input from the Vcc terminal 3 is not sufficiently attenuated in the peripheries of the capacitors 21 and 30 before the external noise reaches the function blocks 33 and 40 of the port circuits 7 and 14. For example, with respect to the port circuit 7, in cases where the capacitance of the LC filter produced from the capacitor 21 and the group of equivalent inductance 43 and equivalent capacitance 53 parasitically existing in the power supply line and the GND supply line of the port circuit 7 is insufficient, a sufficient noise removing effect cannot be obtained from the LC filter. Therefore, there is a possibility that a weak erroneous operation resistance of the port circuits 7 and 14 to noise determines the whole erroneous operation resistance of the integrated circuit apparatus 2.

Therefore, operations of all specific circuits (that is, the port circuits 7, 14 and 15), which are arranged along one or more power supply lines extending from the most-adjacent-to-electric-power-supply-terminal circuit (that is, the port circuit 6) to a group of circuits(that is, the port circuits 8 and 13) from which noise is not output to the Vcc terminal 3 and to which external noise received from the Vcc terminal 3 is not input, are stopped with the operation of the most-adjacent-to-electric-power-supply-terminal circuit in case of non-use of the specific circuits and non-use of the most-adjacent-to-electric-power-supply-terminal circuit.

In the third embodiment, the capacitances of the capacitors 22 and 29 placed in the corner areas of the integrated circuit apparatus 2 are set to sufficient values because no pin of the substrate is arranged in the corner areas. Therefore, even though noise is generated in the port circuit 8 or 13 or even though external noise is input from the Vcc terminal 3, because an LC filter is produced from the capacitors 22 and 29 and the group of equivalent inductances 42, 43, 50 and 51 and equivalent capacitances 52, 53, 60 and 61 parasitically existing in the power supply line and the GND supply line of the port circuits 6, 7, 14 and 15, the noise and the external noise can be sufficiently attenuated by the function of the LC filter.

Therefore, because the operations of the port circuits 7, 14 and 15 connected with, power supply lines extending from the port circuit 6 to the port circuits 8 and 13 are stopped with the operation of the port circuit 6 in case of non-use of the port circuits 6, 7, 14 and 15 by the function of the clock interrupting circuits 62 to 65, the strength of the noise can be sufficiently reduced before the noise reaches the internal circuits 16 to 19, the upper-side port circuits 83 and 9, the right-side port circuit 10 and 11 and the lower-side port circuits 12 and 13.

However, though the occurrence number of noises inevitably generated in the integrated circuit apparatus 2 can be reduced by increasing the number of circuits, of which the operations are stopped in case of non-use, as compared with in the first and second embodiments, the ease of use of the integrated circuit apparatus 2 and the flexibility of the operation of the integrated circuit apparatus 2 deteriorate. Therefore, a data input/output operation is mainly performed in the upper-side port circuits 8 and 9, the right-side port circuit 10 and 11 and the lower-side port circuits 12 and 13. In this case, a use frequency of the port circuits 6, 7, 14 and 15 are lowered, and the ease of use of the integrated circuit apparatus 2 and the flexibility of the operation of the integrated circuit apparatus 2 can be maintained. Also, it is applicable that a circuit frequently used be not arranged as one of the left-side port circuits 6, 7, 14 and 15.

Next, the clock interrupting circuits 62 to 65 used in the integrated circuit apparatus 2 according to the third embodiment is described. It is preferred that each of the clock interrupting circuits 62 to 65 has the same configuration as that shown in FIG. 17B or FIG. 17C. However, in cases where it is desired to reduce the number of circuit elements used for the clock interrupting circuits 62 to 65 for the purpose of the simplification of the integrated circuit apparatus 2, it is preferred that a clock interrupting circuit shown in FIG. 17D is used as the clock interrupting circuits 62 to 65.

In cases where the clock interrupting circuit shown in FIG. 17D is used as the clock interrupting circuits 62 to 65, phases of four pre-decode signals to be input to the port circuits 6, 7, 14 and 15 are inverted and input to an OR circuit. Therefore, when at least one of the pre-decode signals is "active" ("L") because one of the port circuits 6, 7, 14 and 15 are used by the control circuit 16, an operation clock signal, of which a phase is opposite to that of an operation clock signal supplied from the clock generator 20 and is amplified, is output from an NAND circuit and is supplied to the port circuits 6, 7, 14 and 15 to operate the port circuits 6, 7, 14 and 15. In contrast, when all the four pre-decode signals are "inactive" ("H") because the control circuit 16 does not use the group of the port circuits 6, 7, 14 and 15, an operation clock signal, of which a level is always set to "H" regardless of a level of an operation clock signal supplied from the clock generator 20, is output from the NAND circuit, so that no operation clock signal is substantially supplied to the port circuits 6, 7, 14 and 15 to stop the operations of the port circuits 6, 7, 14 and 15.

Accordingly, in the third embodiment, operations of all the port circuits 7, 14 and 15, which are arranged along one or more power supply lines extending from the port circuit 6 (the most-adjacent-to-electric-power-supply-terminal circuit) to a group of port circuits 8 and 13 from which noise is not output to the Vcc terminal 3 and to which external noise received from the Vcc terminal 3 is not input, are stopped with the operation of the port circuit 6 in case of non-use of the port circuits 6, 7, 14 and 15 on condition that the power supply line between the Vcc terminal 3 and the group of the internal circuits 16 to 19 is arranged so as to supply the electric power to the group of the internal circuits 16 to 19 through the equivalent resistance, the equivalent inductance and the equivalent capacitances parasitically existing in the power supply line, the port circuits 6 to 15 and the capacitors 21 to 30. Therefore, the noise reducing characteristics of the integrated circuit apparatus 2 can be further improved as compared with those in the first and second embodiments.

Also, in cases where a plurality of Vcc terminals 3 are arranged in the integrated circuit apparatus 2, for example, to connect one Vcc terminal 3 with one power supply line between two port circuits selected from the left-side port circuits 6, 7, 14 and 15 and to make another Vcc terminal 3 adjacent to one of the upper-side port circuits 8 and 9 through a power supply .Line, the operations of the left-side port circuits 6, 7, 14 and 15 and the upper-side port circuits 8 and 19 are stopped in case of non-use of the port circuits 6, 7, 8, 9, 14 and 15. Therefore, the same effect as that in the third embodiment can be obtained. Also, the same effect can be obtained for any combination of port circuits connected with a plurality of Vcc terminals 3.

Also, even though one of the port circuits 6, 7, 14 and 15 is replaced with another circuit, the same effect as that in the third embodiment can be obtained. Also, the integrated circuit apparatus 2 of the third embodiment can be applied for a memory. Also, though a microcomputer represents the integrated circuit apparatus 2, all types of semiconductor IC can represent the integrated circuit apparatus 2.

EMBODIMENT 4

In a fourth embodiment, operations of all specific circuits (that is, the port circuits 7, 8, 9, 12, 13, 14 and 15), which are connected with one or more power supply lines extending from circuits (that is, the port circuits 7 and 15) connected with the most-adjacent-to-electric-power-supply-terminal circuit (that is, the port circuit 6) to a group of circuits (that is, the port circuits 9 and 12) from which noise is not output to the Vcc terminal 3 and to which external noise received from the Vcc terminal 3 is not input, are stopped with the operation of the most-adjacent-to-electric-power-supply-terminal circuit by the operation stopping means in case of non-use of the specific circuits and non-use of the most-adjacent-to-electric-power-supply-terminal circuit.

Figure 13:
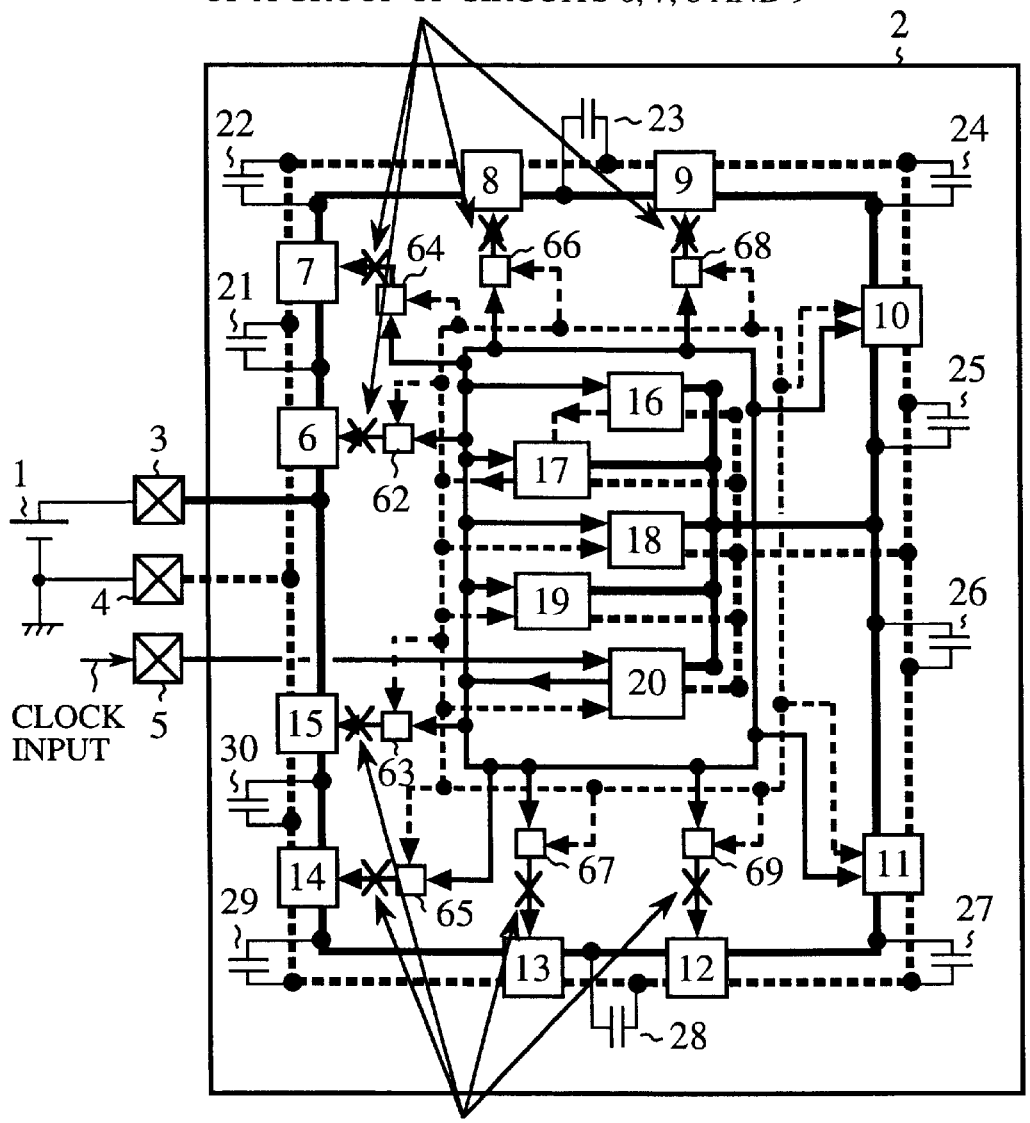
FIG. 13 is a diagram showing the configuration of an integrated circuit apparatus according to a fourth embodiment of the present invention.
Figure 14:
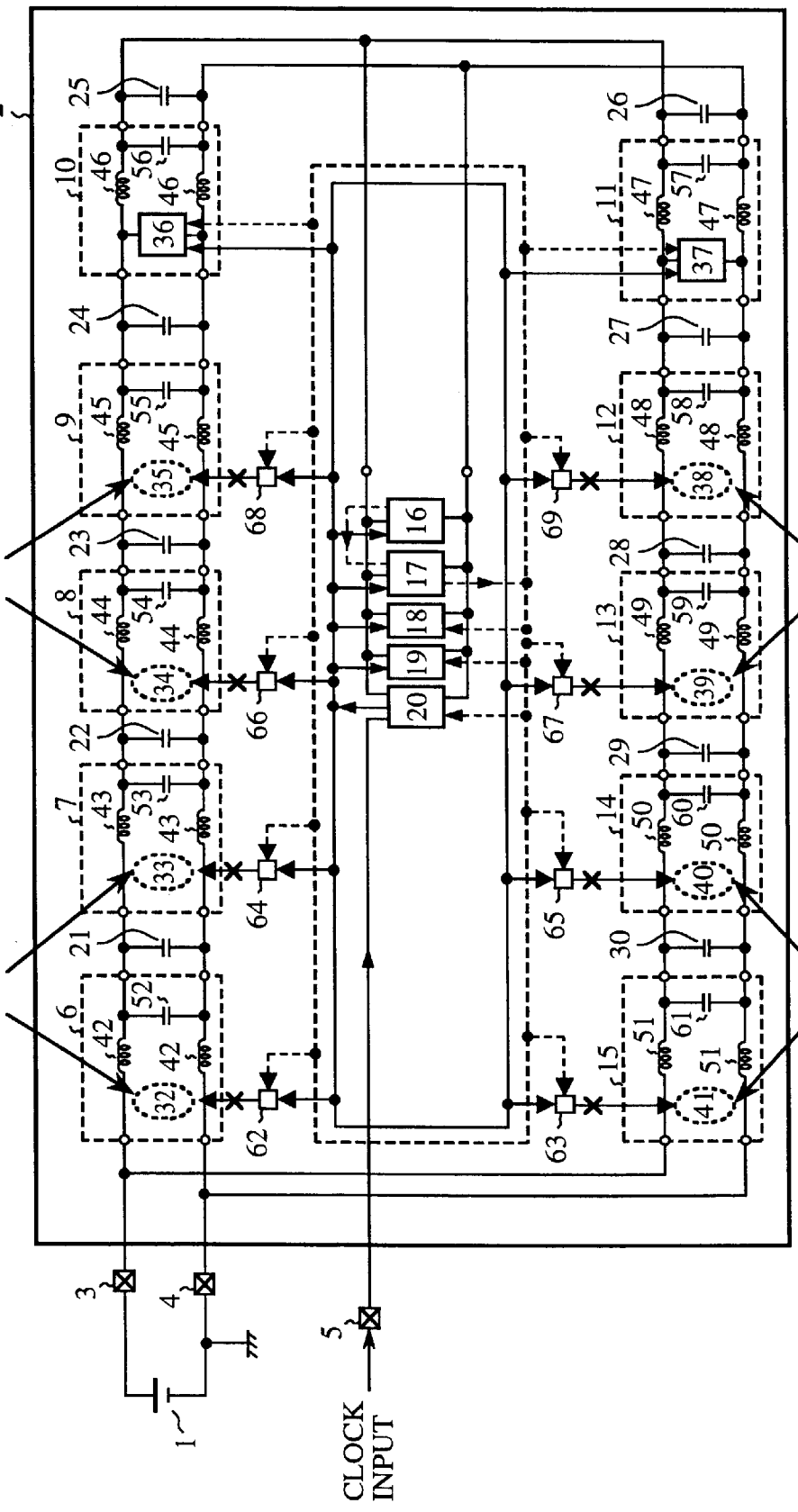
FIG. 14 shows an equivalent circuit of the integrated circuit apparatus shown in FIG. 13.

FIG. 13 is a diagram showing the configuration of an integrated circuit apparatus according to a fourth embodiment of the present invention, and FIG. 14 shows an equivalent circuit of the integrated circuit apparatus shown in FIG. 13 (in case of the operation stop of the port circuits 6, 7, 8, 9,12, 13, 14 and 15). In FIG. 13 and FIG. 14, reference numerals 66 to 69 indicate clock interrupting circuits (operation stopping means), and the clock interrupting circuits 66 to 69 respectively have the same function as those of the clock interrupting circuits 62 and 65. The clock interrupting circuit 66 is arranged along an operation clock signal supply line connected with the port circuit 8 to interrupt an operation clock signal to be sent to the port circuit 8, the clock interrupting circuit 67 is arranged along an operation clock signal supply line connected with the port circuit 13 to interrupt an operation clock signal to be sent to the port circuit 13, the clock interrupting circuit 68 is arranged along an operation clock signal supply line connected with the port circuit 9 to interrupt an operation clock signal to be sent to the port circuit 9, and the clock interrupting circuit 69 is arranged along an operation clock signal supply line connected with the port circuit 12 to interrupt an operation clock signal to be sent to the port circuit 12. Therefore, in cases where the control circuit 16 does not require the use of one of the port circuits 6 to 9 and 12 to 15, the operation of the port circuit is stopped by the operation of the corresponding clock interrupting circuit. Also, an LC filter is produced from the capacitors 21, 22, 23, 28, 29 and 30 and equivalent inductances 42, 43, 44, 45, 48, 49, 50 and 51 and equivalent capacitances 52, 53, 54, 55, 58, 59, 60 and 61 parasitically existing in the power supply line and the GND supply line of the port circuits 6, 7, 8, 9, 12, 13, 14 and 15 in an area from the Vcc terminal 3 to the group of port circuits 10 and 11. The same constituent elements as those shown in FIG. 11 or FIG. 12 are indicated by the same reference numerals as those indicating the constituent elements in FIG. 11 or FIG. 12, and the description of the same constituent elements as those shown in FIG. 11 or FIG. 12 is omitted. In the above configuration, the operations of the port circuits 8, 9, 12 and 13 are additionally stopped by the operation of the clock interrupting circuits 66 and 69 as compared with in the third embodiment. That is, operations of all specific circuits (that is, the port circuits 7, 8, 9, 12, 13, 14 and 15), which are connected with one or more power supply lines extending from circuits (that is, the port circuit 15 and the capacitor 21) connected with the most-adjacent-to-electric-power-supply-terminal circuit (that is, the port circuit 6) to a group of circuits (that is, the port circuits 9 and 12) from which noise is not output to the Vcc terminal 3 and to which external noise received from the Vcc terminal 3 is not input, are stopped with the operation of the most-adjacent-to-electric-power-supply-terminal circuit in case of non-use of the specific circuits and non-use of the most-adjacent-to-electric-power-supply-terminal circuit.

In the fourth embodiment, though the ease of use and the flexibility in the operation of the integrated circuit apparatus 2 deteriorate, the noise reducing characteristic of the integrated circuit apparatus 2 is of a high priority than the ease of use and the flexibility in the operation of the integrated circuit apparatus 2. For example, a group comprising of the left-side port circuits 6, 7, 14 and 15, the upper-side port circuits 8 and 9 and the lower-side port circuits 12 and 13 is not used for the data input/output, but the right-side port circuits 10 and 11 are used for the data input/output. Therefore, the noise reducing characteristic of the integrated circuit apparatus 2 can be further improved. That is, because the operations of the upper-side port circuits 8 and 9 and the lower-side port circuits 12 and 13 are stopped in addition to the operations of the left-side port circuits 6, 7, 14 and 15 in case of non-use of the port circuits 6, 7, 8, 9, 12, 13, 14 and 15, noise inevitably generated in the integrated circuit apparatus 2 can be further prevented. Also, because the LC filter is produced from the capacitors 21, 22, 23, 28, 29 and 30 and a group of equivalent inductances 42, 43, 44, 45, 48, 49, 50 and 51 and equivalent capacitances 52, 53, 54, 55, 58, 59, 60 and 61 parasitically existing in the power supply line and the GND supply line of the port circuits 6, 7, 8, 9, 12, 13, 14 and 15 in an area from the Vcc terminal 3 to the group of port circuits 10 and 11. Therefore, the adverse influence of noise in the area from the Vcc terminal 3 to the group of port circuits 10 and 11 can be sufficiently reduced.

Next, the clock interrupting circuits 62 to 69 used in the integrated circuit apparatus 2 according to the fourth embodiment is described. It is preferred that each of the clock interrupting circuits 62 to 69 has the same configuration as that shown in FIG. 17B or FIG. 17C. However, in cases where it is desired to reduce the number of circuit elements used for the clock interrupting circuits 62 to 69 for the purpose of the simplification of the integrated circuit apparatus 2, it is preferred that a clock interrupting circuit obtained by modifying the clock interrupting circuit shown in FIG. 17D is used as the clock interrupting circuits 62 to 69.

Accordingly, in the fourth embodiment, operations of all the port circuits 7, 8, 9, 12, 13, 14 and 15, which are connected with one or more power supply lines extending from the circuits (the port circuit 15 and the capacitor 21) connected with the port circuit 6 (the most-adjacent-to-electric-power-supply-terminal circuit) to a group of port circuits 9 and 12 from which noise is not output to the Vcc terminal 3 and to which external noise received from the Vcc terminal 3 is not input, are stopped with the operation of the port circuit 6 in case of non-use of the port circuits 6, 7, 8, 9, 12, 13, 14 and 15. This is on condition that the power supply line between the Vcc terminal 3 and the group of the internal circuits 16 to 19 is arranged so as to supply the electric power to the group of the internal circuits 16 to 19 through the equivalent resistance, the equivalent inductance and the equivalent capacitances parasitically existing in the power supply line, the port circuits 6 to 15 and the capacitors 21 to 30. Therefore, the noise reducing characteristics of the integrated circuit apparatus 2 can be further improved as compared with those in the first to third embodiments.

Also, even though one of the port circuits 6, 7, 14 and 15 is replaced with another circuit, the same effect as that in the fourth embodiment can be obtained. Also, the integrated circuit apparatus 2 of the fourth embodiment can be applied for a memory. Also, though a microcomputer represents the integrated circuit apparatus 2, all types of semiconductor IC can represent the integrated circuit apparatus 2.

EMBODIMENT 5

In a fifth embodiment, operations of all circuits (the port circuits 7 to 15), which are arranged along one or more power supply lines extending from the most-adjacent-to-electric-power-supply-terminal circuit (the port circuit 6) to the group of internal circuits 16 to 20, are stopped with the operation of the most-adjacent-to-electric-power-supply-terminal circuit (the port circuit 6) by the operation stopping means in case of non-use of the circuits (the port circuits 7 to 15) and non-use of the most-adjacent-to-electric-power-supply-terminal circuit (the port circuit 6).

Figure 15:
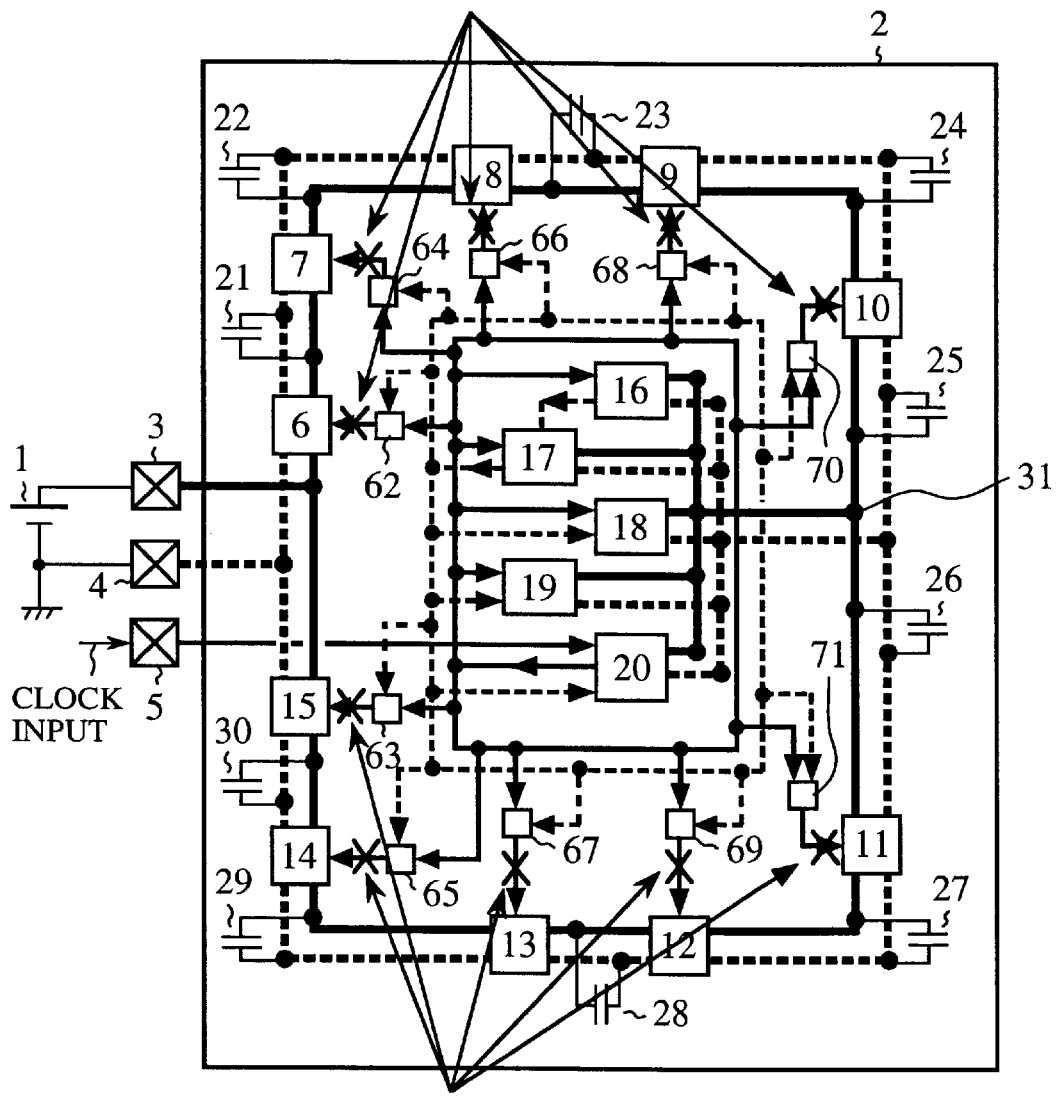
FIG. 15 is a diagram showing the configuration of an integrated circuit apparatus according to a fifth embodiment of the present invention.
Figure 16:
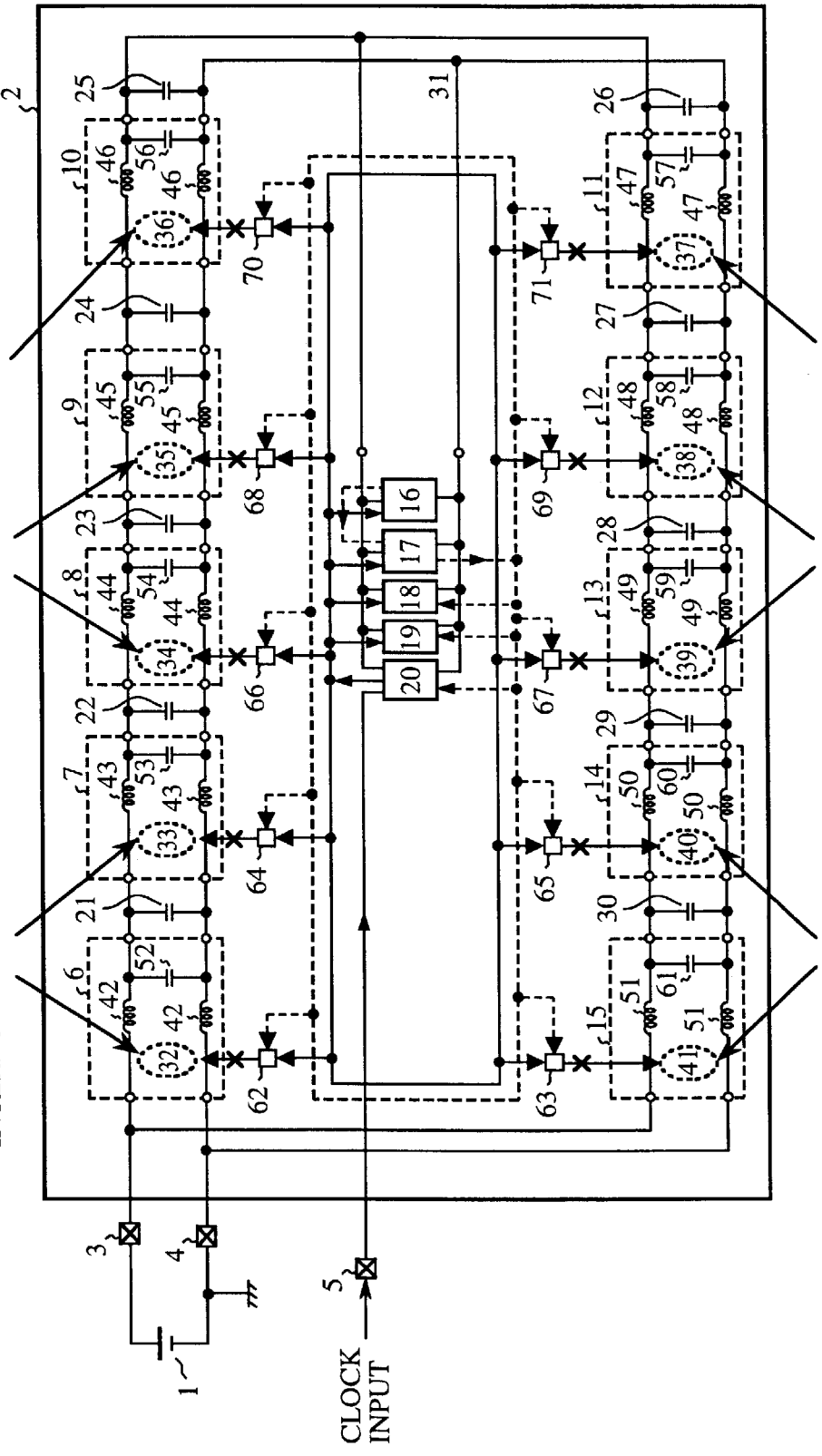
FIG. 16 shows an equivalent circuit of the integrated circuit apparatus shown in FIG. 15.

FIG. 15 is a diagram showing the configuration of an integrated circuit apparatus according to a fifth embodiment of the present invention, and FIG. 16 shows an equivalent circuit of the integrated circuit apparatus shown in FIG. 15 (in case of the operation stop of the all port circuits 6 to 15). In FIG. 15 and FIG. 16, a reference numeral 31 indicates a branch point through which the power supply line passing the port circuits 6 to 15 is directed to the internal circuits 16 to 19, and reference numerals 70 and 71 indicate clock interrupting circuits (operation stopping means), and the clock interrupting circuits 70 and 71 respectively have the same function as those of the clock interrupting circuits 62 and 69. The clock interrupting circuit 70 is arranged along an operation clock signal supply line connected with the port circuit 10 to interrupt an operation clock signal to be sent to the port circuit 10, and the clock interrupting circuit 71 is arranged along an operation clock signal supply line connected with the port circuit 11 to interrupt an operation clock signal to be sent to the port circuit 11. Therefore, in cases where the control circuit 16 does not require the use of one of the port circuits 6 to 15, the operation of the port circuit is stopped by the operation of the corresponding clock interrupting circuit. Also, an LC filter is produced from the capacitors 21 to 30 and a group of equivalent inductances 42 to 51 and equivalent capacitances 52 to 61 parasitically existing in the power supply lines and the GND supply lines of the port circuits 6 to 15 in an area from the Vcc terminal 3 to the branch point 31. The same constituent elements as those shown in FIG. 13 or FIG. 14 are indicated by the same reference numerals as those indicating the constituent elements in FIG. 13 or FIG. 14, and the description of the same constituent elements as those shown in FIG. 13 or FIG. 14 is omitted.

In the above configuration, the operations of the port circuits 10 and 11 are additionally stopped by the operation of the clock interrupting circuits 70 and 71 as compared with in the fourth embodiment. In the fifth embodiment, though the ease of use and the flexibility in the operation of the integrated circuit apparatus 2 deteriorate, an idea that the noise reducing characteristic of the integrated circuit apparatus 2 has a higher priority than the ease of use and the flexibility in the operation of the integrated circuit apparatus 2 is further developed. When a data input/output operation is performed between the integrated circuit apparatus 2 and the outside, at least one port circuit has to be operated for the data input/output operation. However, in cases here the data input/output operation and a data processing operation performed in the integrated circuit apparatus 2 are, for example, alternately repeated on condition that a time required to perform the data processing operation is sufficiently longer than that required to perform the data input/output operation, the integrated circuit apparatus 2 according to the fifth embodiment is useful because the erroneous operation based on noise in the data processing operation has to be prevented. That is, when the data processing operation is performed in the integrated circuit apparatus 2, the operations of all the port circuits 6 to 15 connected with the power supply lines extending from the Vcc terminal 3 to the branch point 31 are stopped because the control circuit 16 does not require the use of the group of the port circuits 6 to 15 in the data processing operation. Therefore noise inevitably generated in one port circuit during its operation can be prevented. Also, because the LC filter is produced from the capacitors 21 to 30 and the group of equivalent inductances 42 to 51 and equivalent capacitances 52 to 61 parasitically existing in the power supply lines and the GND supply lines of the port circuits 6 to 15 in the area from the Vcc terminal 3 to the branch point 31, the adverse influence of noise in the area from the Vcc terminal 3 to the internal circuits 16 to 19 through the port circuits 6 to 15 can be sufficiently reduced.

Next, the clock interrupting circuits 62 to 71 used in the integrated circuit apparatus 2 according to the fifth embodiment is described. It is preferred that each of the clock interrupting circuits 62 to 71 has the same configuration as that shown in FIG. 17B or FIG. 17C. However, in cases where it is desired to reduce the number of circuit elements used for the clock interrupting circuits 62 to 71 for the purpose of the simplification of the integrated circuit apparatus 2, it is preferred that a clock interrupting circuit obtained by modifying the clock interrupting circuit shown in FIG. 17D is used as the clock interrupting circuits 62 to 71. More precisely, phases of ten pre-decode signals to be input to the port circuits 6 to 15 are inverted and input to an OR circuit. Therefore, when at least one of the pre-decode signals is "active" ("L") because one of the port circuits 6 to 15 is used by the control circuit 16, an operation clock signal, of which a phase is opposite to that of an operation clock signal supplied from the clock generator 20 and is amplified, is output from an NAND circuit and is supplied to the port circuits 6 to 15. In contrast, when all the ten pre-decode signals are "inactive" ("H") because the control circuit 16 does not use the group of the port circuits 6 to 15, an operation clock signal, of which a level is always set to "H" regardless of a level of an operation clock signal supplied from the clock generator 20, is output from the NAND circuit. Therefore no operation clock signal is substantially supplied to the group of port circuits 6 to 15 to stop the operations of the port circuits 6 to 15.

Accordingly, in the fifth embodiment, operations of all circuits (the port circuits 7 to 15), which are arranged along one or more power supply lines extending from the port circuit 6 (that is, the most-adjacent-to-electric-power-supply-terminal circuit) to the group of internal circuits 16 to 20, are stopped with the operation of the port circuit 6 by the operation of the clock interrupting circuits 62 to 71 in case of non-use of the port circuits 6 to 15 on condition that the power supply line between the Vcc terminal 3 and the group of the internal circuits 16 to 19 is arranged so as to supply the electric power to the group of the internal circuits 16 to 19 through the equivalent resistance, the equivalent inductance and the equivalent capacitances parasitically existing in the power supply line, the port circuits 6 to 15 and the capacitors 21 to 30. Therefore, the noise reducing characteristics of the integrated circuit apparatus 2 can be further improved as compared with those in the first to fourth embodiments.

Also, even though one of the port circuits 6 to 15 is replaced with another circuit, the same effect as that in the fifth embodiment can be obtained. Also, the integrated circuit apparatus 2 of the fifth embodiment can be applied for a memory. Also, though a microcomputer represents the integrated circuit apparatus 2, all types of semiconductor IC can represent the integrated circuit apparatus 2.

EMBODIMENT 6

In a sixth embodiment, operations of all specific circuits (the port circuits 6 to 15 and the internal circuits 18 and 19) other than circuits (the internal circuits 16, 17 and 20) relating to the production of pre-decode signals are stopped in case of non-use of the specific circuits.

Figure 18:
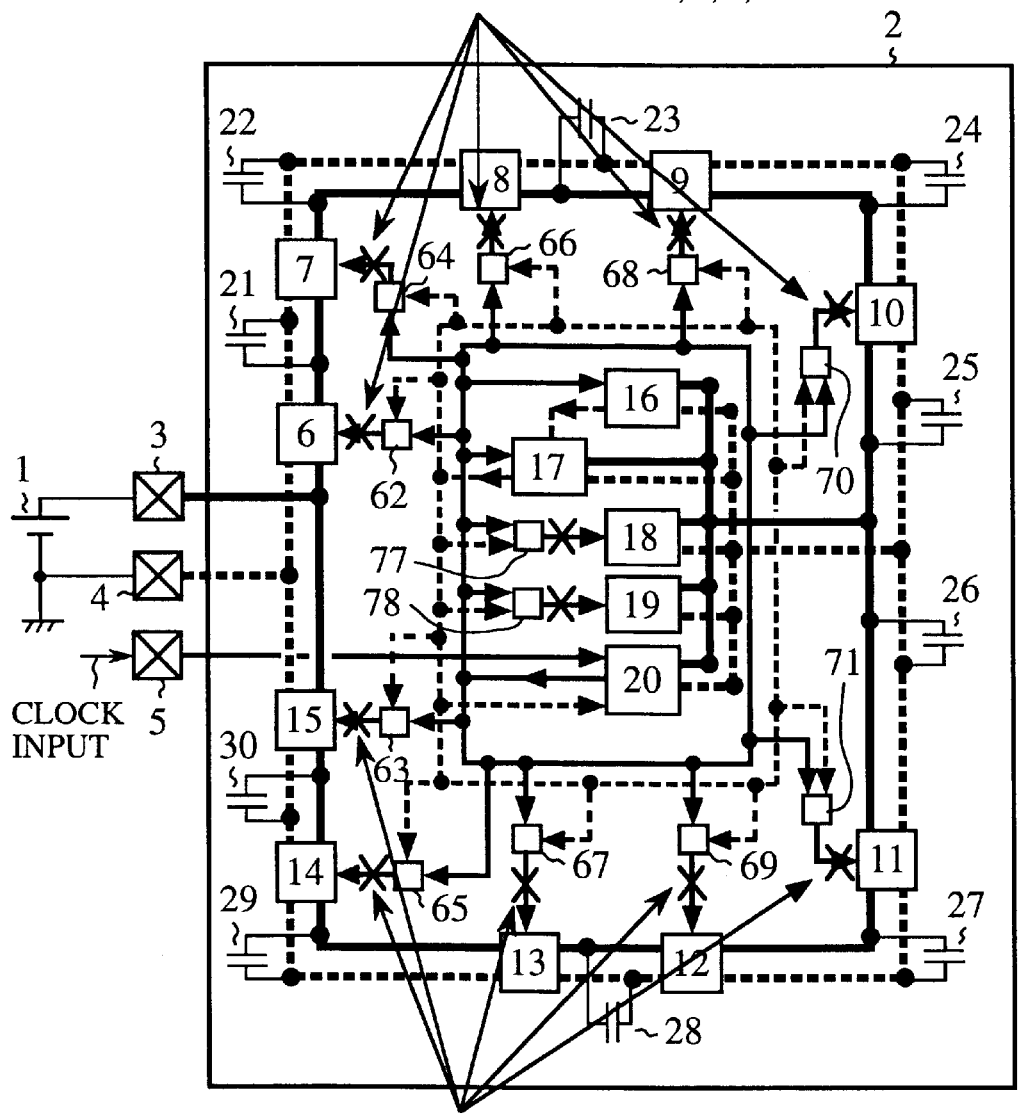
FIG. 18 is a diagram showing the configuration of an integrated circuit apparatus according to a sixth embodiment of the present invention.
Figure 19:
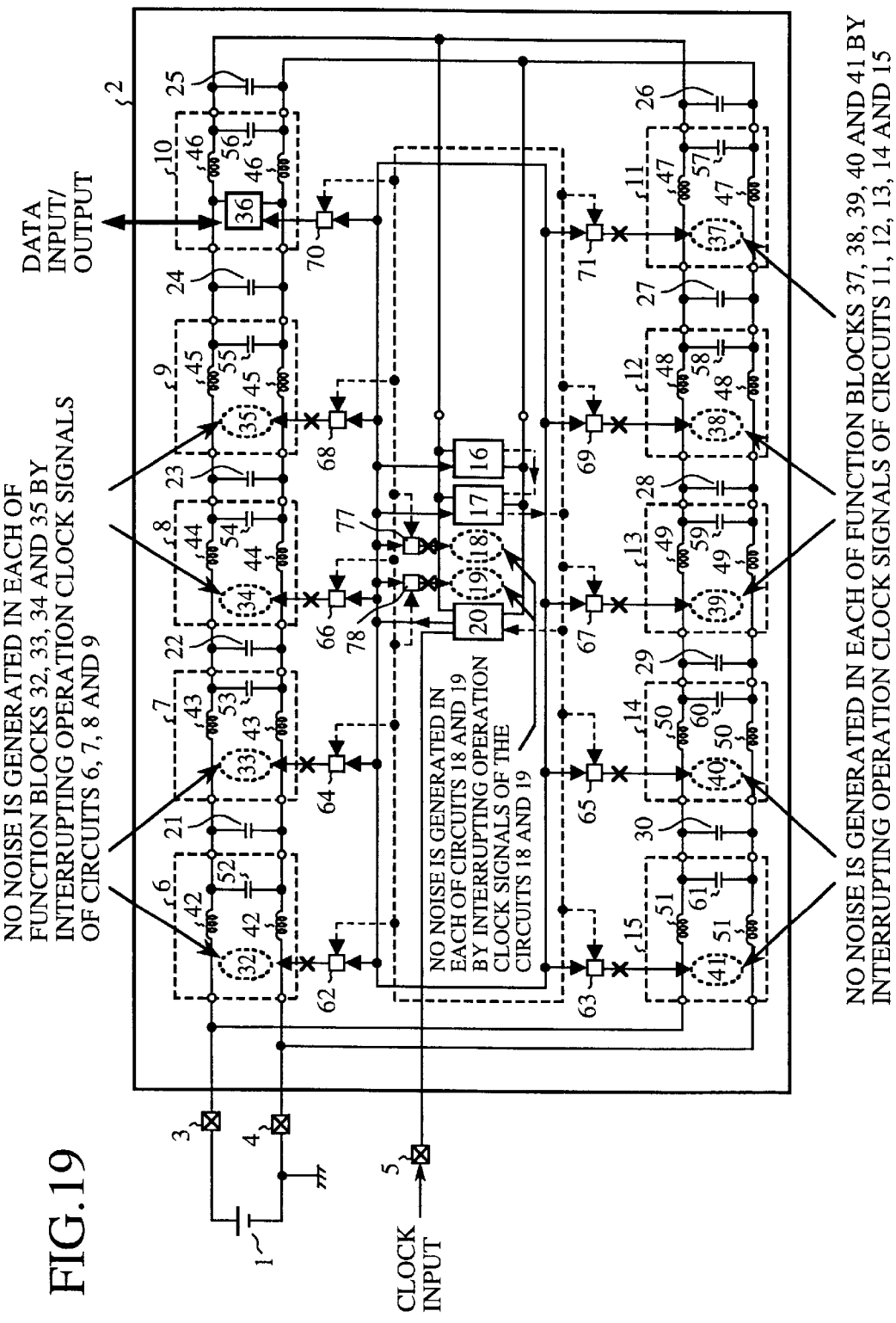
FIG. 19 shows an equivalent circuit of the integrated circuit apparatus shown in FIG. 18.

FIG. 18 is a diagram showing the configuration of an integrated circuit apparatus according to a sixth embodiment of the present invention, and FIG. 19 shows an equivalent circuit of the integrated circuit apparatus shown in FIG. 18 (in case of the operation stop of the port circuits 6 to 9 and 11 to 15 and the internal circuits 18 and 19 in a data input/output performed in the internal circuit 10). In FIG. 18 and FIG. 19, reference numerals 77 and 78 indicate clock interrupting circuits (operation stopping means), and the clock interrupting circuits 77 and 78 respectively have the same function as those of the clock interrupting circuits 62 and 71. The clock interrupting circuit 77 is arranged along an operation clock signal supply line connected with the memory 18 to interrupt an operation clock signal to be sent to the memory 18, and the clock interrupting circuit 78 is arranged along an operation clock signal supply line connected with the peripheral circuit 19 to interrupt an operation clock signal to be sent to the peripheral circuit 19. Because the control circuit 16 and the pre-decoder 17 relate to the production of the pre-decode signals input to the clock interrupting circuits 62 to 71, 77 and 78, no clock interrupting circuit is arranged for the control circuit 16 or the pre-decoder 17. Also, because the operation of the integrated circuit apparatus 2 is stopped when the operation of the clock generator 20 is stopped, no clock interrupting circuit is arranged for the clock generator 20. The same constituent elements as those shown in FIG. 15 or FIG. 16 are indicated by the same reference numerals as those indicating the constituent elements in FIG. 15 or FIG. 16, and the description of the same constituent elements as those shown in FIG. 15 or FIG. 16 is omitted.

In the above configuration, in cases where the internal circuits 16 to 19 are in the middle of the data processing, the operations of the port circuits 6 to 15 are stopped. In this case, because the operation of the port circuit 6 electrically most-adjacent to the Vcc terminal 3 through the power supply line and the operation of the port circuit 15 adjacent to the Vcc terminal 3 and connected with the port circuit 6 are the main cause of the electric power noise, stopping of the operations of the port circuits 6 and 15 is ensured. Therefore, the integrated circuit apparatus 2 is set to the state shown in FIG. 16, so that the noise reducing effect can be obtained in the same manner as in the fifth embodiment.

In contrast, in cases where a data input/output operation is performed while using one port circuit, the operations of the memory 18 and the peripheral circuit 19 are stopped with the operations of the other port circuits. This function of the integrated circuit apparatus 2 differs from that of the fifth embodiment. More precisely, in cases where a data input/output operation is performed while using the port circuit 10 as an example, an LC filter produced from the capacitor 25 and the group of equivalent inductance 46 and equivalent capacitance 56 parasitically existing in the power supply line and the GND supply line of the port circuit 10 exists in an area from the group of internal circuits 16 to 20 to the port circuit 10. However, because the capacitor 25 is not placed on a corner of the substrate in the same manner as the capacitors 21 and 30 but is placed between the right-side port circuits 10 and 11, a physical space for the capacitor 25 is insufficient. Therefore, a sufficient physical space for arranging the capacitor 25 having the same capacitance as those of the capacitors 24 and 27 placed on the corners of the substrate cannot be usually obtained. Because the capacitance of the capacitor 25 is insufficient, there is a possibility that noise generated in the internal circuits 16 to 19 and the clock generator 20 is not sufficiently attenuated by the function of the LC filter. Therefore, there is a possibility that the port circuit 10 is erroneously operated because of the adverse influence of noise generated in the internal circuits 16 to 19 and the clock generator 20. In this case, assuming that the integrated circuit apparatus 2 additionally has an operation stopping function for the internal circuits 16 to 19, because the occurrence of noise generation in the integrated circuit apparatus 2 is reduced, even though the capacitance of the capacitor 25 is insufficient, a possibility that the port circuit 10 is erroneously operated is reduced.

Therefore, in the sixth embodiment, after an arithmetic calculation is performed in the internal circuits 16 to 19 while stopping the operations of the port circuits 6 to 15 in the same manner as in the fifth embodiment, the operations of the memory 18 and the peripheral circuit 19 are stopped with the operations of the port circuits other than the port circuit 10 (refer to FIG. 19), and the calculation result is output to the outside by using the port circuit 10. Because the operations of the memory 18 and the peripheral circuit 19 are additionally stopped as compared with in the fifth embodiment, the occurrence number of noises in the integrated circuit apparatus 2 is reliably reduced. Also, because the capacitance of the capacitor 25 is fixed regardless of the operations of the memory 18 and the peripheral circuit 19, the possibility that the port circuit 10 is erroneously operated can be reliably reduced in the outputting of the calculation result by additionally stopping the operations of the memory 18 and the peripheral circuit 19.

Accordingly, in the sixth embodiment, operations of the port circuits 6 to 9 and 11 to 15 not used in the data input/output operation and the group of the memory 18 and the peripheral circuit 19 not relating to the production of pre-decode signals are stopped in case of non-use of the circuits by the function of the clock interrupting circuits 62 to 69, 71, 77 and 78 on condition that the power supply line between the Vcc terminal 3 and the group of the internal circuits 16 to 19 is arranged so as to supply the electric power to the group of the internal circuits 16 to 19 through the equivalent resistance, the equivalent inductance and the equivalent capacitances parasitically existing in the power supply line, the port circuits 6 to 15 and the capacitors 21 to 30. Therefore, the noise reducing characteristics of the integrated circuit apparatus 2 can be further improved as compared with those in the first to fifth embodiments.

Also, even though one of the port circuits 6 to 15 is replaced with another circuit, the same effect as that in the sixth embodiment can be obtained. Also, the integrated circuit apparatus 2 of the sixth embodiment can be applied for a memory. Also, though a microcomputer represents the integrated circuit apparatus 2, all types of semiconductor IC can represent the integrated circuit apparatus 2.

EMBODIMENT 7

In a seventh embodiment, the operation of a group of most-adjacent-to-electric-power-supply-terminal circuits (that is, the port circuits 6, 7, 14 and 15), which is composed of the most-adjacent-to-electric-power-supply-terminal circuit (that is, the port circuit 6) and all circuits (that is, the port circuits 7, 14 and 15) to which the same operation clock signal (or the same operation source) as that supplied to the most-adjacent-to-electric-power-supply-terminal circuit is supplied to operate the port circuits 7, 14 and 15 with the most-adjacent-to-electric-power-supply-terminal circuit, is stopped in case of non-use of the group of most-adjacent-to-electric-power-supply-terminal circuits.

Figure 20:
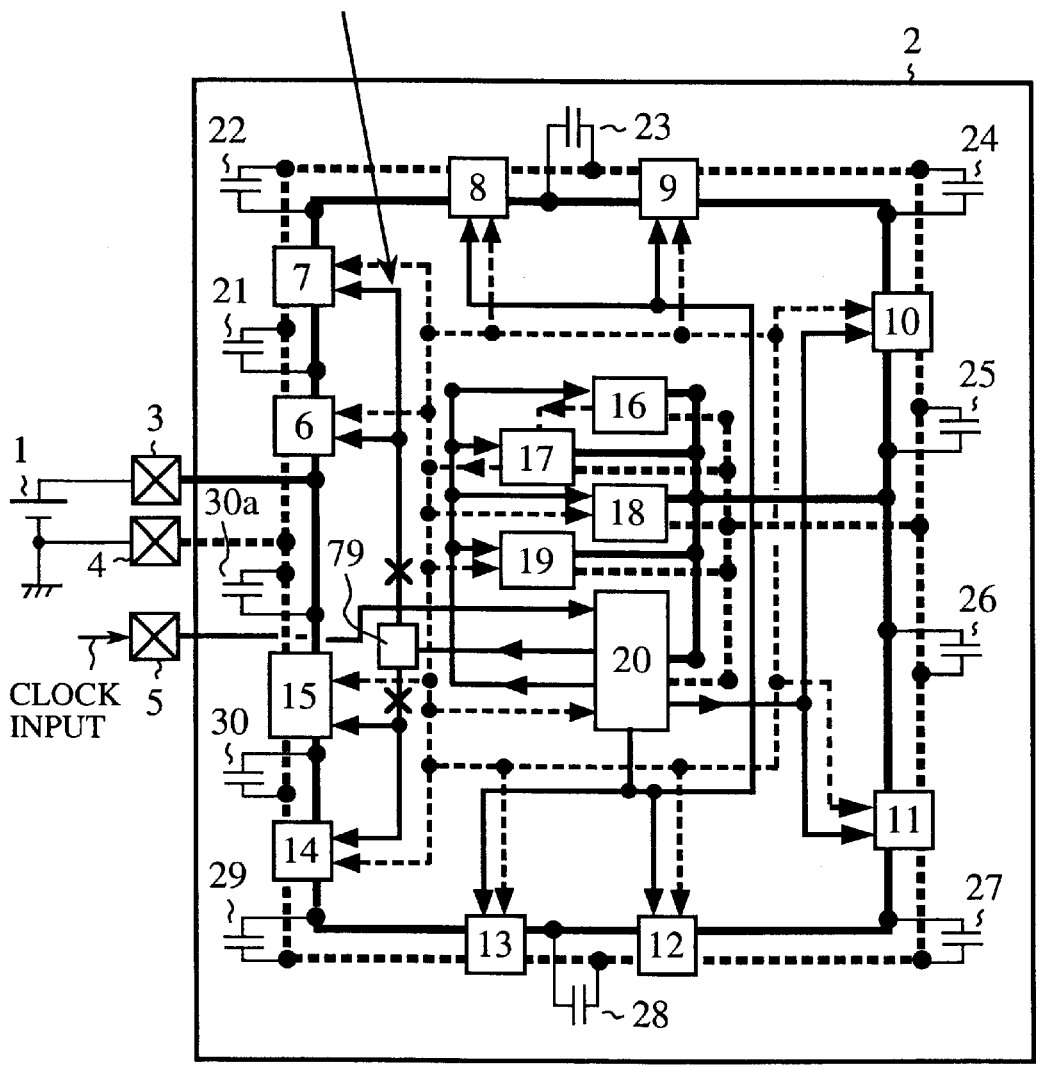
FIG. 20 is a diagram showing the configuration of an integrated circuit apparatus according to a seventh embodiment of the present invention.
Figure 21:
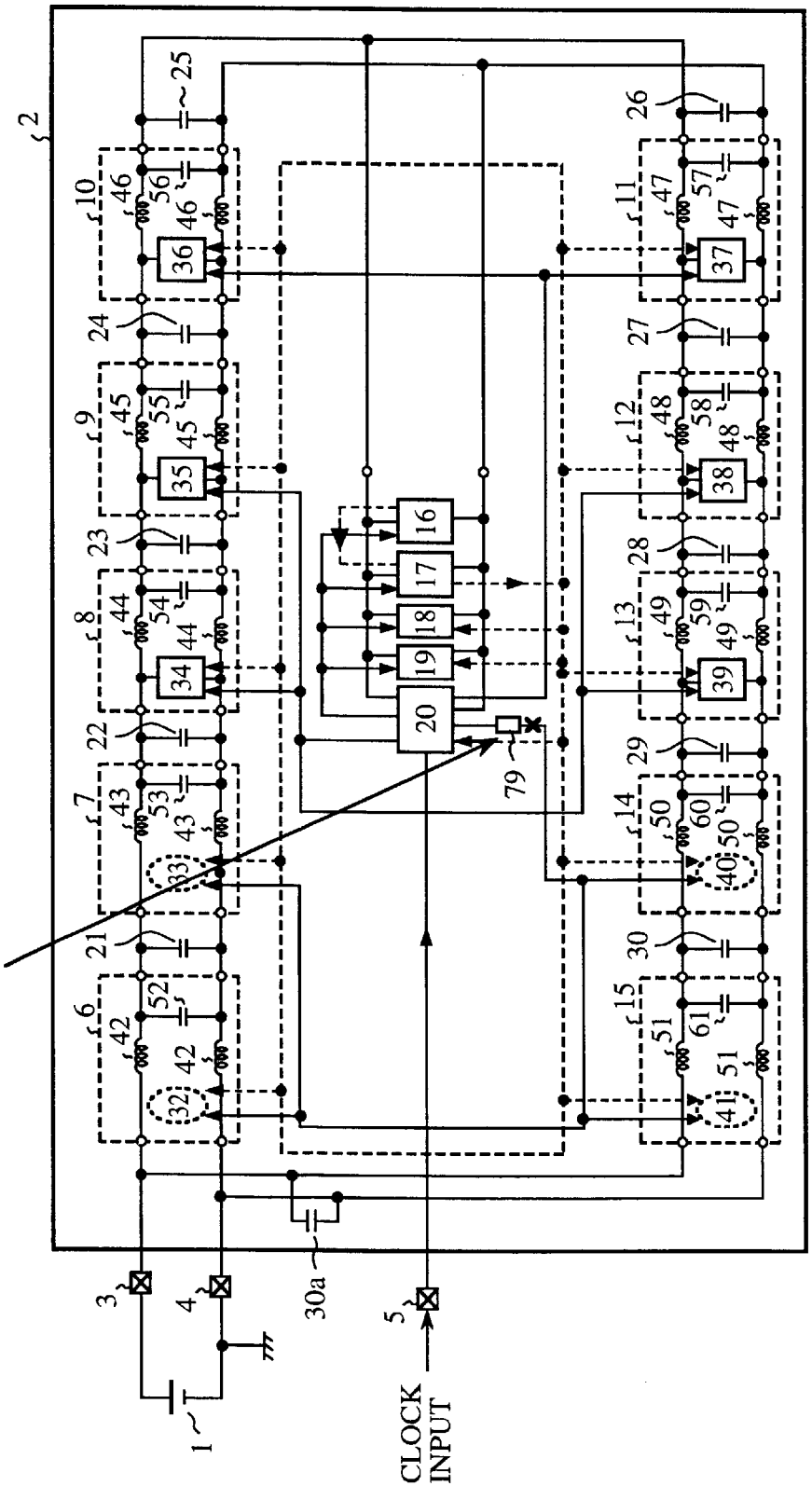
FIG. 21 shows an equivalent: circuit of the integrated circuit apparatus shown in FIG. 20.

FIG. 20 is a diagram showing the configuration of an integrated circuit apparatus according to a seventh embodiment of the present invention, and FIG. 21 shows an equivalent circuit of the integrated circuit apparatus shown in FIG. 20. In FIG. 20 and FIG. 21, a reference numeral 30a indicates a bypass capacitor arranged between the Vcc terminal 3 and the port circuit 15 to obtain an LC filter effect. A reference numeral 79 indicates a clock interrupting circuit (equivalent to an operation stopping means) for interrupting an operation clock signal supplied from the clock generator 20. The operation of a circuit group composed of the port circuit 6 (that is, the most-adjacent-to-electric-power-supply-terminal circuit) and the port circuits 7, 14 and 15, to which the same operation clock signal as that supplied to the port circuit 6 is supplied to operate the port circuits 7, 14 and 15 with the port circuit 6, is stopped by the function of the clock interrupting circuit 79 to stop the operation of the port circuit 6. The same constituent elements as those shown in FIG. 1 or FIG. 2 are indicated by the same reference numerals as those indicating the constituent elements in FIG. 1 or FIG. 2, and the description of the same constituent elements as those shown in FIG. 1 or FIG. 2 is omitted.

Next, an operation of the integrated circuit apparatus according to the seventh embodiment is described.

In the seventh embodiment, because operations of circuits connected with power supply lines are appropriately stopped to reduce noise, the operation stopping of the port circuits 6, 7, 14 and 15 is mainly described.

In cases where the control circuit 16 does not require the use of the port circuit 6, a signal indicating non-use of the port circuit 6 is sent from the control circuit 16 to the clock interrupting circuit 79. The clock interrupting circuit 79 judges according to the signal that the control circuit 16 does not require the use of the port circuit 6, the operation clock signal to be supplied to the port circuits 6, 7, 14 and 15 is interrupted by the clock interrupting circuit 79. Therefore, as shown in FIG. 21, the port circuits 6, 7, 14 and 15 are respectively set to an operation stop state, so that no noise is generated in the group of port circuits 6, 7, 14 and 15. Also, even though external noise is input to any of the port circuits 6, 7, 14 and 15 through the Vcc terminal 3, because each of the port circuits 6, 7, 14 and 15 is not operated, there is no possibility that the port circuit 6, 7, 14 or 15 is erroneously operated.

Also, in cases where capacitances of the capacitors 22 and 29 are respectively sufficiently large, the port circuits 8 and 13 sufficiently receives the LC filter effect based on the capacitors 22 and 29. Therefore, noise generated in any of the port circuits 8 and 13 is attenuated because of the LC filter effect before the noise reaches the Vcc terminal 3, and external noise input through the Vcc terminal 3 is attenuated because of the LC filter effect before the external noise reaches the port circuit 8 or 13. Also, in cases where each of the capacitors 22 to 29 has a capacitance sufficient to reduce noise generated in the integrated circuit apparatus 2 and external noise input through the Vcc terminal 3, the same effect as the LC filter effect can be obtained by the combination of the capacitances of the capacitors 22 to 29 and the group of equivalent inductances and equivalent capacitances parasitically existing in the port circuits 8 to 13 and the internal circuits 16 to 19. Therefore, noise generated in any of the port circuits 8 to 13 and the internal circuits 16 to 19 is attenuated before the noise reaches the Vcc terminal 3, and external noise input through the Vcc terminal 3 is attenuated before the external noise reaches any of the port circuits 8 to 13 and the internal circuits 16 to 19. Accordingly, the noise reducing characteristic of the integrated circuit apparatus shown in FIG. 20 can be considerably improved by adding the clock interrupting circuit 79.

An important point in the integrated circuit apparatus 2 according to the seventh embodiment is that the operation of a group of most-adjacent-to-electric-power-supply-terminal circuits (that is, the port circuits 6, 7, 14 and 15), which is composed of the most-adjacent-to-electric-power-supply-terminal circuit (equivalent to the port circuit 6) and the port circuits 7, 14 and 15 to which the same operation clock signal (or the same operation source such as an electric source) as that supplied to the most-adjacent-to-electric-power-supply-terminal circuit is supplied to operate the port circuits 7, 14 and 15 with the port circuit 6, is stopped in case of non-use of the group of most-adjacent-to-electric-power-supply-terminal circuits by the operation of the operation stopping means (that is, the clock interrupting circuit 79). Therefore, the clock interrupting circuit 79 is arranged along the operation clock signal supply line connected with the port circuits 6, 7, 14 and 15. Therefore, an erroneous operation resistance to external noise, which is input from the outside through the Vcc terminal 3 and cannot be reduced in the prior art according to the noise avoiding method in which operations of all circuits respectively not used in the control circuit 16 are stopped, can be improved.

Next, the concept of the group of most-adjacent-to-electric-power-supply-terminal circuits is described.

The most-adjacent-to-electric-power-supply-terminal circuit and the adjacent-to-electric-power-supply-terminal circuit are defined in the first embodiment. In addition, a group of port circuits, to which the same operation clock signal (or the same operation source such as an electric source) as that supplied to the most-adjacent-to-electric-power-supply-terminal circuit is supplied to operate the group of port circuits with the most-adjacent-to-electric-power-supply-terminal circuit, is considered. In cases where the operation of the most-adjacent-to-electric-power-supply-terminal circuit is also stopped, the operation of the group of port circuits is also stopped. Therefore, a circuit group composed of the most-adjacent-to-electric-power-supply-terminal circuit and the group of port circuits, to which the same operation clock signal (or the same operation source such as an electric source) as that supplied to the most-adjacent-to-electric-power-supply-terminal circuit is supplied to operate the group of port circuits with the most-adjacent-to-electric-power-supply-terminal circuit, is defined as the group of most-adjacent-to-electric-power-supply-terminal circuits in the present invention.

In the seventh embodiment:, the circuits group 6, 7, 14 and 15 corresponds to the group of most-adjacent-to-electric-power-supply-terminal circuits.

Also, in another standpoint, it is possible to classify the function block 32 of the port circuit 6 into a first circuit element electrically most-adjacent to the Vcc terminal 3 through the power supply line and a plurality of second circuit elements to which the same operation clock signal (or the same operation source such as an electric source) as that supplied to the first circuit element is supplied to operate the second circuit elements with the first circuit element. In this standpoint, because the first circuit element can be considered as a most-adjacent-to-electric-power-supply-terminal circuit, the port circuit 6 can be considered as a group of most-adjacent-to-electric-power-supply-terminal circuits.

Also, a plurality of circuits, to which the same operation clock signal (or the same operation source such as an electric source) is supplied to operate the circuits with each other, is defined as a group of operation circuits. In this case, because it can be considered in a standpoint that the same operation clock signal is substantially supplied to all the port circuits 6 to 15 and the internal circuits 16 to 19 to operate the port circuits 6 to 15 and the internal circuits 16 to 19 with each other, it is possible to consider that the port circuits 6 to 15 and the internal circuits 16 to 19 is a group of operation circuits. In addition, one or more circuits respectively connected with the most-adjacent-to-electric-power-supply-terminal circuits through only a power supply line are selected from the group of operation circuits, and the circuits are defined as a group of adjacent-to-electric-power-supply-terminal circuits.

Returning to the description of the operation, because the erroneous operation resistance to external noise can be improved by stopping the group of most-adjacent-to-electric-power-supply-terminal circuits (that is, the port circuits 6, 7, 14 and 15) in case of non-use of those circuits, there is a possibility that the operation stop and the operation start of the group of most-adjacent-to-electric-power-supply-terminal circuits (that is, the port circuits 6, 7, 14 and 15) are alternately repeated under the control of the control circuit 16. In other words, in cases where a frequency of the operation clock signal input to the port circuits 6, 7, 14 and 15 is high, a possibility that the port circuit 6, 7, 14 or 15 is erroneously operated in its start operation is heightened. Also, because the operations of the function blocks 32, 33, 40 and 41 are stopped to reduce noise, a plurality of function blocks including the function block 32, 33, 40 or 41 cannot be simultaneously operated in parallel to each other. Therefore, there is a possibility that the ease of use of the integrated circuit apparatus 2 and/or the flexibility of the operation of the integrated circuit apparatus 2 are reduced.

Since circuit elements such as transistor are originally arranged in each of the left-side port circuits 6, 7, 14 and 15, the ease of use of the integrated circuit apparatus 2 and the flexibility of the operation of the integrated circuit apparatus 2 may be maintained by removing one or more circuit elements such as transistor, which are originally arranged in the function blocks 32, 33, 40 and 41, from the function blocks 32, 33, 40 and 41 and additionally arranging these components in the function blocks 34 to 49 of the other port circuits 8 to 13 to distribute functions of the circuit elements originally given to the port circuits 6, 7, 14 and 15 to the port circuits 8 to 13. Therefore, the port circuits 6, 7, 14 and 15 respectively have only a circuit element such as transistor to have a low processing capability as compared with those of the port circuits 8 to 13. In this case, a possibility that the port circuit 8 to 13 is used in place of the port circuit 6, 7, 14 and 15 is increased because functions originally set in the port circuits 6, 7, 14 and 15 are moved to the port circuits 8 to 13, and a time-interval in which the operations of the port circuits 6, 7, 14 and 15 respectively not used are stopped is increased. Therefore, the possibility that the operation stop and the operation start of each of the port circuits 6, 7, 14 and 15 are alternately repeated under the control of the control circuit 16 can be reduced, so that the ease of use of the integrated circuit apparatus 2 and the flexibility of the operation of the integrated circuit apparatus 2 can be maintained. Also, because the possibility that each of the port circuits 6, 7, 14 and 15 is erroneously operated in a high speed operation according to the operation clock signal of the high frequency is reduced, an effect that the noise reducing characteristic of the integrated circuit apparatus 2 is considerably improved can be obtained without the above defects.

Also, because each of the port circuits 6, 7, 14 and 15 is set to have a low processing capability, one circuit element such as transistor is only arranged in each of the function blocks 32, 33, 40 and 41. In this case, an area occupied by each of the port circuits 6, 7, 14 and 15 is reduced. As is described in the prior art, each of the terminal pads of each of the port circuits 6 to 15 has to be arranged so as to set the physical distance between the terminal pad and the corresponding pin to be as short as possible. In cases where an area occupied by the port circuit 6, 7, 14 or 15 is reduced, there is a possibility that the physical distance between each terminal pad of the port circuit 6, 7, 14 or 15 and the corresponding pin is lengthened. However, the noise reducing characteristic of the integrated circuit apparatus 2 can be considerably improved, the ease of use of the integrated circuit apparatus 2 and the flexibility of the operation of the integrated circuit apparatus 2 can be maintained, and the possibility that the port circuit 6, 7, 14 or 15 is erroneously operated according to the operation clock signal having a high frequency can be reduced. Therefore, the configuration of the integrated circuit apparatus according to the seventh embodiment is superior to that of the prior art.

Also, the configuration of the clock interrupting circuit 79 is not limited on condition that the operation clock signal to be sent to circuits, of which the operations are to be stopped because of non-use, is reliably interrupted. For example, it is applicable that a circuit obtained by modifying the circuit shown in FIG. 17B, FIG. 17C or FIG. 17D be used as the clock interrupting circuit 79.

Accordingly, in the seventh embodiment, the operation of a group of most-adjacent-to-electric-power-supply-terminal circuits (that is, the port circuits 6, 7, 14 and 15), which is composed of the most-adjacent-to-electric-power-supply-terminal circuit (equivalent to the port circuit 6) and all circuits (that is, the port circuits 7, 14 and 15) to which the same operation clock signal (or the same operation source such as an electric source) as that supplied to the most-adjacent-to-electric-power-supply-terminal circuit is supplied to operate the port circuits 7, 14 and 15 with the most-adjacent-to-electric-power-supply-terminal circuit, is stopped in case of non-use of the group of most-adjacent-to-electric-power-supply-terminal circuits by the operation of the clock interrupting circuit 79. Therefore, the noise reducing characteristic of the integrated circuit apparatus for noise generated in the integrated circuit apparatus or external noise input to the integrated circuit apparatus through the Vcc terminal 3 and the electric source line can be improved.

Here, because the port circuits 6 to 15 are arranged in the integrated circuit apparatus 2 so as to set the physical distance between each terminal pad of the port circuits 6 to 15 and the corresponding pin to be as short as possible, the port circuits 6 to 15 are used as the constituent elements of the LC filter arranged between the Vcc terminal 3 and the internal circuits 16 to 19. Therefore, the electric power supplied to the group of the internal circuits 16 to 19 passes through the port circuits 6 to 15 and the capacitors 21 to 30. However, the seventh embodiment is not limited to the LC filter composed of the port circuits 6 to 15. For example, in cases where the peripheral circuit 19 (or the other internal circuit) is connected with the Vcc terminal 3 through the power supply line through which the peripheral circuit 19 is electrically most-adjacent to the Vcc terminal 3, it is applicable that the peripheral circuit 19 be used as the constituent elements of the LC filter arranged between the Vcc terminal 3 and the internal circuits 16 to 19.

Also, in cases where the internal circuits 16 to 19 and the clock generator 20 are, for example, replaced with the memory 18 and a control circuit having a simplified configuration, the integrated circuit apparatus 2 of the seventh embodiment can be applied for a memory. Also, in cases where the peripheral circuit 19 is replaced with a servo control circuit or a custom logic circuit, the integrated circuit apparatus of the seventh embodiment can be applied for IC for specific use or ASIC. Also, though a microcomputer represents the integrated circuit apparatus 2, all types of semiconductor IC can represent the integrated circuit apparatus 2.

Also, in the seventh embodiment, because the group of most-adjacent-to-electric-power-supply-terminal circuits 6, 7, 14 and 15, of which the operation is to be stopped in case of non-use, has a low processing capability, a possibility that the group of most-adjacent-to-electric-power-supply-terminal circuits is used is low. Therefore, the ease of use and the operation flexibility of the integrated circuit apparatus 2 can be obtained, the possibility that the integrated circuit apparatus 2 is erroneously operated at a high speed operation can be reduced, and the noise reducing characteristic of the integrated circuit apparatus 2 can be improved.

Also, in the seventh embodiment, though the supply of the operation clock signal to a circuit is interrupted to stop the operation of the circuit, the seventh embodiment is not limited to this example. For example, it is applicable that the supply of the electric power to a circuit be interrupted to stop the operation of the circuit.

EMBODIMENT 8

In an eighth embodiment, operations of all specific groups of operation circuits (that is, the port circuits 6, 7, 8, 9, 12, 13, 14 and 15), which are connected with power supply lines extending from the group of most-adjacent-to-electric-power-supply-terminal circuits (that is, the port circuits 6, 7, 14 and 15) to a group of operation circuits (that is, the port circuits 8, 9, 12 and 13) from which noise is not output to the Vcc terminal 3 and to which external noise received from the Vcc terminal 3 is not input, are stopped by the operation stopping means in case of non-use of the specific groups of operation circuits.

Figure 22:
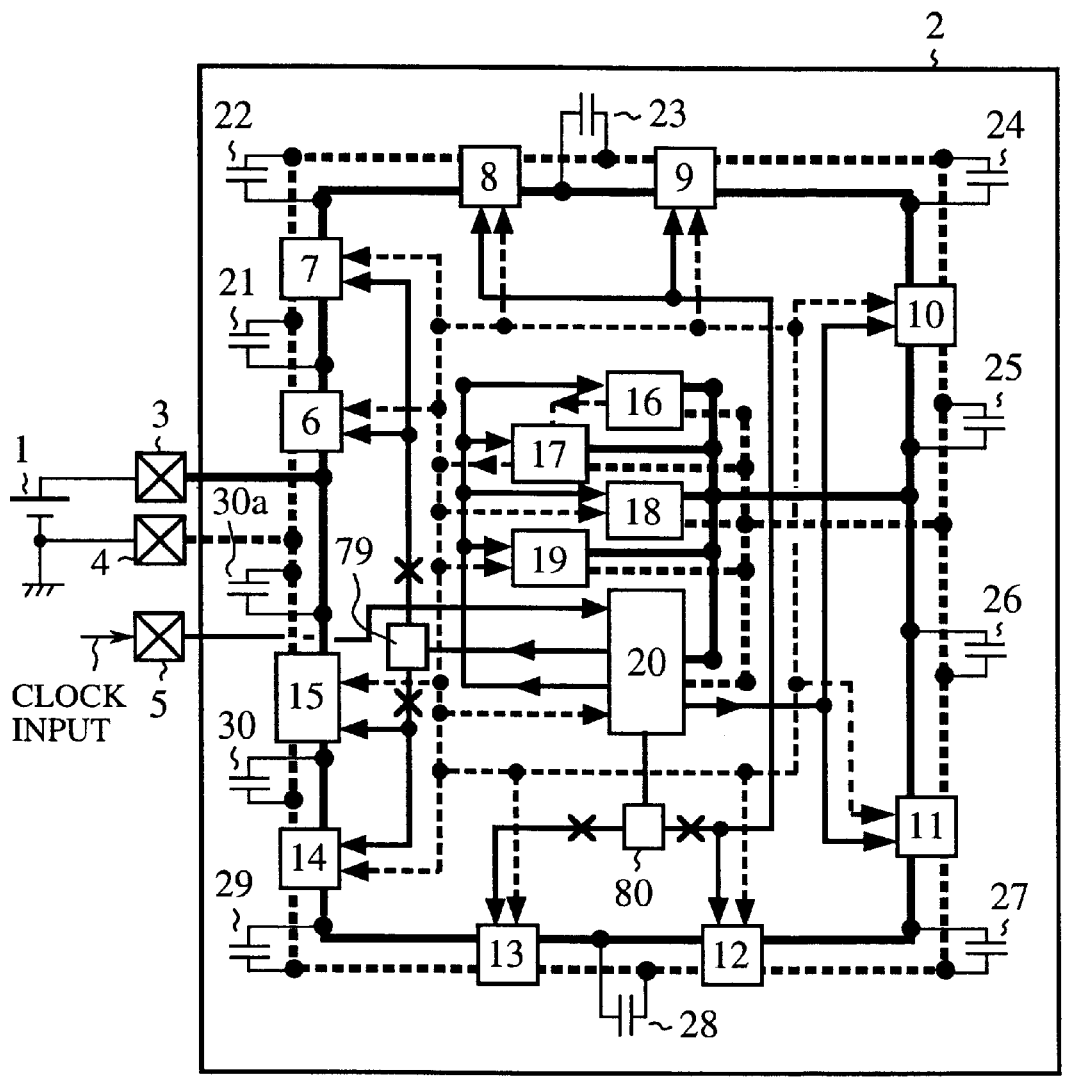
FIG. 22 is a diagram showing the configuration of an integrated circuit apparatus according to an eighth embodiment of the present invention.
Figure 23:
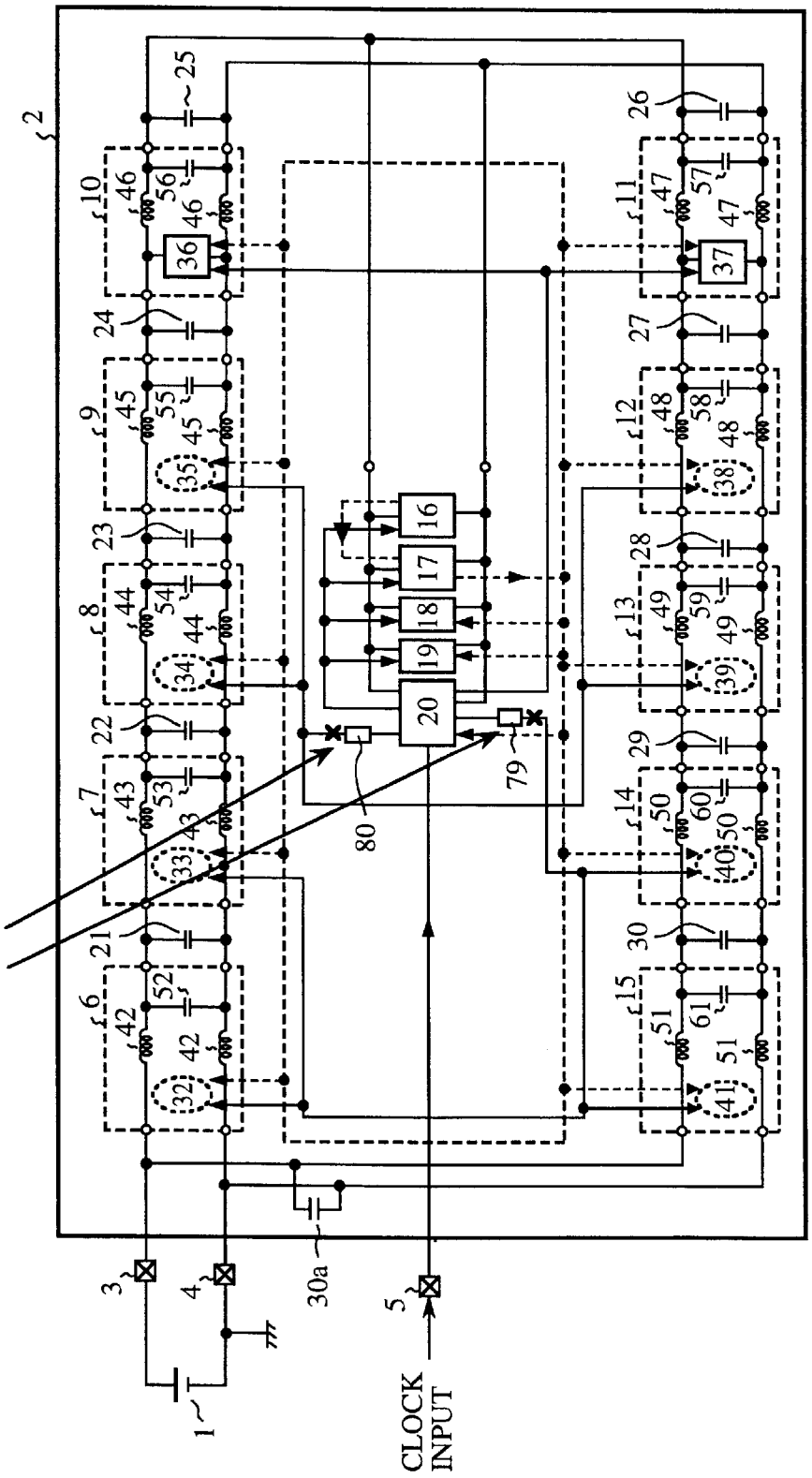
FIG. 23 shows an equivalent circuit of the integrated circuit apparatus shown in FIG. 22.

FIG. 22 is a diagram showing the configuration of an integrated circuit apparatus according to an eighth embodiment of the present invention, and FIG. 23 shows an equivalent circuit of the integrated circuit apparatus shown in FIG. 22 (in case of the operation stop of the port circuits 6, 7, 8, 9,12, 13, 14 and 15). In FIG. 22 and FIG. 23, a reference numeral 80 indicates a clock interrupting circuit (equivalent to an operation stopping means) for interrupting an operation clock signal supplied from the clock generator 20. The clock interrupting circuit 80 has the same function as that of the clock interrupting circuit 79. The operation of a group of the port circuits 6, 7, 14 and 15 (called a group of operation circuits A corresponding to a group of most-adjacent-to-electric-power-supply-terminal circuits), to which the same operation clock signal as that supplied to the port circuit 6 is supplied to operate the port circuits 7, 14 and 15 with the port circuit 6, is stopped by the function of the clock interrupting circuit 79 to stop the operations of the port circuits 6, 7, 14 and 15. The operation of a group of the port circuits 8, 9, 12 and 13 (called a group of operation circuits B), to which the same operation clock signal is supplied to operate the port circuits 8, 9, 12 and 13 with each other, is stopped by the function of the clock interrupting circuit 80. Also, a group of the port circuits 10 and 11 is called a group of operation circuits C because the same operation clock signal is supplied the port circuits 10 and 11 to operate the port circuits 10 and 11 with each other, and a group of the internal circuits 16 to 19 is called a group of operation circuits D because the same operation clock signal is supplied to the internal circuits 16 to 19 to operate the port circuits 16 to 19 with each other. The same constituent elements as those shown in FIG. 20 or FIG. 21 are indicated by the same reference numerals as those indicating the constituent elements in FIG. 20 or FIG. 21, and the description of the same constituent elements as those shown in FIG. 20 or FIG. 21 is omitted.

Next, an operation of the integrated circuit apparatus according to the eighth embodiment is described.

Because operations of circuits connected with power supply lines are appropriately stopped to reduce noise, the operation stopping of the port circuits 6, 7, 8, 9, 12, 13, 14 and 15 is mainly described.

In cases where the control circuit 16 does not require the use of each of the groups of operation circuits A and B, a signal indicating non-use of the port circuit 6 is sent from the control circuit 16 to the clock interrupting circuits 79 and 80. The clock interrupting circuit 79 judges according to the signal that the control circuit 16 does not require the use of the group of operation circuits A, the operation clock signal to be supplied to the group of operation circuits A is interrupted by the clock interrupting circuit 79. Also, the clock interrupting circuit 80 judges according to the signal that the control circuit 16 does not require the use of the group of operation circuits B, the operation clock signal to be supplied to the group of operation circuits B is interrupted by the clock interrupting circuit 80. Therefore, as shown in FIG. 23, the function blocks 32, 33, 34, 35, 38, 39, 40 and 41 of the groups of operation circuits A and B are respectively set to an operation stop state, so that no noise is generated in the port circuits 6, 7, 8, 9, 12, 13, 14 and 15. Also, even though external noise is input to any of the port circuits 6, 7, 8, 9, 12, 13, 14 and 15 through the Vcc terminal 3, because each of the function blocks 32, 33, 34, 35, 38, 39, 40 and 41 is not operated, there is no possibility that the port circuit 6, 7, 8, 9, 12, 13, 14 or 15 is erroneously operated.

Therefore, in cases where capacitances of the capacitors 24 and 27 are respectively sufficiently large, the group of operation circuits C can sufficiently receives the LC filter effect based on the 4 capacitors 24 and 27. Therefore, noise generated in the group of operation circuits C is attenuated because of the LC filter effect before the noise reaches the Vcc terminal 3, and external noise input through the Vcc terminal 3 is attenuated because of the LC filter effect before the external noise reaches the group of operation circuits C. Also, in cases where each of the capacitors 22 to 29 has a capacitance sufficient to reduce noise generated in the integrated circuit apparatus 2 and external noise input through the Vcc terminal 3, the same effect as the LC filter effect can be obtained by the combination of the capacitances of the capacitors 22 to 29 and the group of equivalent inductances and equivalent capacitances parasitically existing in the port circuits 8 to 13 and the internal circuits 16 to 19. Therefore, noise generated in any of the port circuits 8 to 13 and the internal circuits 16 to 19 is attenuated before the noise reaches the Vcc terminal 3, and external noise input through the Vcc terminal 3 is attenuated before the external noise reaches any of the port circuits 8 to 13 and the internal circuits 16 to 19. Accordingly, the noise reducing characteristic of the integrated circuit apparatus shown in FIG. 22 can be considerably improved by adding the clock interrupting circuits 79 and 80.

An important point in the integrated circuit apparatus 2 according to the eighth embodiment is that operations of all specific groups of operation circuits (that is, the groups of operation circuits A and B), which are connected with power supply lines extending from a group of most-adjacent-to-electric-power-supply-terminal circuits (that is, the group of operation circuits A) to a group of operation circuits (that is, the groups of operation circuits B) from which noise is not output to the Vcc terminal 3 and to which external noise received from the Vcc terminal 3 is not input, are stopped by the operation of the operation stopping means (that is, the clock interrupting circuits 79 and 80) in case of non-use of the specific groups of operation circuits. Therefore, an erroneous operation resistance to external noise, which is input from the outside through the Vcc terminal 3 and cannot be reduced in the prior art according to the noise avoiding method in which operations of all circuits respectively not used in the control circuit 16 are stopped, can be improved.

However, there is a possibility that the operation stop and the operation start of the groups of operation circuits A and B are alternately repeated under the control of the control circuit 16. In other words, in cases where a frequency of the operation clock signal input to the groups of operation circuits A and B is high, a possibility that a circuit of the groups of operation circuits A and B is erroneously operated in its start operation is heightened. Also, because the operations of the function blocks 32, 33, 34, 35, 38, 39, 40 and 41 are stopped to reduce noise, a plurality of function blocks including the function block 32, 33, 34, 35, 38, 39, 40 or 41 cannot be simultaneously operated in parallel to each other. Therefore, there is a possibility that the ease of use of the integrated circuit apparatus 2 and/or the flexibility of the operation of the integrated circuit apparatus 2 are reduced.

To maintain the ease of use of the integrated circuit apparatus 2 and the flexibility of the operation of the integrated circuit apparatus 2, because circuit elements such as transistor are originally arranged in each of the function block 32, 33, 34, 35, 38, 39, 40 or 41 of the groups of operation circuits A and B, one or more circuit elements such as transistor, which are originally arranged in the function blocks 32, 33, 34, 35, 38, 39, 40 or 41, are removed from the function blocks 32, 33, 34, 35, 38, 39, 40 or 41 and are additionally arranged in the function blocks 36 and 37 of the other port circuits 10 and 11 to distribute functions of the circuit elements originally given to the groups of operation circuits A and B to the port circuits 10 and 11. Therefore, the circuits of the groups of operation circuits A and B respectively have only a circuit element such as transistor to have a low processing capability as compared with those of the port circuits 10 and 11. In this case, a possibility that the port circuit 10 and 11 are used in place of the groups of operation circuits A and B is increased because functions originally set in the groups of operation circuits A and B are moved to the port circuits 10 and 11, and a possibility that the operations of the groups of operation circuits A and B respectively not used are stopped is increased. Therefore, the possibility that the operation stop and the operation start of the groups of operation circuits A and B are alternately repeated under the control of the control circuit 16 can be reduced, so that the ease of use of the integrated circuit apparatus 2 and the flexibility of the operation of the integrated circuit apparatus 2 can be maintained. Also, because the possibility that each of the groups of operation circuits A and B is erroneously operated in a high speed operation according to the operation clock signal of the high frequency is reduced, an effect that the noise reducing characteristic of the integrated circuit apparatus 2 is considerably improved can be obtained without the above defects.

Also, because each of the port circuits of the groups of operation circuits A and B is set to have a low processing capability, one circuit element such as transistor is only arranged in each of the function blocks 32, 33, 34, 35, 38, 39, 40 or 41. In this case, an area occupied by each of the port circuits of the groups of operation circuits A and B is reduced. As is described in the prior art, each of the terminal pads of each of the port circuits 6 to 15 has to be arranged so as to set the physical distance between the terminal pad and the corresponding pin to be as short as possible. In cases where an area occupied by the port circuits of the groups of operation circuits A and B is small, there is a possibility that the physical distance between each terminal pad of one port circuit of the groups of operation circuits A and B and the corresponding pin is lengthened. However, the noise reducing characteristic of the integrated circuit apparatus 2 can be considerably improved, the ease of use of the integrated circuit apparatus 2 and the flexibility of the operation of the integrated circuit apparatus 2 can be maintained, and the possibility that one port circuit of the groups of operation circuits A and B is erroneously operated according to the operation clock signal having a high frequency can be reduced. Therefore, the configuration of the integrated circuit apparatus according to the eighth embodiment is superior to that of the prior art.

Also, though the LC filter effect for the group of operation circuits C is sufficient by making the capacitances of the capacitors 24 and 27 sufficient, in cases where the capacitor 24 or 27 having a sufficient capacitance cannot be arranged in a periphery of the group of operation circuits C, it is applicable that the operation of the group of operation circuits C be stopped in case of non-use.

Accordingly, in the eighth embodiment, operations of all specific groups of operation circuits (that is, the groups of operation circuits A and B), which are connected with power supply lines extending from a group of most-adjacent-to-electric-power-supply-terminal circuits (that is, the group of operation circuits A) including the most-adjacent-to-electric-power-supply-terminal circuit (that is, the port circuit 6) to a group of operation circuits (that is, the groups of operation circuits B) from which noise is not output to the Vcc terminal 3 and to which external noise received from the Vcc terminal 3 is not input, are stopped by the operation of the operation stopping means (that is, the clock interrupting circuits 79 and 80) in case of non-use of the specific groups of operation circuits. Therefore, the noise reducing characteristic of the integrated circuit apparatus 2 for noise generated in the integrated circuit apparatus 2 or external noise input to the integrated circuit apparatus 2 through the Vcc terminal 3 and the electric source line can be improved.

Here, because the port circuits 6 to 15 are arranged in the integrated circuit apparatus 2 so as to set the physical distance between each terminal pad of the port circuits 6 to 15 and the corresponding pin to be as short as possible, the port circuits 6 to 15 are used as the constituent elements of the LC filter arranged between the Vcc terminal 3 and the internal circuits 16 to 19. Therefore, the electric power supplied to the group of the internal circuits 16 to 19 passes through the port circuits 6 to 15 and the capacitors 21 to 30. However, the eighth embodiment is not limited to the LC filter composed of the port circuits 6 to 15. For example, in cases where the peripheral circuit 19 (or the other internal circuit) is connected with the Vcc terminal 3 through the power supply line through which the peripheral circuit 19 is electrically most-adjacent to the Vcc terminal 3, it is applicable that the peripheral circuit 19 be used as the constituent elements of the LC filter arranged between the Vcc terminal 3 and the internal circuits 16 to 19.

Also, in cases where the internal circuits 16 to 19 and the clock generator 20 are, for example, replaced with the memory 18 and a control circuit having a simplified configuration, the integrated circuit apparatus 2 of the eighth embodiment can be applied for a memory. Also, in cases where the peripheral circuit 19 is replaced with a servo control circuit or a custom logic circuit, the integrated circuit apparatus of the eighth embodiment can be applied for IC for specific use or ASIC. Also, though a microcomputer represents the integrated circuit apparatus 2, all types of semiconductor IC can represent the integrated circuit apparatus 2.

Also, in the eighth embodiment, though the supply of the operation clock signal to a circuit is interrupted to stop the operation of the circuit, the eighth embodiment is not limited to this example. For example, it is applicable that the supply of the electric power to a circuit be interrupted to stop the operation of the circuit.

Also, in the eighth embodiment, each group of operation circuits is composed of a plurality of port circuits. However, from another standpoint, it is applicable that each group of operation circuits is composed of a plurality of circuit elements of one function block of one port circuit to make the group of operation circuits correspond to one port circuit.

What is claimed is:

1. An integrated circuit apparatus in which an electric power supply terminal electrically connected with an external electric power source is arranged to supply an electric power to circuits of the semiconductor circuit apparatus, comprising:

a most-adjacent-to-electric-power-supply-terminal circuit connected with the electric power supply terminal through a power supply line through which the most-adjacent-to-electric-power-supply-terminal circuit is electrically most-adjacent to the electric power supply terminal among the circuits respectively connected with the electric power supply terminal through a power supply line; and operation stopping means for stopping an operation of the most-adjacent-to-electric-power-supply-terminal circuit in cases where the most-adjacent-to-electric-power-supply-terminal circuit is not in use.

2. An integrated circuit apparatus according to claim 1, further comprising:

a group of most-adjacent-to-electric-power-supply-terminal circuits composed of the most-adjacent-to-electric-power-supply-terminal circuit and one or more first circuits to which an operation signal or an operation source supplied to the most-adjacent-to-electric-power-supply-terminal circuit is supplied to operate the first circuits with the most-adjacent-to-electric-power-supply-terminal circuit, wherein an operation of the group of most-adjacent-to-electric-power-supply-terminal circuits or the operation of the most-adjacent-to-electric-power-supply-terminal circuit is stopped by the operation stopping means in cases where the most-adjacent-to-electric-power-supply-terminal circuit is not in use.

3. An integrated circuit apparatus according to claim 2, further comprising:

a group of operation circuits, to which an operation signal or an operation source is supplied to operate the group of operation circuits with each other, connected with the most-adjacent-to-electric-power-supply-terminal circuit or the group of most-adjacent-to-electric-power-supply-terminal circuits, wherein an operation of a second circuit connected with the most-adjacent-to-electric-power-supply-terminal circuit or the group of most-adjacent-to-electric-power-supply-terminal circuits or an operation of the group of operation circuits is stopped by the operation stopping means in cases where each of the most-adjacent-to-electric-powersupply-terminal circuit and the second circuit or the group of operation circuits is not in use.

4. An integrated circuit apparatus according to claim 2, further comprising:

one or more second circuits, which are arranged along or are connected with a power supply line extending from the most-adjacent-to-electric-power-supply-terminal circuit to a third circuit from which noise is not output to the electric power supply terminal and to which external noise received from the electric power supply terminal is not input; and one or more first groups of operation circuits, which each group receive an operation signal or an operation source to operate circuits of the group with each other and which are arranged along or are connected with a power supply line extending from the group of most-adjacent-to-electric-power-supply-terminal circuits to a second group of operation circuits from which noise is not output to the electric power supply terminal and to which external noise received from the electric power supply terminal is not input, wherein an operation of the second circuits or an operation of the first groups of operation circuits is stopped by the operation stopping means in case of non-use of the second circuits or in case of non-use of the first groups of operation circuits.

5. An integrated circuit apparatus according to claim 2, further comprising:

a second circuit, which is not used to stop the operation of the most-adjacent-to-electric-power-supply-terminal circuit or the operation of the group of most-adjacent-to-electric-power-supply-terminal circuits, wherein an operation of the second circuit is stopped by the operation stopping means in case of non-use of the second circuit.

6. An integrated circuit apparatus according to claim 1, wherein the operation stopping means interrupts the supply of an operation clock signal to the most-adjacent-to-electric-power-supply-terminal circuit to stop the operation of the most-adjacent-to-electric-power-supply-terminal circuit.

7. An integrated circuit apparatus according to claim 1, further comprising:

a decoder for setting a first selection signal, which corresponds to a first circuit to be used, to an active state, in cases where an address corresponding to the first circuit is received, and setting a second selection signal, which corresponds to a second circuit not to be used, to an inactive state, wherein an operation of the second circuit is stopped by the operation stopping means according to the second selection signal set to the inactive state.

8. An integrated circuit apparatus according to claim 1, wherein the most-adjacent-to-electric-power-supply-terminal circuit, of which the operation is stopped by the operation stopping means in case of non-use, has a function of which a use frequency is low.

9. An integrated circuit apparatus according to claim 1, further comprising:

a capacitor, which is arranged between the most-adjacent-to-electric-power-supply-terminal circuit and another circuit, wherein an inductance and a capacitance parasitically exist in the power supply line.

* * * * *